(12) United States Patent
Collier et al.

(10) Patent No.: US 9,773,727 B2
(45) Date of Patent: Sep. 26, 2017

(54) MULTI-LAYER FULL DENSE MESH

(71) Applicant: Oracle International Corporation, Redwood Shores, CA (US)

(72) Inventors: Duncan C. Collier, Stockton, CA (US); Robert P. Masleid, Monte Sereno, CA (US); Aparna Ramachandran, Cupertino, CA (US); King Yen, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/181,795

(22) Filed: Jun. 14, 2016

(65) Prior Publication Data

US 2017/0092579 A1 Mar. 30, 2017

Related U.S. Application Data

(60) Provisional application No. 62/235,134, filed on Sep. 30, 2015.

(51) Int. Cl.
*H01L 23/522* (2006.01)
*H01L 23/498* (2006.01)
*H01L 21/48* (2006.01)
*H01L 49/02* (2006.01)

(52) U.S. Cl.
CPC ........ *H01L 23/5223* (2013.01); *H01L 21/486* (2013.01); *H01L 21/4846* (2013.01); *H01L 21/4853* (2013.01); *H01L 21/4889* (2013.01); *H01L 23/498* (2013.01); *H01L 23/49816* (2013.01); *H01L 23/5226* (2013.01); *H01L 28/40* (2013.01)

(58) Field of Classification Search
CPC .................................................. H01L 23/5226
See application file for complete search history.

(56) References Cited

U.S. PATENT DOCUMENTS

| 7,847,408 | B2 | 12/2010 | Masleid et al. | |
| 8,269,333 | B2* | 9/2012 | Ramachandran ... | H01L 23/5286 257/690 |
| 8,368,226 | B2* | 2/2013 | Ramachandran ... | H01L 23/5286 257/750 |

* cited by examiner

*Primary Examiner* — Yu-Hsi D Sun
(74) *Attorney, Agent, or Firm* — Osha Liang LLP

(57) ABSTRACT

A multi-layer full dense mesh (MFDM) device. The MFDM may include a metal-top layer including a bump pad array that may include a power1 (PWR1) bump pad within a PWR1 bump region, a VSS bump pad within a VSS bump region, and a power2 (PWR2) bump pad within a PWR2 bump region. The metal-top layer may also include a PWR1 majority metal-top region. The MFDM may also include a metal-top-1 layer beneath the metal-top layer and including a VSS majority metal-top-1 region, a PWR1 metal-top-1 region, and a PWR2 metal-top-1 region. The MFDM may also include a metal-top-2 layer beneath the metal-top-1 layer and including a PWR2 majority metal-top-2 region, a VSS metal-top-2 region, and a PWR1 metal-top-2 region. The MFDM may also include top-1 VIAs disposed between the metal-top layer and the metal-top-1 layer, and top-2 VIAs disposed between the metal-top-1 layer and the metal-top-2 layer.

20 Claims, 35 Drawing Sheets

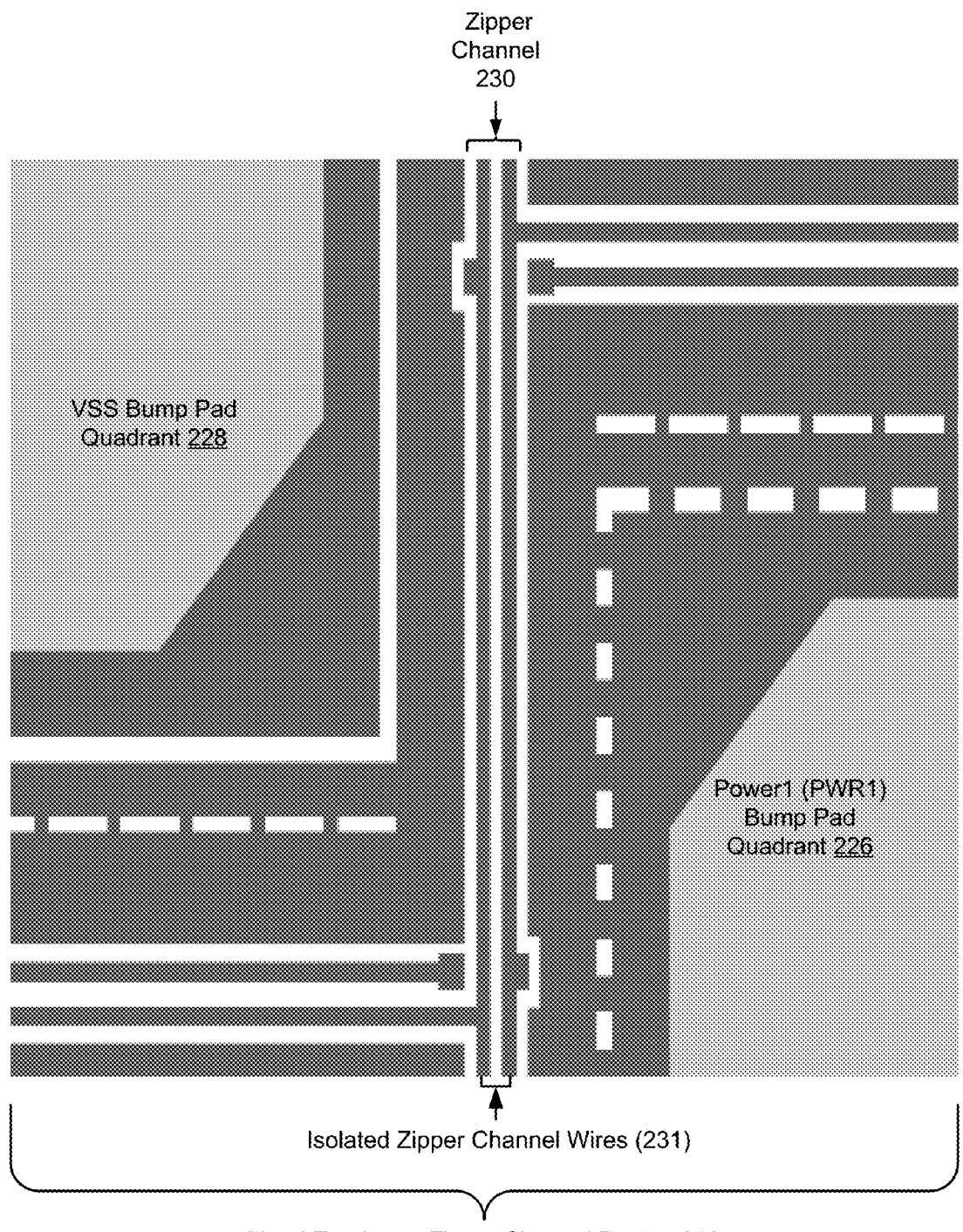
FIG. 2C    Metal-Top Layer Zipper Channel Region 210

Metal-Top Layer Power1 (PWR1) Bump Region 300

Metal-Top Layer Power1 (PWR1) Bump Region Quadrant 322

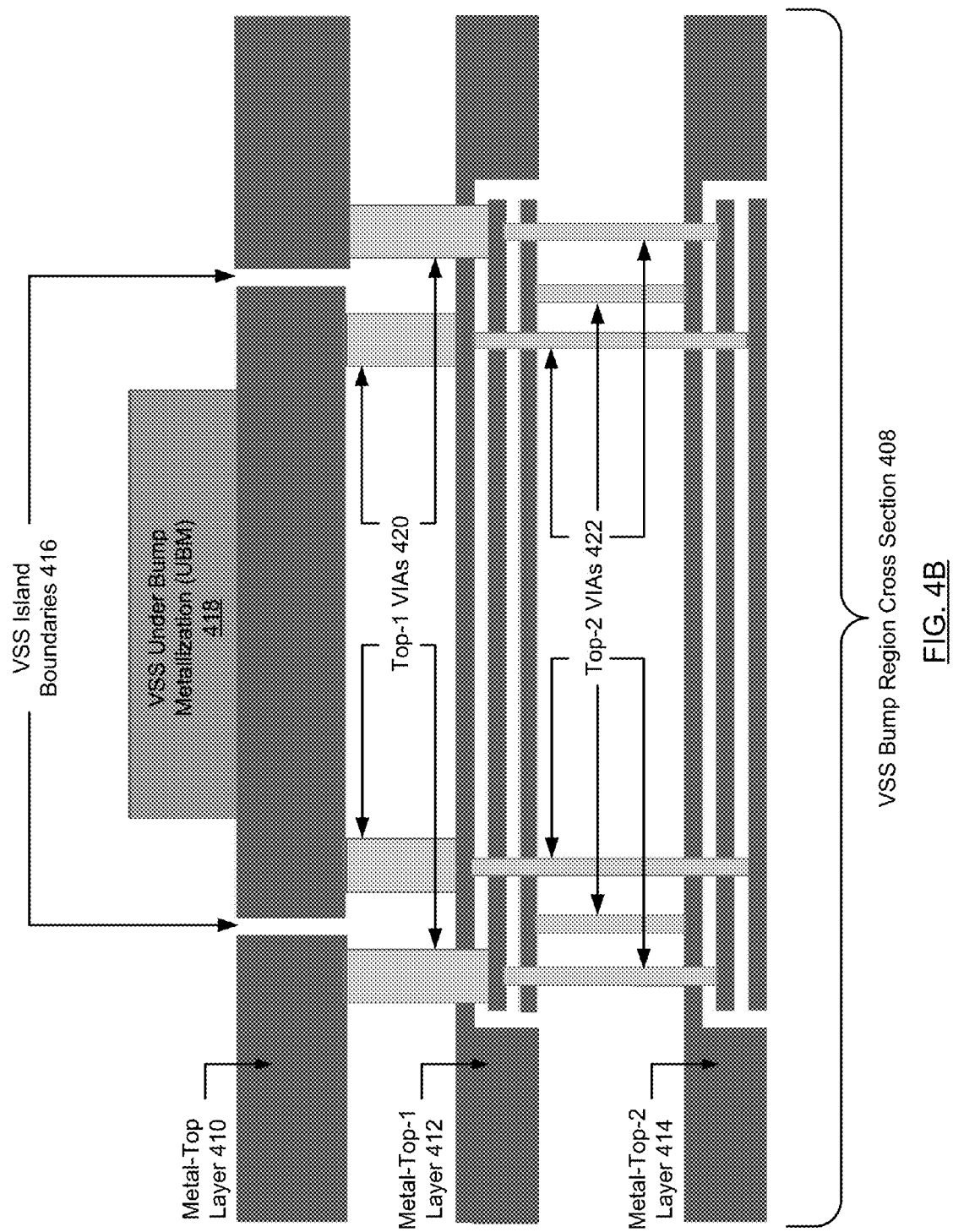

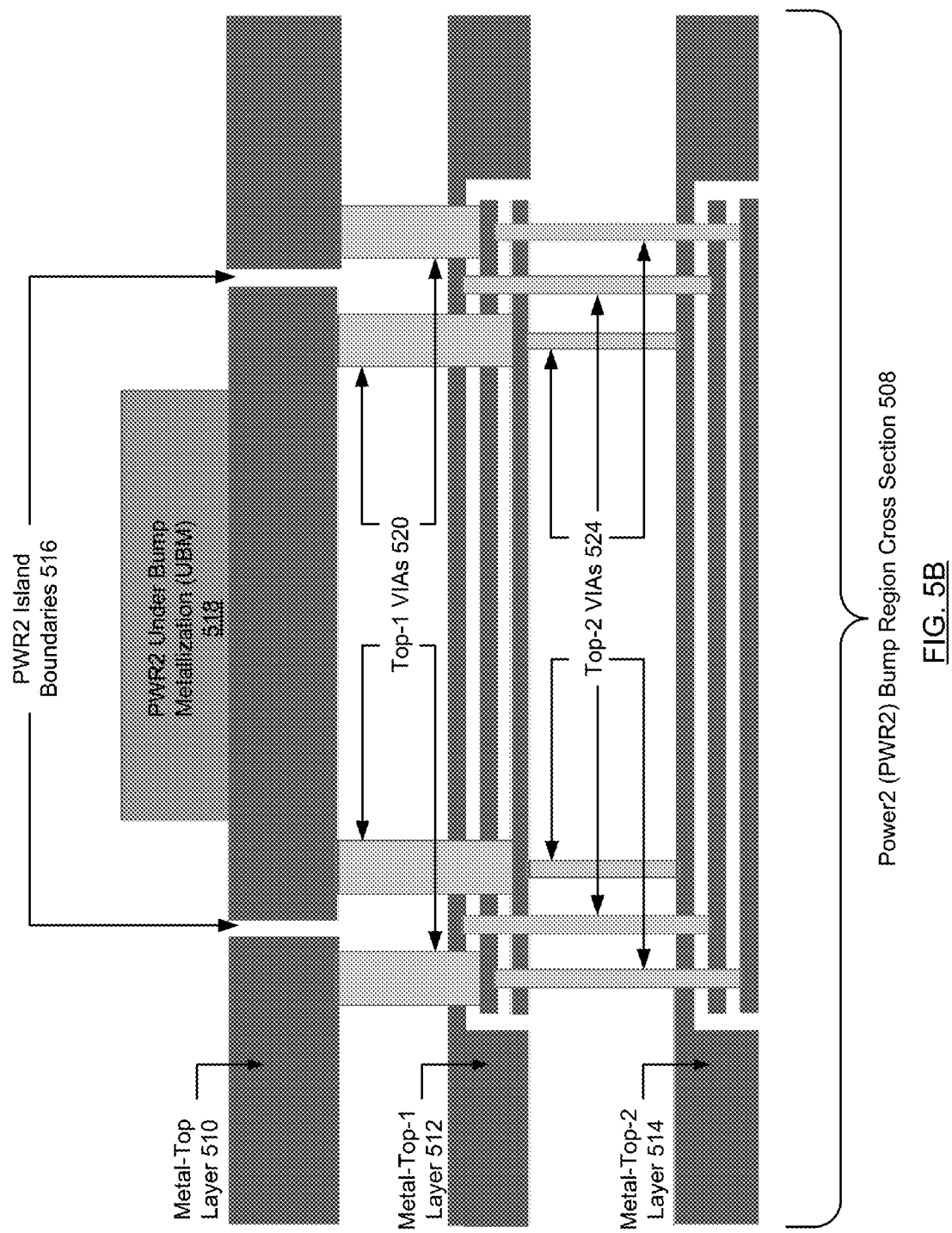

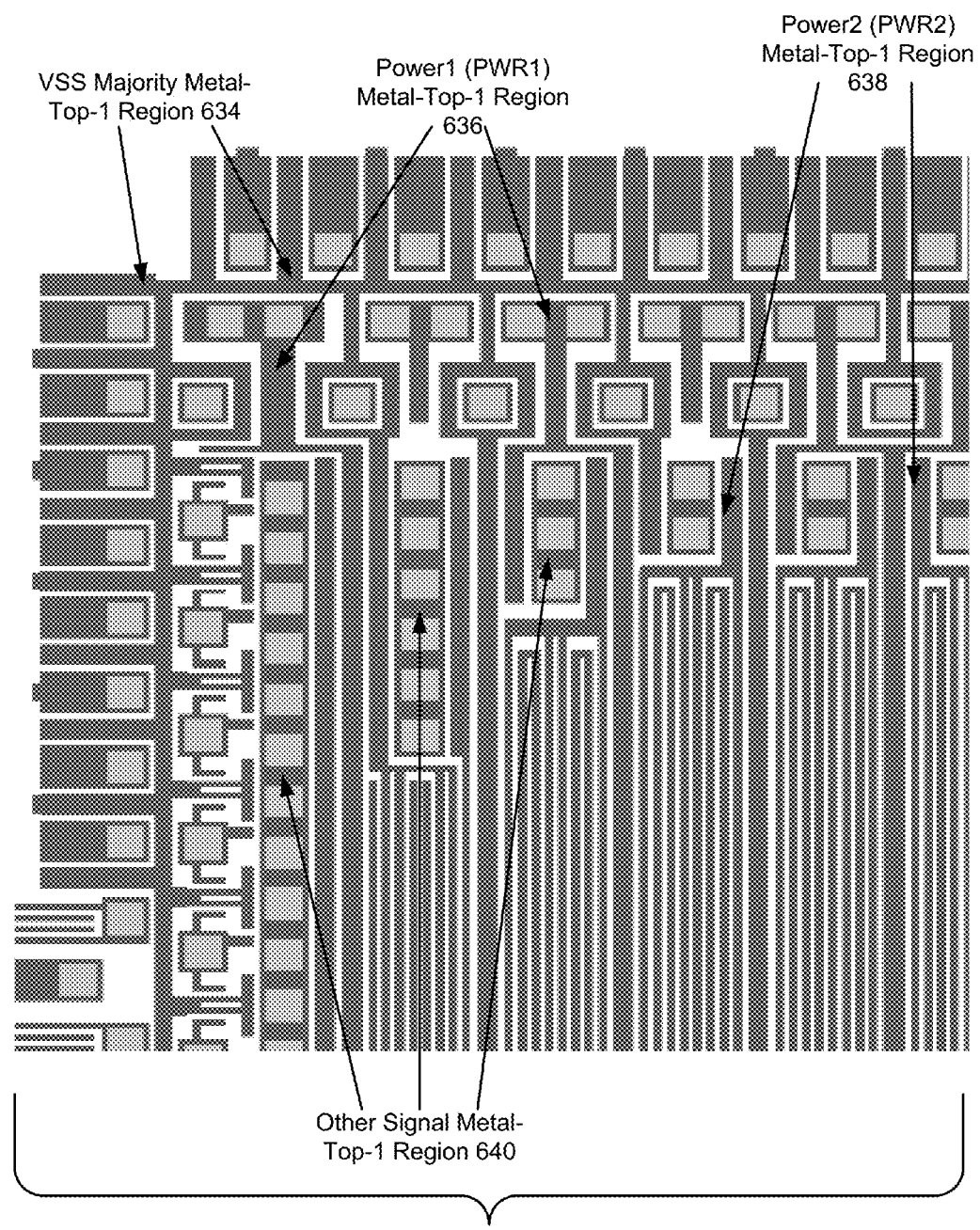
FIG. 6D  Metal-Top-1 Layer Other Signal Bump Region Quadrant 632

Bump Region MIMCap Placement Cross Section 706

Metal Top-2 Layer Bump Region Quadrant MIMCap Placement 738

MULTI-LAYER FULL DENSE MESH

CROSS-REFERENCE TO RELATED APPLICATIONS

This application claims benefit under 35 U.S.C. §119(e) to U.S. Provisional Patent Application Ser. No. 62/235,134, filed on Sep. 30, 2015 and entitled, "THREE SUPPLY RAIL FULL DENSE MESH." U.S. Provisional Patent Application Ser. No. 62/235,134 is incorporated herein by reference in its entirety.

BACKGROUND

The quality of the distribution of power within a semiconductor device impacts the performance of the semiconductor device in terms of frequency and power. Additionally, semiconductor devices often require distribution of signals other than power signals and/or more than one distinct power signal. Accordingly, it may be desirable to create a semiconductor device with more consistent power distribution and lower propagation delay as well as faster decoupling response times.

SUMMARY

In general, in one aspect, the invention relates to a multi-layer full dense mesh (MFDM). In one or more embodiments of the invention, the MFDM includes a metal-top layer that includes a bump pad array. The bump pad array may include a power1 (PWR1) bump pad within a PWR1 bump region, a VSS bump pad within a VSS bump region, and a power2 (PWR2) bump pad within a PWR2 bump region. The metal-top layer may also include a PWR1 majority metal-top region. The MFDM may also include a metal-top-1 layer beneath the metal-top layer and including a VSS majority metal-top-1 region, a PWR1 metal-top-1 region, and a PWR2 metal-top-1 region. The MFDM may also include a metal-top-2 layer beneath the metal-top-1 layer and including a PWR2 majority metal-top-2 region, a VSS metal-top-2 region, and a PWR1 metal-top-2 region. The MFDM may also include top-1 vertical interlayer connections (VIAs) disposed between the metal-top layer and the metal-top-1 layer, and top-2 VIAs disposed between the metal-top-1 layer and the metal-top-2 layer.

In general, in one aspect, the invention relates to a method of manufacturing a multi-layer full dense mesh (MFDM). In one or more embodiments of the invention, the method includes depositing, during fabrication of a semiconductor device, a metal-top-2 layer of the MFDM; forming, from the metal-top-2 layer, a power2 (PWR2) majority metal-top-2 region, a power1 (PWR1) metal-top-2 region, and a VSS metal-top-2 region; depositing on the metal-top-2 layer, after depositing the metal-top-2 layer, a first dielectric material layer for separating the metal-top-2 layer from a metal-top-1 layer; forming, within the first dielectric material layer, a plurality of top-2 vertical interlayer connections (VIAs); depositing on the first dielectric material layer, after forming the plurality of top-2 VIAs, the metal-top-1 layer; forming, from the metal-top-1 layer, a VSS majority metal-top-1 region, a PWR1 metal-top-2 region, and a PWR2 metal-top-2 region; depositing on the metal-top-1 layer, after depositing the metal-top-1 layer, a second dielectric material layer for separating the metal-top-1 layer from a metal-top layer; forming, within the second dielectric material layer, a plurality of top-1 VIAs; depositing on the second dielectric material later, after forming the plurality of top-1 VIAs, the metal-top layer; and forming, from the metal-top layer, a bump pad array.

Other aspects of the invention will be apparent from the following description and the appended claims.

BRIEF DESCRIPTION OF DRAWINGS

FIG. 2C shows a top view of a metal-top layer zipper channel region in accordance with one or more embodiments of the invention.

FIG. 4B shows a cross sectional view of a VSS bump region in accordance with one or more embodiments of the invention.

FIG. 5B shows a cross sectional view of a Power2 bump region in accordance with one or more embodiments of the invention.

FIG. 6D shows a top view of an other signal bump region quadrant in a metal-top-1 layer in accordance with one or more embodiments of the invention.

DETAILED DESCRIPTION

Figure 1:
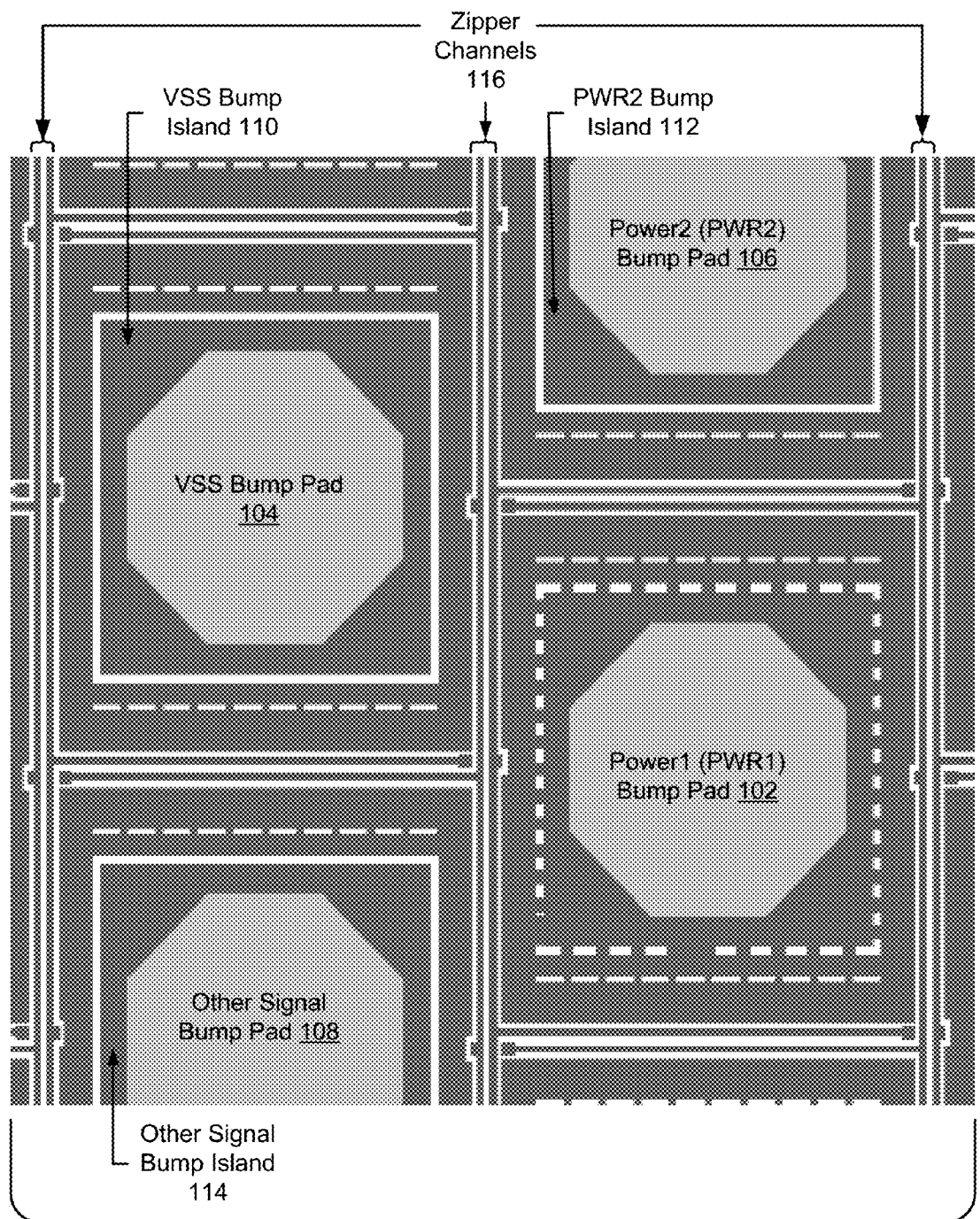
FIG. 1 shows a bump pad array in accordance with one or more embodiments of the invention.

Specific embodiments of the invention will now be described in detail with reference to the accompanying figures. Like elements in the various figures may be denoted by like names and/or like reference numerals for consistency.

In the following Detailed Description of embodiments of the invention, numerous specific details are set forth in order to provide a more thorough understanding of the invention. However, it will be apparent to one of ordinary skill in the art that the invention may be practiced without these specific details. In other instances, well-known features, which may be shown in a figure, have not been described in detail to avoid unnecessarily complicating the description and/or are described in only a subset of figures in which the features are shown.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Additionally, directional terms such as "horizontal", "vertical" "top", "bottom", "left", and "right" may be used as an adjective for an element. The use of directional words, unless explicitly noted, is not meant to imply that the elements are necessarily arranged in such a manner. For example, the use of "horizontal" and "vertical" may refer to the arrangement of elements in one embodiment shown in a given figure, but is not intended to imply that the elements are necessarily oriented horizontally or vertically relative to any reference direction, or that a horizontal element is necessarily orthogonal to a horizontal element. Rather, the use of such directional words is to distinguish between elements and/or to clarify aspects of the embodiment of the invention shown in a given figure relative to other aspects of that embodiment of the invention.

In general, embodiments of the invention relate to a multi-layer full dense mesh (MFDM) for distribution of power and other signals in a semiconductor device. As used herein, a MFDM is a full dense mesh with at least three metal layers. For the purposes of illustration, the MFDM described herein will be a three layer full dense mesh (3FDM). However one of ordinary skill in the art and having the benefit of this Detailed Description will understand that the MFDM may include any number of additional metal layers. For example, the MFDM may be a four layer full dense mesh, or a five layer full dense mesh.

In one or more embodiments of the invention, the 3FDM may be referred to as a signal distribution structure. The 3FDM may incorporate any number of bump regions, bump pads, under bump metallization regions, zipper channels, isolated zipper channel wires, rails, VIAs (i.e., vertical interlayer connections), and/or decoupling capacitors. In one or more embodiments of the invention, the 3FDM is implemented, at least in part, using three metal layers of a semiconductor device. For example, the three top metal layers of a semiconductor device may be used to implement the 3FDM.

In one or more embodiments of the invention, the 3FDM allows for distribution of two or more power signals (e.g., power provided to the semiconductor device at differing voltages) and a VSS (e.g., ground) signal throughout at least a portion of the semiconductor device. In one or more embodiments of the invention, various portions of the 3FDM (e.g., other signal bump, isolated zipper channel wires) include functionality to distribute signals other than power signals (e.g., clock signals). In one or more embodiments of the invention, the two or more power signals, VSS, and other signals are supplied to the 3FDM, at least in part, by various 'bumps', arranged in a bump pad array and designated for each type of power or other signal. In one or more embodiments of the invention, each of the three metal layers in which the 3FDM is implemented is a majority plane for one of the power signals or the VSS signal. In one or more embodiments of the invention, metal-insulator-metal capacitors (MIMCaps) are implemented between two of the metal layers as decoupling capacitors.

In one or more embodiments of the invention, the 3FDM described herein offers reduced power propagation delay (e.g., ten picoseconds per millimeter) and lowered decoupling capacitor response time (e.g., two picoseconds). The 3FDM may also improve circuit noise isolation and/or a more stiff power supply by providing a path to decoupling that is faster than the input/output edge rate. In one or more embodiments of the invention, the 3FDM may also offer reduced bump pitch based on the below-described arrangement of tiles (i.e., bump regions) in a bump pad array.

FIG. 1 shows a bump pad array (100) implemented in a metal-top layer of a semiconductor device. As shown in FIG. 1, the bump pad array (100) includes a Power1 (PWR1) bump pad (102), a VSS bump pad (104), a Power2 (PWR2) bump pad (106), an other signal bump pad (108), a VSS bump island (110), a PWR2 bump island (112), an other signal bump island (114), and zipper channels (116). Each of these components is described below.

Though not labeled in FIG. 1, the top view of FIG. 1 shows a portion of a metal-top layer of a semiconductor device. As used herein, metal layer refers to a layer of conductive material disposed on or within a semiconductor device. In one or more embodiments of the invention, a metal layer in a semiconductor device is a structural element existing in a generally two-dimensional plane of the semiconductor device (i.e., a metal layer need not exhibit perfect planarity). The metal layer may extend in the two dimensions of the plane and may have a thickness (i.e., height) perpendicular to the plane that is substantially less than either the width or length of the metal layer. In one or more embodiments of the invention, the semiconductor device has at least three metal layers, and may have any number of additional metal layers without departing from the scope of the invention. As used herein, the term 'metal-top layer' is intended to refer to any metal layer of a semiconductor device that is closer to the surface of the semiconductor device than at least two other metal layers.

While FIG. 1 shows a portion of a metal-top layer, various figures described below show portions of other metal layers that are located beneath the metal-top layer in the semiconductor device. As used herein, the term 'beneath' should not be construed to mean any particular direction. Instead, a component described as 'beneath' another is located farther from the surface of the semiconductor device. The position of the metal-top layer as closer to the surface than other metal layers described herein may allow various features implemented within the metal top layer (e.g., bump pads) to be configured to receive various electrical signals from sources external to the semiconductor device and/or from other portions of the semiconductor device. Additionally, as used herein, the term 'above' should not be construed to mean any particular direction. Instead, a component described as being 'above' another component is located closer to the surface of the semiconductor device.

Additionally, the following description uses the terms 'metal-top layer', 'metal-top-1 layer', and 'metal-top-2 layer' to refer to various metal layers of a semiconductor device. These terms are intended to convey that the metal-top-1 layer is beneath the metal-top layer and the metal-top-2 layer is beneath both the metal-top layer and the metal-top-1 layer, and are not intended to convey any other specific arrangement of the metal layers relative to one another.

In one or more embodiments of the invention, the various metal layers of the semiconductor device are fabricated from any conductive material. For example, a metal layer may be formed from a metal, such as aluminum or copper.

Also, throughout this Detailed Description, the term 'electrically isolated' may be used. The use of the term 'electrically isolated', unless explicitly noted otherwise, is meant to convey that a given element, portion, region, etc., of a metal layer of a semiconductor device is substantially electrically isolated from other portions of that same metal layer. The use of the term 'electrically isolated', unless explicitly noted, is not meant to require perfect electrical isolation, or isolation from all portions of other metal layers of the semiconductor device. For example, a metal-top-1 layer may include a feature formed in the metal-top-1 layer that is electrically isolated from other portions of the metal-top-1 layer, but that has an electrical connection (e.g., using a VIA) to a region of a metal-top layer of a semiconductor device.

In one or more embodiments of the invention, a bump pad array (100) is an array of bump pads within bump regions of a metal-top layer of a semiconductor device. As shown in FIG. 1, the bump pad array (100) may include bump regions with bump pads arranged such that the center of any three bump pads forms a triangle. In one or more embodiments of the invention, the arrangement of bump pads in the bump pad array may reduce the bump pitch of the 3FDM. In one or more embodiments of the invention, bump pitch is the distance between the centers of any two adjacent bump pads.

In one or more embodiments of the invention, the power1 (PWR1) bump pad (102) is a bump pad for receiving a first power signal (e.g., a PWR1 signal from a power supply). In one or more embodiments of the invention, a bump pad is a portion of a PWR1 bump region of the 3FDM that includes a PWR1 under bump metallization (UBM) region disposed within and/or coupled to a metal-top layer of a semiconductor device, which provides, at least in part, an electrically conductive contact for receiving a signal (e.g., the PWR1 signal).

In the embodiment of the invention shown in FIG. 1, the PWR1 bump pad (102) is shown as surrounded by dashed white lines in order to contrast with the VSS bump pad (104), PWR2 bump pad (106), and other signal bump pad (108), each of which is shown surrounded by a solid white line. The dashed white lines around the PWR1 bump pad (102) indicate that the PWR1 signal received at the PWR1 bump pad is distributed throughout the PWR1 bump region (discussed further in the description of FIGS. 3A-3E, below). Additionally, using zipper structures (discussed further in the description of FIGS. 2A-2E, below), the PWR1 signal is distributed throughout the non-electrically isolated portions of the metal-top layer shown, in part, in FIG. 1. In one or more embodiments of the invention, the metal-top layer may be referred to as a PWR1 majority layer, and the various portions of the metal-top layer that receive the PWR1 signal may be referred to as a PWR1 majority metal-top region.

In embodiments of the invention such as that shown in FIG. 1, the solid white lines surrounding the other three bump pads indicate that the VSS bump pad (104), the PWR2 bump pad (106), and the other signal bump pad (108) are enclosed within the VSS bump island (110), the PWR2 bump island (112), and the other signal bump island (114), respectively. In one or more embodiments of the invention, the various bump islands are portions of bump regions that include a bump pad and UBM that are electrically isolated from the rest of the metal-top layer within the bump island. A bump island may be electrically isolated so that a bump pad within the bump island may be an electrical contact for receiving a signal without distributing the signal to the rest of the metal-top layer, and may instead pass the signal through the metal-top layer to layers beneath the metal-top layer.

In one or more embodiments of the invention, the VSS bump pad (104) isolated from the metal-top layer within the VSS bump island (110) is a bump pad providing an electrical contact for receiving a VSS signal using a VSS UBM region. As used herein, the term 'VSS' refers to a negative power supply and/or 'ground'. In one or more embodiments of the invention, a VSS bump region (discussed further in the description of FIGS. 4A-4E, below) includes the VSS bump pad in the VSS bump island, and also includes a portion of the PWR1 majority metal-top region.

In one or more embodiments of the invention, the PWR2 bump pad (106) isolated from the metal-top layer within the PWR2 bump island (112) is a bump pad providing an electrical contact for receiving a PWR2 signal using a PWR2 UBM region. As used herein, the term PWR2 refers to any power signal that is distinct from the PWR1 signal. The PWR1 and PWR2 signals may be considered distinct for any reason that allows one of ordinary skill in the relevant art and having the benefit of this Detailed Disclosure to differentiate between the power signals. For example, the signals may have different characteristics (e.g., one signal provides more or less power than the other signal). As another example, the PWR1 and PWR2 signals may be provided from distinct sources. In one or more embodiments of the invention, a PWR2 bump region (discussed further in the description of FIGS. 5A-5E, below) includes the PWR2 bump pad (106) in the PWR2 bump island (112), and also includes a portion of the PWR1 majority metal-top region.

In one or more embodiments of the invention, the other signal bump pad (108) isolated from the metal-top layer within the other signal bump island (114) is a bump pad providing an electrical contact for receiving an electromagnetic signal using an other signal UBM region. As used herein, the term 'other signal' refers to any signal other than PWR1, PWR2 and VSS. For example, the other signal bump pad may receive a clock signal, a periodically varying voltage signal, an information signal, etc. In one or more embodiments of the invention, an other signal bump region (discussed further in the description of FIGS. 6A-6E, below) includes the other signal bump pad (108) in the other signal bump island (114), and also includes a portion of the PWR1 majority metal-top region.

In one or more embodiments of the invention, zipper channels (116) are the channels separating the bump regions enclosing the various bump pads. As shown in FIG. 1, the zipper channels (116) are unbroken in the vertical direction and staggered in the horizontal direction. In one or more embodiments of the invention, the staggered zipper channels in the horizontal direction may terminate into the vertical zipper channels and/or may terminate into a jumper structure (not shown) allowing a signal to pass underneath the vertical zipper channels. The zipper channels (116) may be disposed in any direction without departing the scope of the invention as long as they serve to enclose the various bump regions of the bump pad array. In one or more embodiments of the invention, zipper channels (116) are electrically isolated channels in which zipper channel wires (not shown) may be disposed. The isolated zipper channel wires may be used to distribute signals throughout the semiconductor device, or a portion thereof. Examples of signals that may be distributed using the zipper channel wires include, but are not limited to, clock signals and information signals. Zipper channels and/or isolated zipper channel wires may be fabricated, at least in part, from the metal-top layer.

While FIG. 1 shows various configurations of components, other configurations may be used without departing from the scope of the invention. For example, various components may be combined to create a single component. As another example, the functionality performed by a single component may be performed by two or more components. As other examples, the bump pad array may be arranged differently, or the zipper channels may extend in different directions. Accordingly, embodiments of the invention should not be considered limited to the specific arrangement of components and elements shown in FIG. 1.

FIGS. 2A-2E collectively show a zipper channel region of the 3FDM in greater detail in accordance with one or more embodiments of the invention. As used herein, the term 'zipper channel region' may refer to the portion of the metal-top layer of the 3FDM around and including any portion of the zipper channels and/or isolated zipper channel wires, as well as any portion of the metal-top-1 layer and the metal-top-2 layer beneath the zipper channels.

Figure 2A:
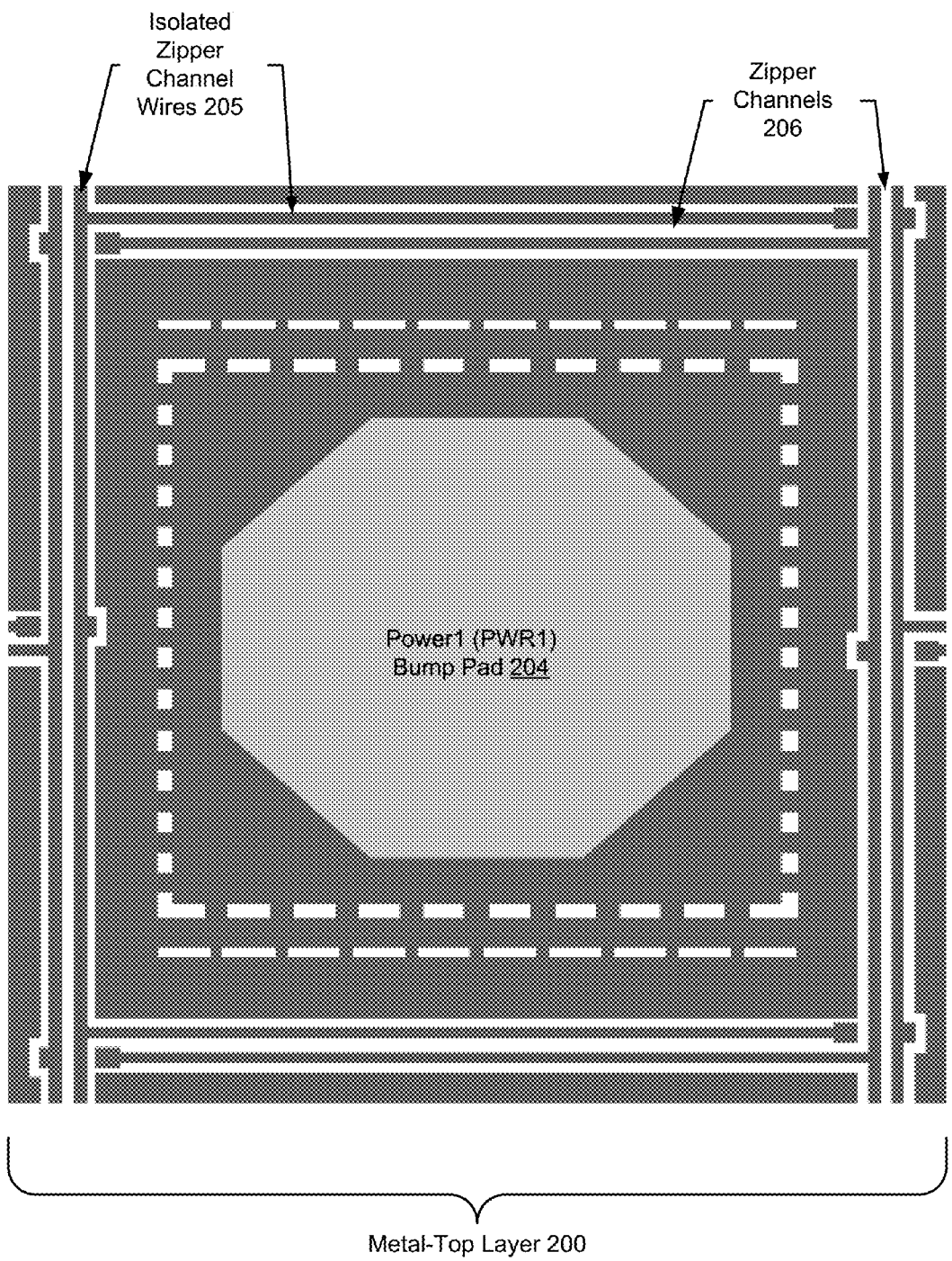
FIG. 2A shows a top view of a Power1 bump pad and zipper channels in a metal-top layer in accordance with one or more embodiments of the invention.

FIG. 2A shows a top view of the full PWR1 bump region, including the PWR1 bump pad (102) from the bump pad array of the metal-top layer shown in FIG. 1. As shown in FIG. 2A, the PWR1 bump pad (204) of the metal-top layer (200) is surrounded by the zipper channels (206). In one or more embodiments of the invention, isolated zipper channel wires (205) are disposed within the zipper channels (206). The PWR1 bump pad (204) is shown in FIG. 2A for exemplary purposes, as any of the various bump pads may be similarly enclosed within zipper channels. In the embodiment shown in FIG. 2A, the zipper channels in the vertical direction are unbroken while the zipper channels in the horizontal direction are shown as connecting at one end with a vertical zipper channel and terminating at the opposite end at a jumper (not shown), allowing a horizontal zipper channel wire to extend under one of the vertical zipper channels to couple with a zipper channel wire in the other vertical zipper channel. In one or more embodiments of the invention, the arrangement of the zipper channels shown in FIG. 2A allows for the distribution of signals in the vertical and horizontal directions using isolated zipper channel wires (205) disposed within the zipper channels (206).

Figure 2B:
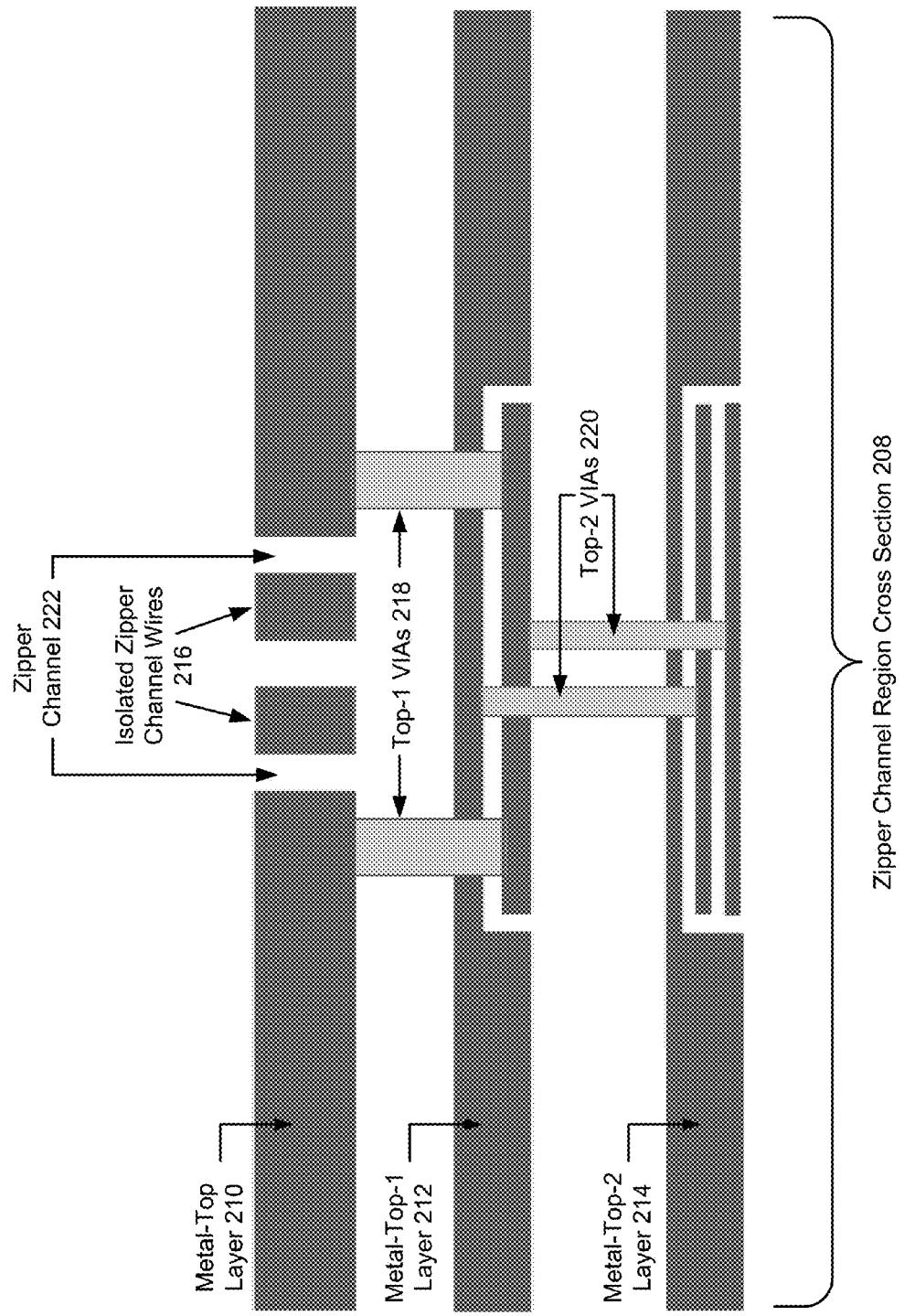
FIG. 2B shows a cross sectional view of a zipper channel region in accordance with one or more embodiments of the invention.

FIG. 2B shows a zipper channel region cross section (208) of the 3FDM. As shown in FIG. 2B, the 3FDM includes a metal-top layer (210). In one or more embodiments of the invention, the metal-top layer is substantially similar to that discussed above in the description of FIG. 1 and FIG. 2A, each of which showed a top view of the metal-top layer and features therein. In one or more embodiments of the invention, a metal-top-1 layer (212) is beneath the metal-top layer (210), and a metal-top-2 layer (214) is beneath the metal-top-1 layer (212). In one or more embodiments of the invention, the various metal layers may be separated, at least in part, by any material (e.g., a dielectric material, an insulating material, etc.) in any phase of matter that does not create any substantial electrical connection between metal layers.

In one or more embodiments of the invention, as discussed above, the metal-top layer (210) is a PWR1 majority layer, meaning that the signal distributed throughout the non-electrically isolated portions of the metal-top layer (i.e., the PWR1 majority metal-top region) is a PWR1 signal received by PWR1 bump pads. Similarly, in one or more embodiments of the invention, the metal-top-1 layer (212) is a VSS (e.g., ground) majority layer, meaning that the signal distributed throughout the non-electrically isolated portions of the metal-top-1 layer (i.e., the VSS majority metal-top-1 region) is a VSS signal received by VSS bump pads. Also similarly, in one or more embodiments of the invention, the metal-top-2 layer (214) is a PWR2 majority layer, meaning that the signal distributed throughout the non-electrically isolated portion of the metal-top-2 layer (i.e., the PWR2 majority metal-top-2 region) is a PWR2 signal received by PWR2 bump pads.

The center section of FIG. 2B shows a portion of a zipper channel region of the 3FDM in accordance with one or more embodiments of the invention. As shown in FIG. 2B, the metal-top layer (210) includes the zipper channel (222), which electrically isolates the zipper channel wires (216), through which isolated signals may propagate, at least in part, throughout the 3FDM and/or portions therein. In one or more embodiments of the invention, the zipper channel (222) and zipper channel wires (216) are formed during fabrication of the semiconductor device from the metal-top layer (210). One having ordinary skill in the art and the benefit of this Detailed Description will recognize that although FIG. 2B shows a zipper channel with two electrically isolated zipper channel wires, the 3FDM may have any number of isolated zipper channel wires in any number of zipper channels without departing from the scope of the invention.

In one or more embodiments of the invention, beneath the zipper channel (222) is vertical interlayer connections (VIAs) (218, 220). A VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM. VIAs may be formed, at least in part, by creating (e.g., by etching), during fabrication of a semiconductor device, holes between two metal layers through the material separating the two metal layers, and then depositing (e.g., by chemical vapor deposition) a conducting material (e.g., a metal) into the holes.

In one or more embodiments of the invention, the top-1 VIAs (218) of the zipper channel region are disposed between the metal-top layer (210) and the metal-top-1 layer (212) and provide an electrical connection between the PWR1 majority metal-top layer and an electrically isolated region of the VSS majority metal-top-1 layer. In one or more embodiments of the invention, the top-1 VIAs (218) include functionality to propagate, using an electrically isolated portion of the metal-top-1 layer, the PWR1 signal under the zipper channel (222), thereby coupling various portions of the PWR1 majority metal-top-1 region.

Similarly, in one or more embodiments of the invention, the top-2 VIAs (220) of the zipper channel region are disposed between the metal-top-1 layer (212) and the metal-top-2 layer (214) and provide an electrical connection between the VSS majority metal-top-1 layer and an electrically isolated region of the PWR2 majority metal-top-2 layer, as well as between an electrically isolated PWR1 region of the metal-top-1 layer and an electrically isolated PWR1 region of the metal-top-2 layer.

Thus, in one or more embodiments of the invention, the VIAs allow each of the PWR1 signal, the VSS signal, and the PWR2 signal to be distributed from the metal-top layer of the 3FDM to regions of each of the other metal layers of the 3FDM for distribution throughout at least a portion of a semiconductor device.

FIG. 2C shows a closer top view of a zipper channel region (210) of the 3FDM. As shown in FIG. 2C, the zipper channel (230) is shown disposed between and separating the top left of a PWR1 bump region that includes a PWR1 bump pad quadrant (226) and the lower right of a VSS bump region that includes a VSS bump pad quadrant (228). As shown in FIG. 2C, each bump pad quadrant represents a portion of the bump pads shown in FIG. 1. In one or more embodiments of the invention, isolated zipper channel wires (231) are again shown to run continuously in the vertical direction and to connect to and/or propagate under the vertical zipper channels in the horizontal direction.

Figure 2D:
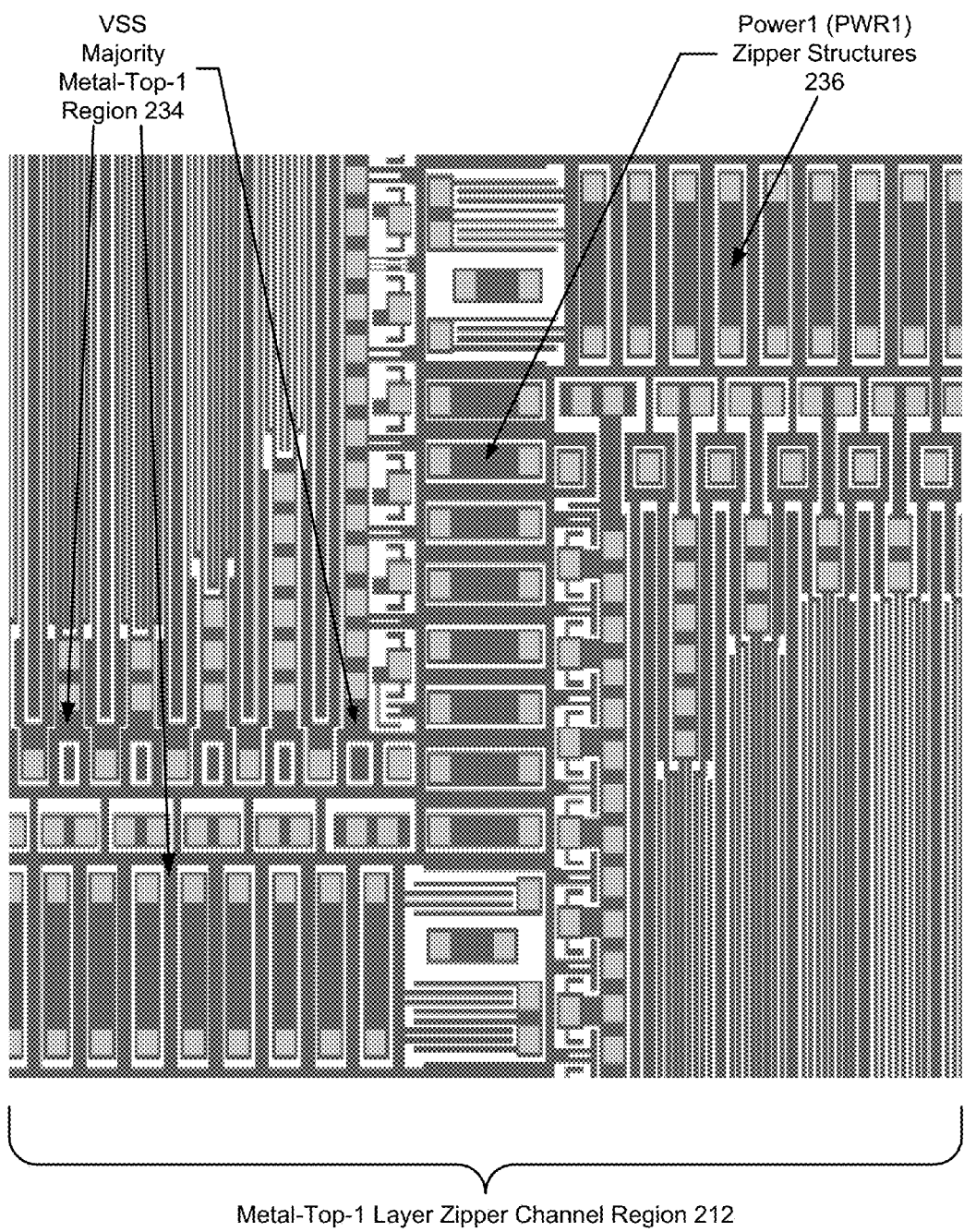
FIG. 2D shows a top view of a metal-top-1 layer zipper channel region in accordance with one or more embodiments of the invention.

FIG. 2D shows a view of the zipper channel region (212) implemented in the metal-top-1 layer. In one or more embodiments of the invention, the metal-top-1 zipper channel region (212) shown in FIG. 2D is substantially directly beneath the metal-top zipper channel region (210) shown in FIG. 2C.

As shown in FIG. 2D, PWR1 zipper structures (236) are disposed beneath the isolated zipper channel wires (216) shown in FIG. 2B, and are configured to allow propagation of the PWR1 signal from the PWR1 bump regions to the remainder of the PWR1 majority metal-top region. In one or more embodiments of the invention, each the PWR1 zipper structures (236) is coupled to one or more VIAs (shown as lighter grey). The VIAs may provide an electrical connection between the PWR1 bump region and the PWR1 zipper structures that are formed in the metal-top-1 layer, which may allow the PWR1 signal to effectively 'jump' beneath the zipper channels to other portions of the PWR1 majority metal-top region. The PWR1 zipper structures (236) may be electrically isolated from other portions of the metal-top-1 layer.

The embodiment shown in FIG. 2D also includes the VSS majority metal-top-1 region (234). The VSS majority metal-top-1 region (234) may be any interconnected (i.e., not electrically isolated) portion of the metal-top-1 layer (212). In one or more embodiments of the invention, the VSS majority metal-top-1 region (234) includes VIAs, through which power is received from one or more VSS bump pads (e.g., 104 of FIG. 1). Electrically isolated regions of the metal-top-1 layer (212) may be for propagating signals other than VSS (e.g., PWR1, PWR2, etc.) to and/or through the metal-top-1 layer, and are described further below in the descriptions of FIGS. 3A-6E.

Figure 2E:
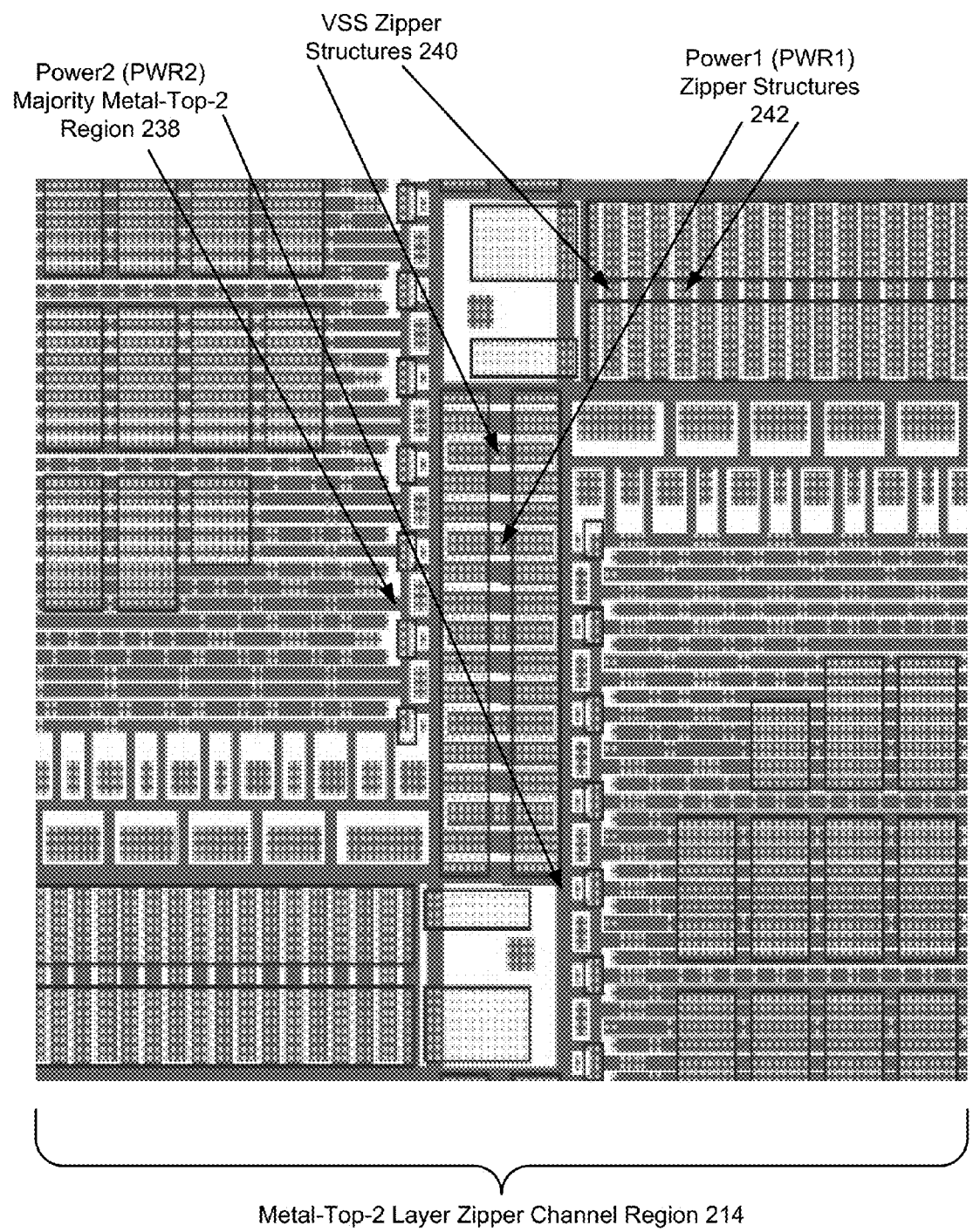
FIG. 2E shows a top view of a metal-top-2 layer zipper channel region in accordance with one or more embodiments of the invention.

FIG. 2E shows a top view of a zipper channel region (214) implemented in a metal-top-2 layer. In one or more embodiments of the invention, the metal-top-2 zipper channel region (214) shown in FIG. 2E is substantially directly beneath the metal-top-1 region shown in FIG. 2D. As shown in FIG. 2E, the PWR1 zipper structures (242) and the VSS zipper structures (240) are beneath the PWR1 zipper structures (236) of FIG. 2D, and the zipper channels and isolated zipper channel wires shown in FIGS. 2B and 2C.

In one or more embodiments of the invention, the VSS zipper structures (240) are configured to allow propagation of the VSS signal between portions of the VSS majority metal-top-1 layer using electrically isolated portions of the metal-top-2 layer, and the PWR1 zippers are configured to allow propagation of the PWR1 signal from electrically isolated PWR1 regions of the metal-top-1 layer to the other electrically isolated PWR1 regions of the metal-top-1 layer. In the embodiment shown in FIG. 2E, the VSS zipper structures (240) and the PWR1 zippers structures (242) each include VIAs to the metal-top-1 layer. In one or more embodiments of the invention, the VSS zipper structures (240) and the PWR1 zipper structures (242) alternate with one another.

The embodiment shown in FIG. 2E also includes the PWR2 majority metal-top-2 region (238) of the PWR2 majority metal-top-2 layer. The PWR2 majority metal-top-2 region (238) may be any quantity of interconnected (i.e., not electrically isolated) portions of the metal-top-2 layer. In one or more embodiments of the invention, the PWR2 majority metal-top-2 region (238) includes VIAs through which the PWR2 signal is received from electrically isolated PWR2 regions of the metal-top-1 layer. In one or more embodiments of the invention, the electrically isolated PWR2 regions of the metal-top-1 layer receive the PWR2 signal (using top-1 VIAs) from one or more PWR2 bump pads (e.g., 106 of FIG. 1). Isolated regions of the metal-top-2 layer (214) are for propagating other signals (e.g., PWR1, VSS, etc.) throughout regions of the metal-top-2 layer, which are described further below in the descriptions of FIGS. 3A-6E.

FIGS. 3A-3E collectively show a PWR1 region of the 3FDM in greater detail in accordance with one or more embodiments of the invention. As used herein, the term 'PWR1 region' may refer to the portion of the metal-top layer of the 3FDM enclosed by zipper channels and including a PWR1 bump pad (i.e., a PWR1 bump region), as well as any portion of the metal-top-1 layer and the metal-top-2 layer beneath the PWR1 bump region.

Figure 3A:
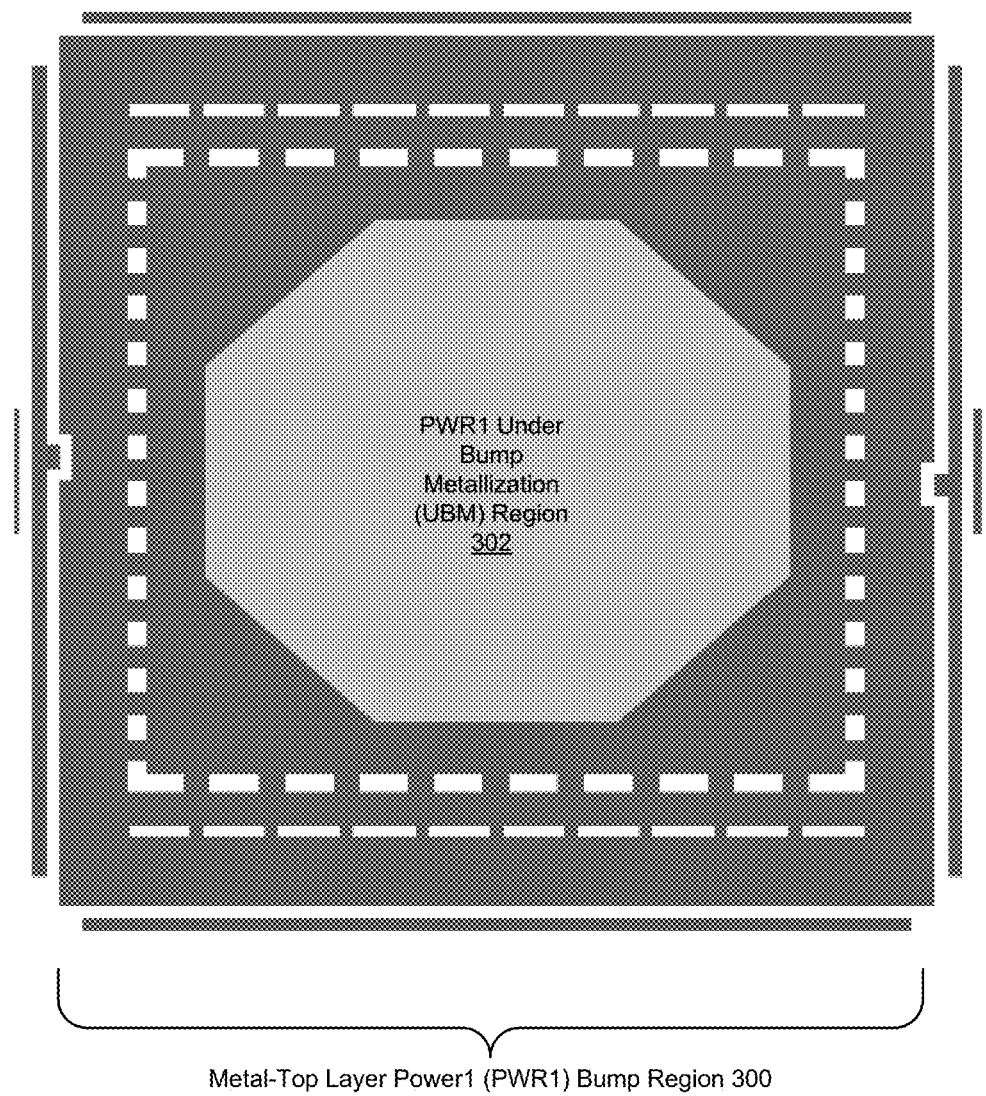
FIG. 3A shows a top view of Power1 bump region in a metal-top layer in accordance with one or more embodiments of the invention.

FIG. 3A shows a top view of the full PWR1 bump region from the bump pad array of the metal-top layer shown in FIG. 1. As shown in FIG. 3A, the PWR1 bump region of the metal-top layer (300) includes the PWR1 bump pad (102) discussed above in the description of FIG. 1. In the embodiment shown in FIG. 3A, the PWR1 bump pad includes a PWR1 UBM region (302). As described above, a UBM is a region of metallization that provides an electrical contact for receiving an electromagnetic signal within a bump pad of a bump region. In one or more embodiments of the invention, as discussed above, the white dashed lines surrounding the PRW1 UBM region (302) are intended to indicate that the PWR1 bump pad is not electrically isolated from the remainder of the PWR1 bump region. Therefore the PWR1 signal is distributed from the PWR1 bump region (300) to the non-electrically isolated remainder PWR1 bump region, and to other portions of the PWR1 majority metal-top region using zipper structures of the metal-top-1 layer (as discussed above in the description of FIGS. 2A-2E).

Figure 3B:
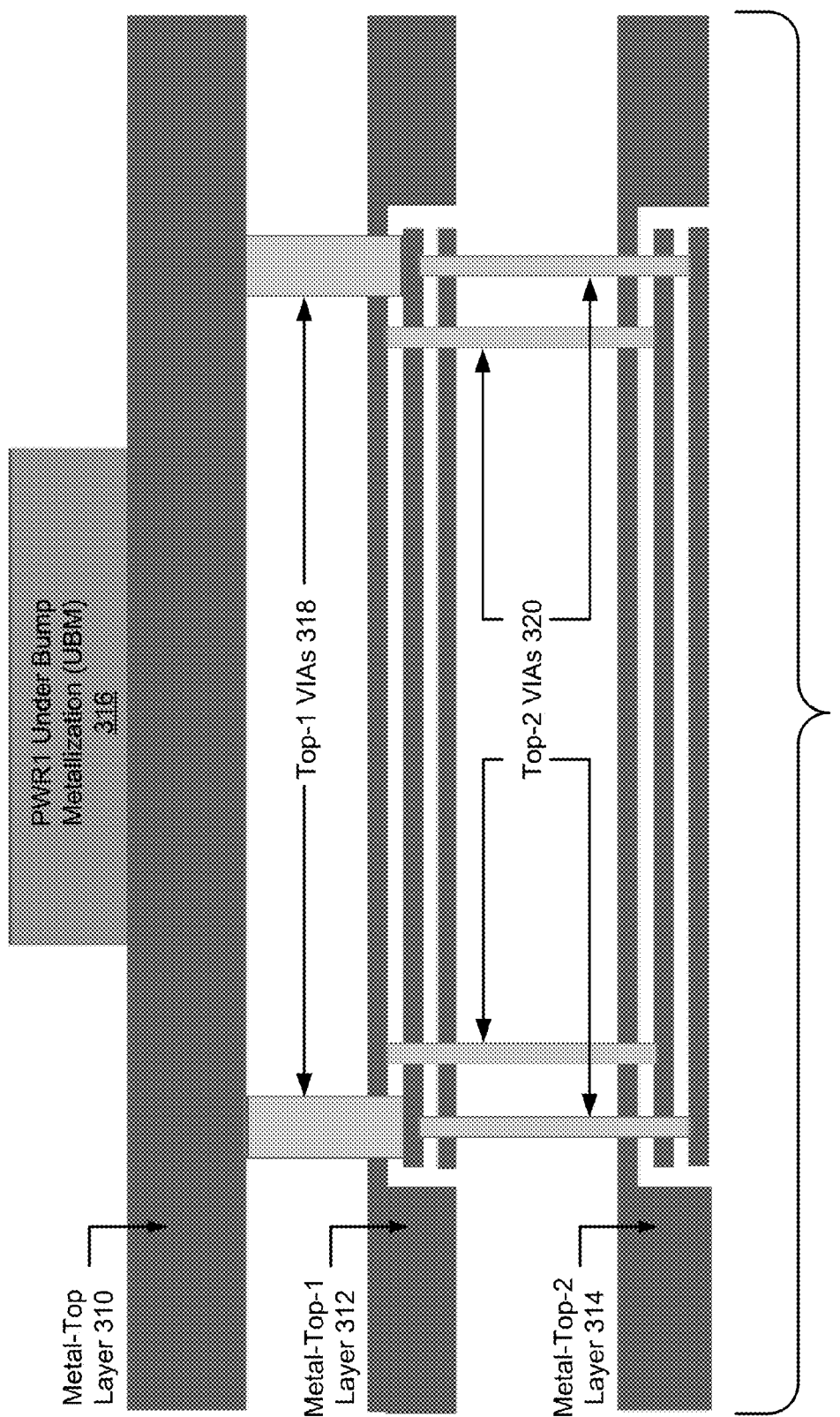
FIG. 3B shows a cross sectional view of a Power1 bump region in accordance with one or more embodiments of the invention.

FIG. 3B shows a PWR1 bump region cross section (308) of the 3FDM. As shown in FIG. 3B, the PWR1 bump region cross section (308) includes a metal-top layer (310). In one or more embodiments of the invention, the metal-top layer (310) is substantially similar to that discussed above in the description of FIG. 1 and FIG. 2A, each of which showed a top view of the metal-top layer and various features therein, and in FIG. 2B, which showed a cross section of a different region of the 3FDM. In one or more embodiments of the invention, a metal-top-1 layer (312) is beneath the metal-top layer (310), and a metal-top-2 layer (314) is beneath the metal-top-1 layer (312). In one or more embodiments of the invention, the various metal layers may be separated by any material (e.g., a dielectric material, an insulating material, etc.) in any phase of matter, so long as the material does not create any substantial electrical connection between metal layers.

In one or more embodiments of the invention, as discussed above in the description of FIG. 2B, the metal-top layer is a PWR1 majority layer, the metal-top-1 layer is a VSS (e.g., ground) majority layer, and the metal-top-2 layer is a PWR2 majority layer.

The center section of FIG. 3B shows a portion of the PWR1 region of the 3FDM. As shown in FIG. 3B, a PWR1 UBM (316) is coupled to the metal-top layer (310) and provides an electrical contact for receiving the PWR1 signal. In one or more embodiments of the invention, beneath the PWR1 UBM (316) are VIAs (318, 320). As described above, a VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM.

In one or more embodiments of the invention, the top-1 VIAs (318) of the PWR1 region are disposed between the metal-top layer (310) and the metal-top-1 layer (312) and provide an electrical connection between the PWR1 majority metal-top region and an electrically isolated region of the VSS majority metal-top-1 layer (i.e., a PWR1 metal-top-1 region).

Similarly, in one or more embodiments of the invention, the top-2 VIAs (320) of the PWR1 region are disposed between the metal-top-1 layer (312) and the metal-top-2 layer (314) and provide an electrical connection between the VSS majority metal-top-1 layer and an electrically isolated region of the PWR2 majority metal-top-2 layer (i.e., a VSS metal-top-2 region), as well as between the PWR1 metal-top-1 region and an electrically isolated PWR1 region of the metal top-2 layer (i.e., a PWR1 metal-top-2 region). Thus, in one or more embodiments of the invention, the VIAs allow each of the PWR1 signal, the VSS signal, and the PWR2 signal to be distributed from the metal-top layer of the 3FDM to portions of each of the other metal layers of the 3FDM for distribution throughout at least a portion of a semiconductor device.

Figure 3C:
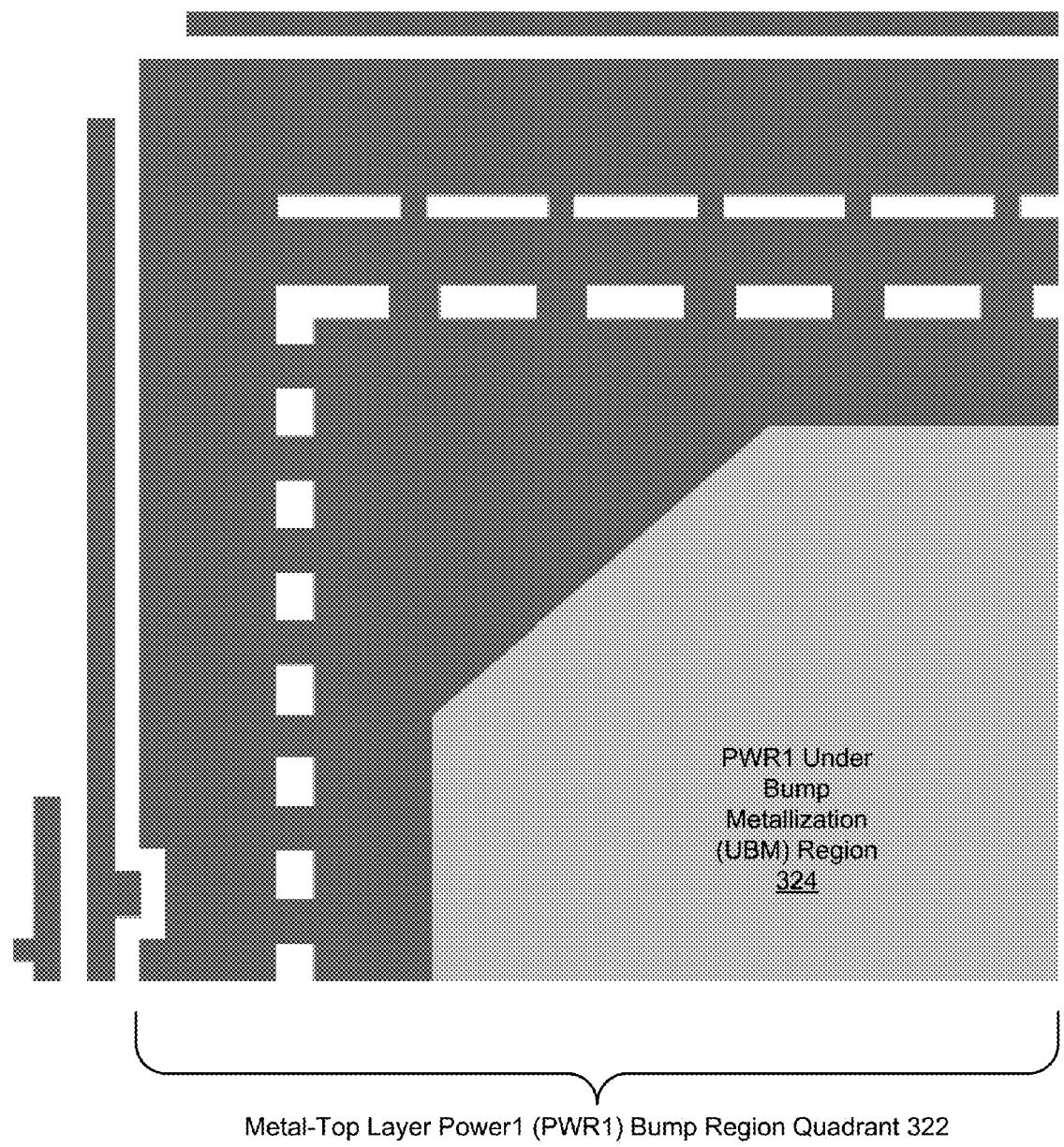
FIG. 3C shows a top view of a Power1 bump region quadrant in a metal-top layer in accordance with one or more embodiments of the invention.

FIG. 3C shows a closer top view of a PWR1 bump region of the 3FDM by way of showing the upper left metal-top layer PWR1 bump region quadrant (322). As shown in FIG. 3C, the dashed lines continue to indicate that the PWR1 signal is not isolated in the PWR1 bump region. Additionally, in one or more embodiments of the invention, the PWR1 UBM region (324) is a quadrant of the PWR1 UBM region shown in FIG. 3A.

Figure 3D:
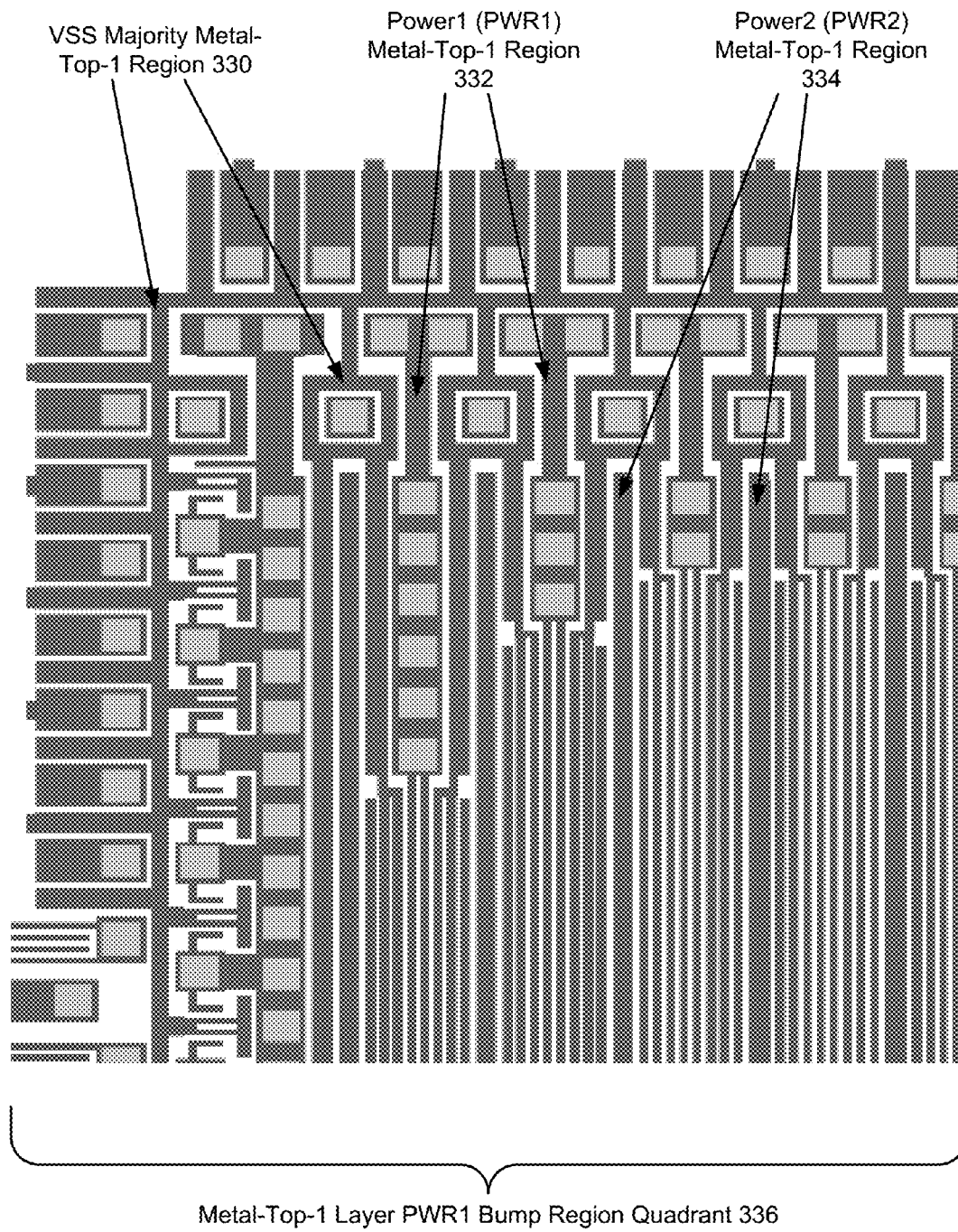
FIG. 3D shows a top view of a Power1 bump region quadrant in a metal-top-1 layer in accordance with one or more embodiments of the invention.

FIG. 3D shows a view of the PWR1 bump region quadrant (336) implemented in the metal-top-1 layer. In one or more embodiments of the invention, the metal-top-1 PWR1 bump region quadrant (336) shown in FIG. 3D is substantially directly beneath the metal-top PWR1 bump region quadrant (322) shown in FIG. 3C. In the embodiment shown in FIG. 3D, the VSS majority metal-top-1 region (330) is any portion of the metal-top-1 layer that is not an electrically isolated region of the metal-top-1 layer, and thus receives the VSS signal, using VIAs, from a VSS bump pad such as the VSS bump pad (104) shown in FIG. 1 and discussed further below in the descriptions of FIGS. 4A-4E. The above-described distribution of the VSS signal in the metal-top-1 layer may make the metal-top-1 layer a VSS majority layer.

In one or more embodiments of the invention, the PWR1 metal-top-1 regions (332) shown in FIG. 3D are regions of the metal-top-1 layer that are electrically isolated from other regions of the metal-top-1 layer and which are used for distribution of the PWR1 signal, using VIAs, from a PWR1 bump pad such as the PWR1 bump pad (102) of FIG. 1A, to the metal-top-1 layer. In one or more embodiments of the invention, such as that shown in FIG. 3D, the PWR1 metal-top-1 region includes functionality to distribute the PWR1 signal in a vertical direction (i.e., towards the top and bottom of top view shown in FIG. 3D).

In one or more embodiments of the invention, the PWR2 metal-top-1 regions (334) shown in FIG. 3D are regions of the metal-top-1 layer that are electrically isolated from other regions of the metal-top-1 layer and which are used for distribution of the PWR2 signal, using VIAs, from a PWR2 bump pad to the metal-top-1 layer. In one or more embodiments of the invention, such as that shown in FIG. 3D, the PWR2 metal-top-1 region includes functionality to distribute the PWR2 signal in a vertical direction (i.e., towards the top and bottom of top view shown in FIG. 3D).

Figure 3E:
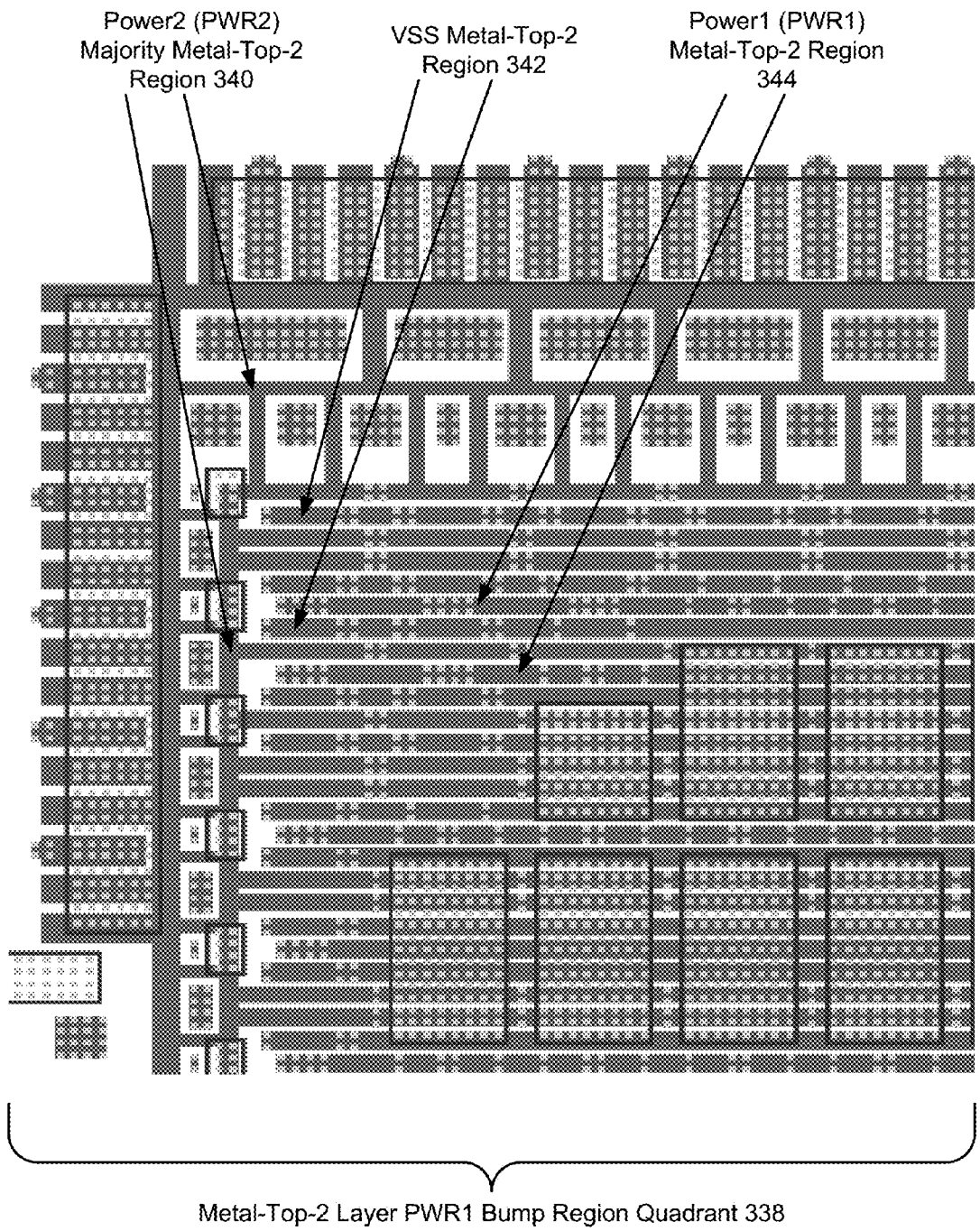
FIG. 3E shows a top view of a Power1 bump region quadrant in a metal-top-2 layer in accordance with one or more embodiments of the invention.

FIG. 3E shows a top view of a PWR1 bump region quadrant (338) implemented in a metal-top-2 layer. In one or more embodiments of the invention, the PWR1 bump region quadrant (338) shown in FIG. 3E is substantially directly beneath the metal-top-1 PWR1 bump region quadrant (336) shown in FIG. 3D. In the embodiment shown in FIG. 3E, the PWR2 majority metal-top-2 region (340) is any portion of the metal-top-2 layer that is not electrically isolated, and thus receives the PWR2 signal, using VIAs, from an electrically isolated PWR2 metal-top-1 region, which, in turn, receives the PWR2 signal, using VIAs, from a PWR2 bump pad of the metal-top layer, such as PWR2 bump pad (106) shown in FIG. 1 and discussed further below in the descriptions of FIGS. 5A-5E. The above-described distribution of the PWR2 signal in the metal-top-2 layer may make the metal-top-2 layer a PWR2 majority layer.

In one or more embodiments of the invention, the PWR1 metal-top-2 regions (344) shown in FIG. 3E are regions of the metal-top-2 layer that are electrically isolated from other regions of the metal-top-2 layer and which are used for distribution of the PWR1 signal from an electrically isolated PWR1 metal-top-1 region, which, in turn, receives the PWR1 signal, using VIAs, from a PWR1 bump pad of the metal-top layer. In one or more embodiments of the invention, such as that shown in FIG. 3E, the PWR1 metal-top-2 region includes functionality to distribute the PWR1 signal in a horizontal direction (i.e., towards the left and right of top view shown in FIG. 3E). In one or more embodiments of the invention, the direction of propagation of the PWR1 signal in the PWR1 metal-top-2 region is orthogonal to the direction of propagation of the PWR1 signal in the PWR1 metal-top-1 region.

In one or more embodiments of the invention, the VSS metal-top-2 regions (342) shown in FIG. 3E are regions of the metal-top-2 layer that are electrically isolated from other regions of the metal-top-2 layer and which are used for distribution of the VSS signal from an VSS metal-top-1 region, which, in turn, receives the VSS signal, using VIAs, from a VSS bump pad of the metal-top layer. In one or more embodiments of the invention, such as that shown in FIG. 3E, the VSS metal-top-2 region includes functionality to distribute the VSS signal in a horizontal direction (i.e., towards the left and right of top view shown in FIG. 3E). In one or more embodiments of the invention, the direction of propagation of the VSS signal in the VSS metal-top-2 region is orthogonal to the direction of propagation of the VSS signal in the VSS metal-top-1 region.

FIGS. 4A-4E collectively show a VSS region of the 3FDM in greater detail in accordance with one or more embodiments of the invention. As used herein, the term 'VSS region' may refer to the portion of the metal-top layer of the 3FDM enclosed by zipper channels and including a VSS bump pad (i.e., a VSS bump region), as well as any portion of the metal-top-1 layer and the metal-top-2 layer beneath the VSS bump region.

Figure 4A:
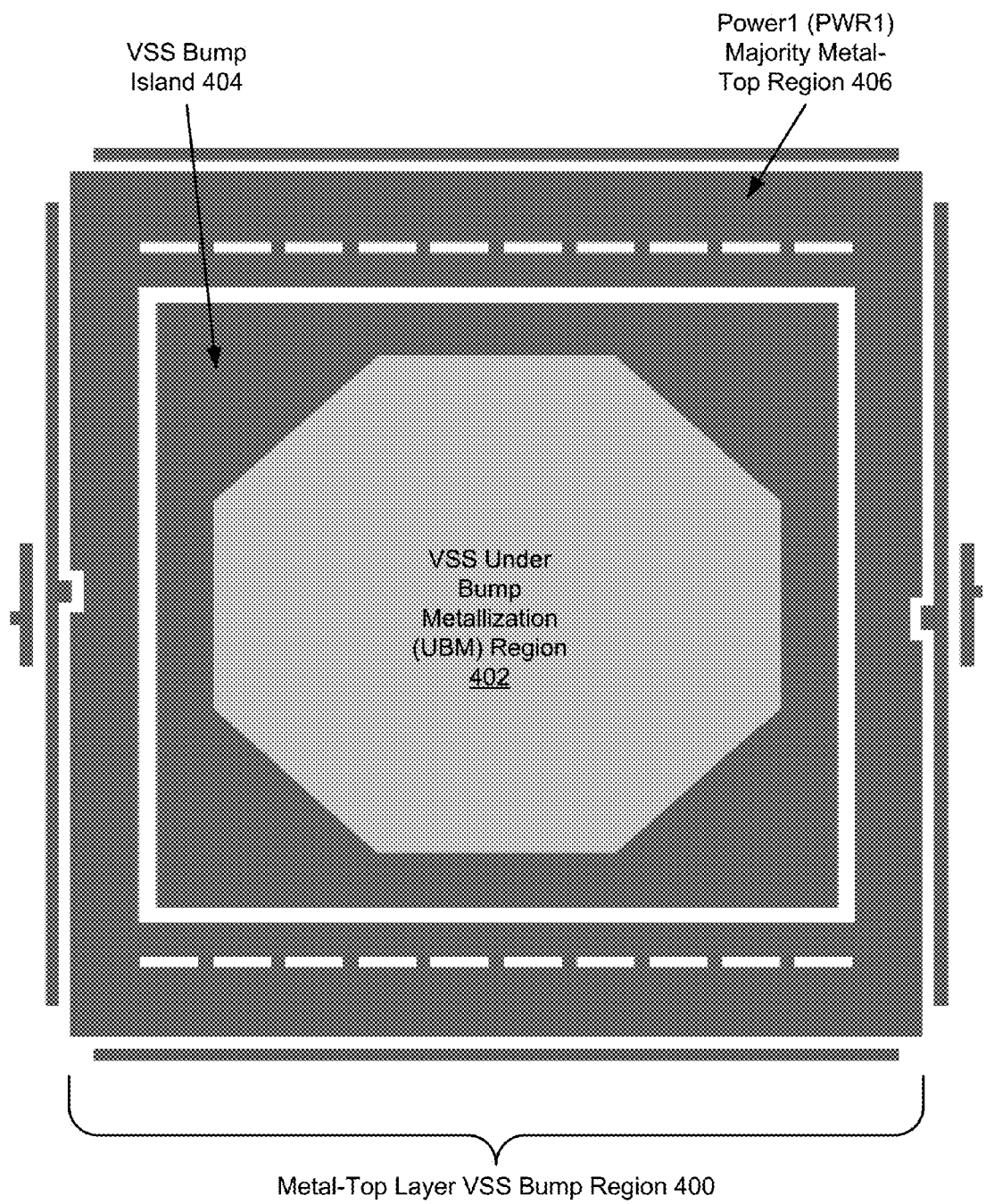
FIG. 4A shows a top view of a VSS bump region in a metal-top layer in accordance with one or more embodiments of the invention.

FIG. 4A shows a top view of a VSS bump region from the bump pad array (100) of the portion of the metal-top layer shown in FIG. 1. As shown in FIG. 4A, the VSS bump region (400) of the metal-top layer is substantially similar to the VSS bump pad (104) discussed above in the description of FIG. 1. In the embodiment shown in FIG. 4A, the VSS bump region (400) includes a bump pad that includes a VSS UBM region (402). As described above, a UBM is a region of metallization that provides an electrical contact for receiving an electromagnetic signal within the bump region, such as the VSS signal received by the VSS bump pad.

In one or more embodiments of the invention, as discussed above, the solid white line surrounding the VSS UBM region (402) is intended to show that the VSS UBM region, though formed from the metal-top layer and the UBM, is isolated from the remainder of the metal-top layer to allow the VSS signal to be provided to other layers of the 3FDM. The isolated region within the VSS bump region may be referred as the VSS bump island (404). In one or more embodiments of the invention, outside the VSS bump island (404) is a portion of the PWR1 majority metal-top region (406), throughout which the PWR1 signal is distributed from PWR1 bump regions using zipper structures of the metal-top-1 layer.

FIG. 4B shows a VSS bump region cross section (408) of the 3FDM. As shown in FIG. 4B, the 3FDM includes a metal-top layer (410). In one or more embodiments of the invention, the metal-top layer (410) is substantially similar to that discussed above in the description of FIG. 1 and FIG. 2A, each of which show a top view of the metal-top layer and features therein, and in FIGS. 2B and 3B, which show a cross section of a different region of the 3FDM. In one or more embodiments of the invention, a metal-top-1 layer (412) is beneath the metal-top layer (410), and a metal-top-2 layer (414) is beneath the metal-top-1 layer. In one or more embodiments of the invention, the various metal layers may be separated by any material (e.g., a dielectric material, an insulating material, etc.) in any phase of matter, so long as the material does not create any substantial electrical connection between metal layers.

In one or more embodiments of the invention, as discussed above in the description of FIGS. 2B and 3B, the metal-top layer (410) is a PWR1 majority layer, the metal-top-1 layer (412) is a VSS (e.g., ground) majority layer, and the metal-top-2 layer (414) is a PWR2 majority layer.

The center section of FIG. 4B shows a portion of the VSS region of the 3FDM. As shown in FIG. 4B, a VSS UBM (418) is coupled to the metal-top layer and provides an electrical contact for receiving the VSS signal. In one or more embodiments of the invention, beneath the VSS UBM (418) are VIAs (420, 422). As described above, a VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM.

In one or more embodiments of the invention, the top-1 VIAs (420) of the VSS region are disposed between the metal-top layer (410) and the metal-top-1 (412) layer and provide an electrical connection between the PWR1 majority metal-top region and an electrically isolated PWR1 region of the VSS majority metal-top-1 layer (i.e., a PWR1 metal-top-1 region), as well as from the VSS bump pad to the VSS majority metal-top-1 region. In one or more embodiments of the invention, the PWR1 region (406) and VSS bump island (404) of FIG. 4A are electrically isolated from one another, as shown in FIG. 4B by the VSS island boundaries (416) (shown in FIG. 4A as the solid white line surrounding the VSS UBM region).

In one or more embodiments of the invention, the top-2 VIAs (422) of the VSS region are disposed between the metal-top-1 layer and the metal-top-2 layer and provide an electrical connection between: (i) the VSS majority metal-top-1 region and an electrically isolated VSS region of the PWR2 majority metal-top-2 layer (i.e., a VSS metal-top-2 region); (ii) the PWR2 majority metal-top-2 region and an electrically isolated PWR2 region of the metal-top-1 layer (i.e., a PWR2 metal-top-1 region); and (iii) a PWR1 metal-top-1 region of the metal-top-1 layer and an electrically isolated PWR1 region of the metal-top-2 layer (i.e., a PWR1 metal-top-2 region). Thus, in one or more embodiments of the invention, the VIAs allow each of the PWR1 signal, the VSS signal, and the PWR2 signal to be distributed from the metal-top layer of the 3FDM to regions of each of the other metal layers of the 3FDM for distribution throughout at least a portion of a semiconductor device.

Figure 4C:
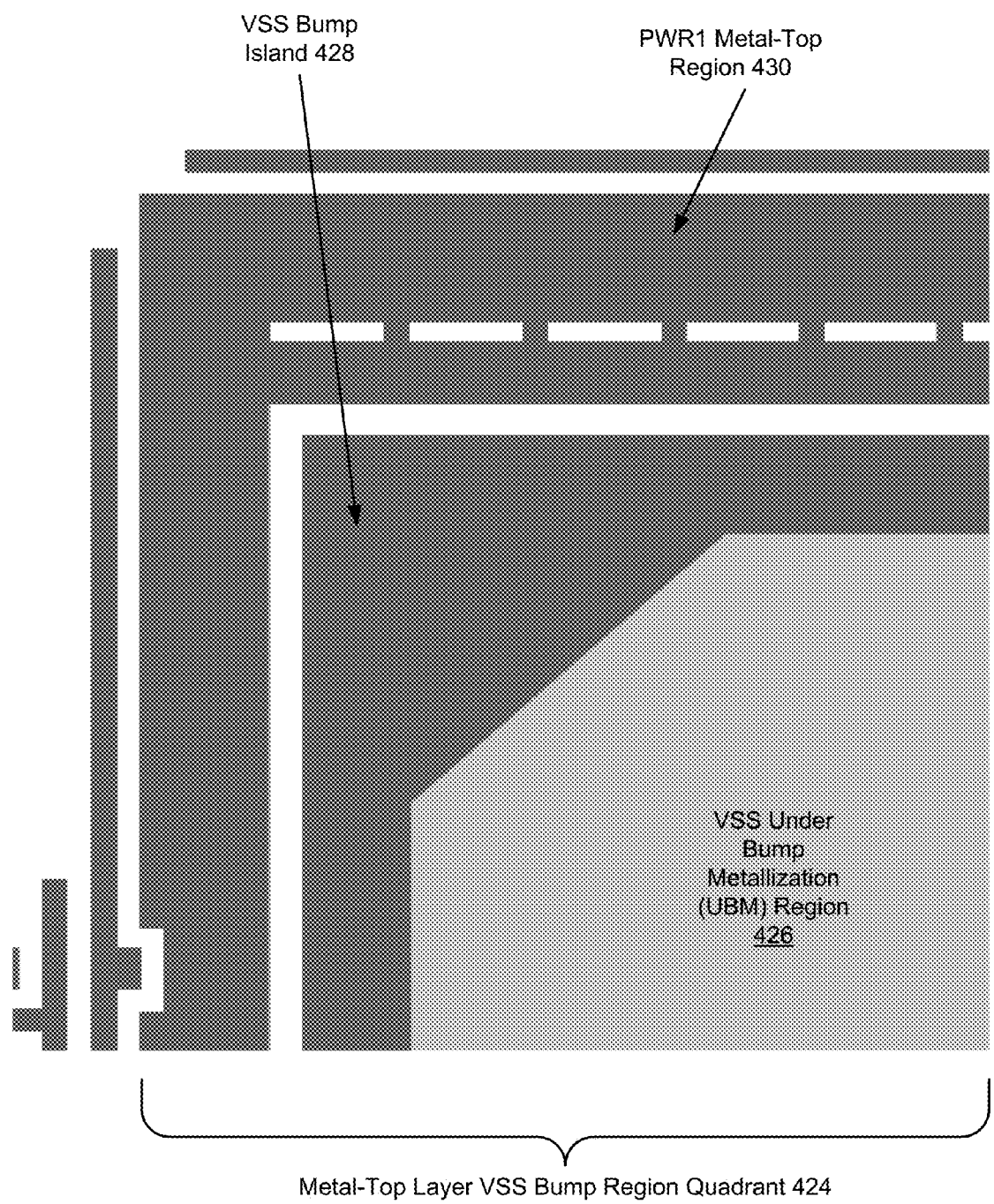
FIG. 4C shows a top view of a VSS bump region quadrant in a metal-top layer in accordance with one or more embodiments of the invention.

FIG. 4C shows a closer top view of a VSS bump region of the 3FDM by way of showing the upper left metal-top layer VSS bump region quadrant (424). As shown in FIG. 4C, the solid white line enclosing the VSS UBM region (426) continues to indicate that the VSS signal is isolated in the VSS bump island (428) from the PWR1 majority metal-top region. Additionally, the PWR1 metal-top region (430) may be at least a portion of the remainder of the metal-top layer in which the PWR1 signal is distributed.

Figure 4D:
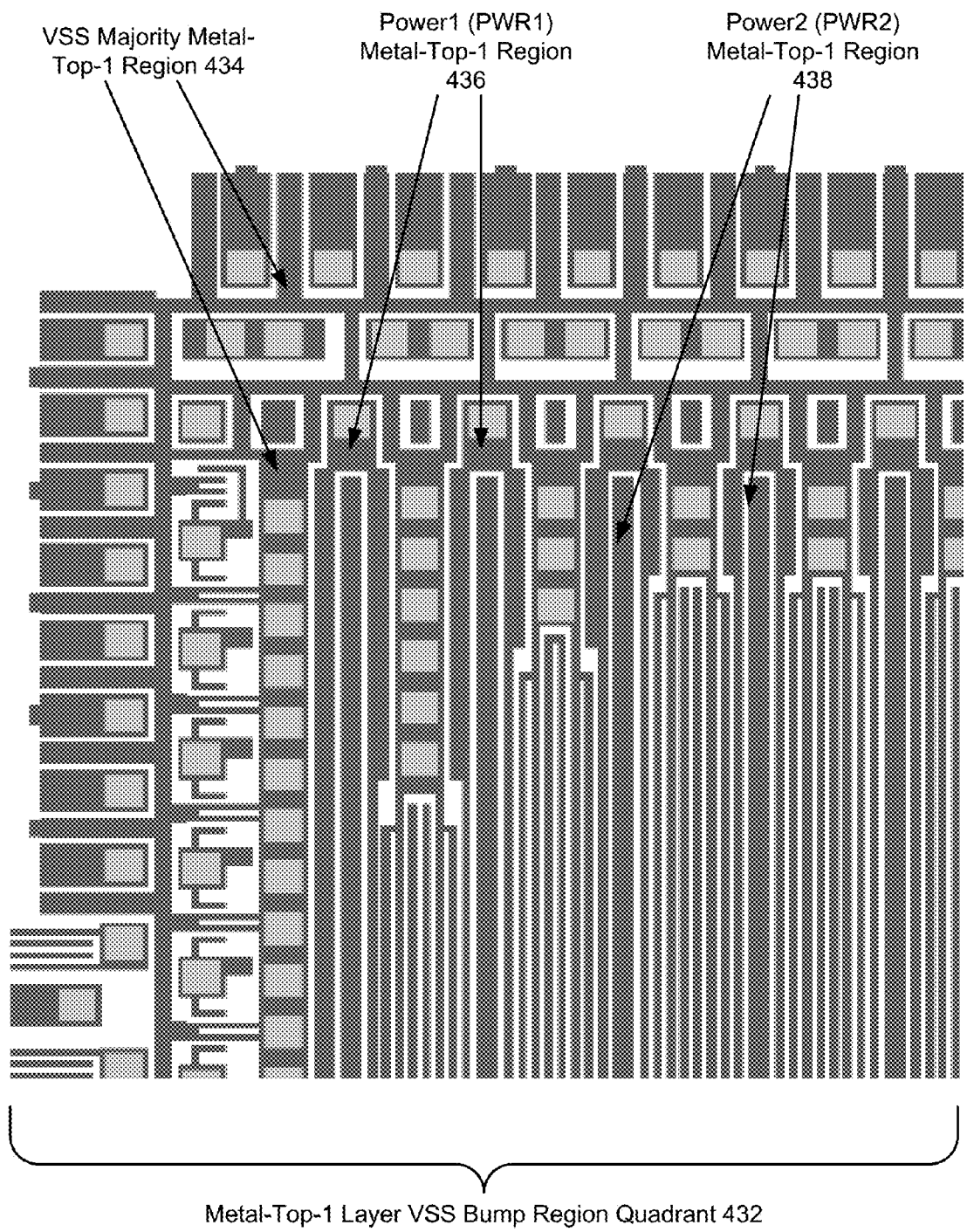
FIG. 4D shows a top view of a VSS bump region quadrant in a metal-top-1 layer in accordance with one or more embodiments of the invention.

FIG. 4D shows a view of the VSS bump region quadrant (432) implemented in the metal-top-1 layer. In one or more embodiments of the invention, the VSS bump region quadrant (432) shown in FIG. 4D is substantially directly beneath the VSS bump region quadrant (424) of the metal-top layer portion shown in FIG. 4C.

In the embodiment shown in FIG. 4D, the VSS majority metal-top-1 region (434) is any portion of the metal-top-1 layer that is not electrically isolated, and thus receives the VSS signal from the VSS bump pad's VSS UBM region (e.g., 426 of FIG. 4C) using top-1 VIAs. The above-described distribution of the VSS signal in the VSS metal-top-1 region may make the metal-top-1 layer a VSS majority layer.

In one or more embodiments of the invention, the PWR1 metal-top-1 regions (436) shown in FIG. 4D are regions of the metal-top-1 layer that are electrically isolated from other regions of the metal-top-1 layer and which are used for distribution of the PWR1 signal from a PWR1 bump pad (using top-1 VIAs) to the metal-top-1 layer. In one or more embodiments of the invention, such as that shown in FIG. 4D, the PWR1 metal-top-1 region includes functionality to distribute the PWR1 signal in the vertical direction.

In one or more embodiments of the invention, the PWR2 metal-top-1 regions (438) shown in FIG. 4D are regions of the metal-top-1 layer that are electrically isolated from other regions of the metal-top-1 layer and which are used for distribution of the PWR2 signal, using VIAs, from a PWR2 bump pad to the metal-top-1 layer. In one or more embodiments of the invention, such as that shown in FIG. 4D, the PWR2 metal-top-1 region (438) includes functionality to distribute the PWR2 signal in the vertical direction.

Figure 4E:
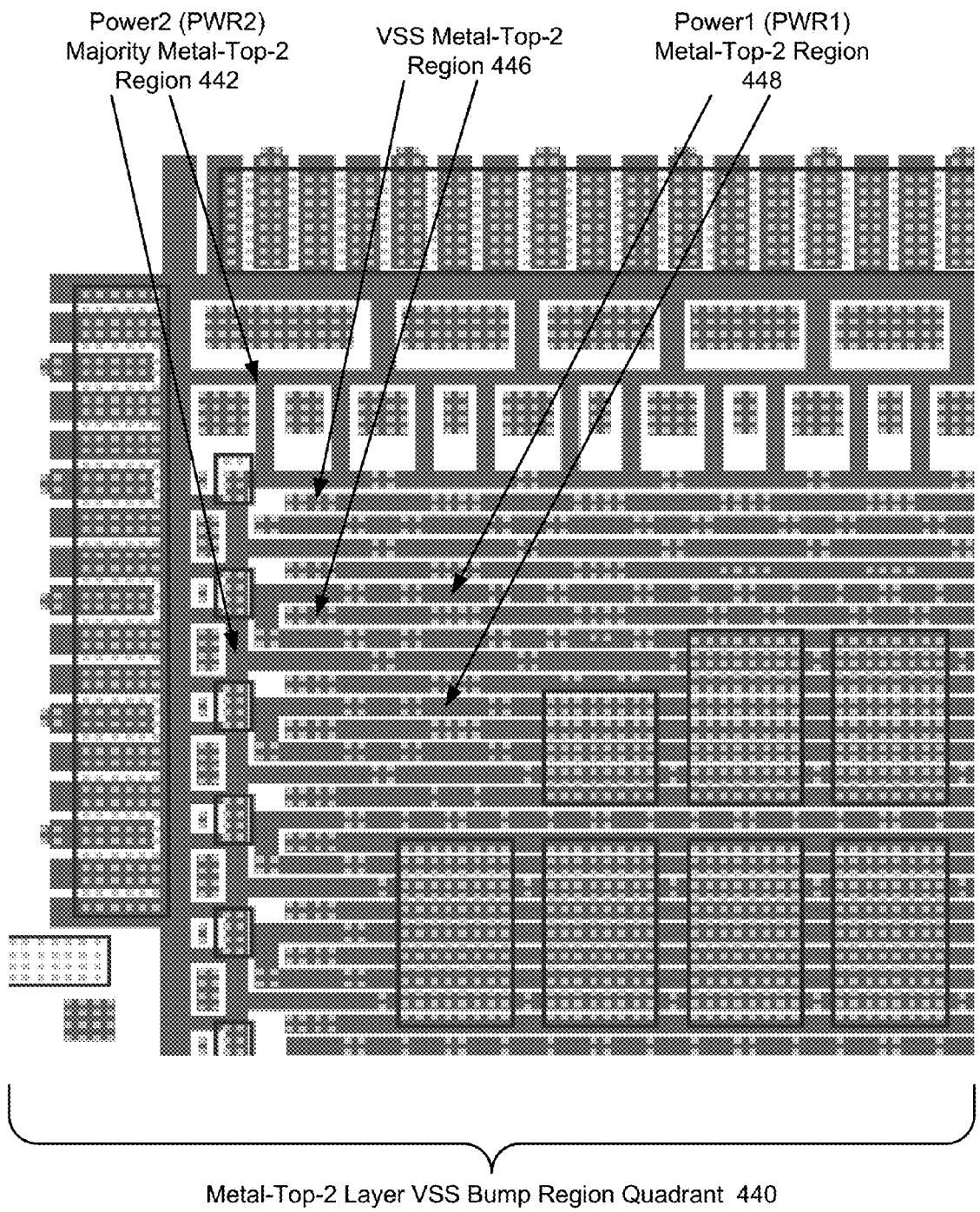
FIG. 4E shows a top view of a VSS bump region quadrant in a metal-top-2 layer in accordance with one or more embodiments of the invention.

FIG. 4E shows a top view of a VSS bump region quadrant (440) implemented in a metal-top-2 layer. In one or more embodiments of the invention, the metal-top-2 region shown in FIG. 4E is substantially directly beneath the metal-top-1 VSS bump region quadrant (432) shown in FIG. 4D.

In the embodiment shown in FIG. 4E, the PWR2 majority metal-top-2 region (442) is any portion of the metal-top-2 layer that is not electrically isolated, and thus receives the PWR2 signal, using VIAs, from an electrically isolated PWR2 metal-top-1 region, which, in turn, receives the PWR2 signal, using VIAs, from a PWR2 bump pad, such as the PWR2 bump pad (106) shown in FIG. 1 and discussed further below in the descriptions of FIGS. 5A-5E. The above-described distribution of the PWR2 signal in the metal-top-2 layer may make the metal-top-2 layer a PWR2 majority layer.

In one or more embodiments of the invention, the PWR1 metal-top-2 regions (448) shown in FIG. 4E are regions of the metal-top-2 layer that are electrically isolated from other regions of the metal-top-2 layer and which are used for distribution of the PWR1 signal, using top-2 VIAs, from an electrically isolated PWR1 metal-top-1 region. The electrically isolated PWR1 metal-top-1 region, in turn, receives the PWR1 signal, using top-1 VIAs, from a PWR1 bump pad of the metal-top layer. In one or more embodiments of the invention, such as that shown in FIG. 4E, the PWR1 metal-top-2 region includes functionality to distribute the PWR1 signal in the horizontal direction.

In one or more embodiments of the invention, the VSS metal-top-2 regions (446) shown in FIG. 4E are regions of the metal-top-2 layer that are electrically isolated from other regions of the metal-top-2 layer and which are used for distribution of the VSS signal from a VSS metal-top-1 region, which, in turn, receives the VSS signal, using VIAs, from a VSS bump pad of the metal-top layer. In one or more embodiments of the invention, such as that shown in FIG. 4E, the VSS metal-top-2 region includes functionality to distribute the VSS signal in the horizontal direction.

FIGS. 5A-5E collectively show a PWR2 region of the 3FDM in greater detail in accordance with one or more embodiments of the invention. As used herein, the term 'PWR2 region' may refer to the portion of the metal-top layer of the 3FDM enclosed by zipper channels and including a PWR2 bump pad (i.e., a PWR2 bump region), as well as any portion of the metal-top-1 layer and the metal-top-2 layer beneath the PWR2 bump region.

Figure 5A:
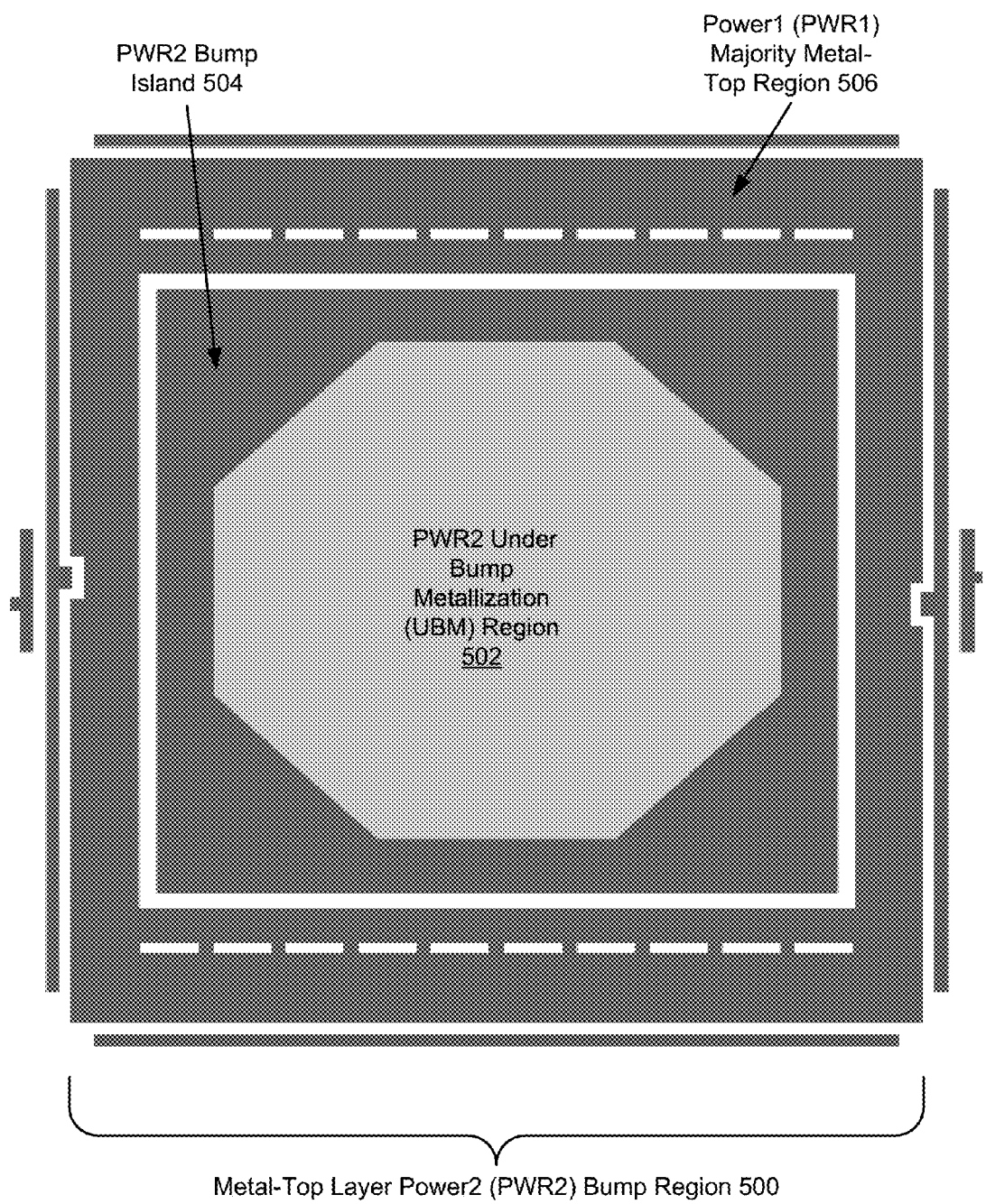
FIG. 5A shows a top view of a Power2 bump region in a metal-top layer in accordance with one or more embodiments of the invention.

FIG. 5A shows a top view of the full PWR2 bump region from the bump pad array (100) of the metal-top layer shown in FIG. 1. In the embodiment shown in FIG. 5A, the PWR2 bump region (500) includes a bump pad that includes a PWR2 UBM region (502). As described above, a UBM is a region of metallization that provides an electrical contact for receiving an electromagnetic signal within the bump region, such as the PWR2 signal received by the PWR2 bump pad. In one or more embodiments of the invention, as discussed above, the solid white line surrounding the PWR2 UBM region (502) is intended to show that the PWR2 UBM region, though formed from the metal-top layer and the UBM, is isolated from the remainder of the metal-top layer to allow the PWR2 signal to be provided to other metal layers of the 3FDM. The isolated region may be referred as the PWR2 bump island (504). In one or more embodiments of the invention, outside the PWR2 bump island (504) is a portion of a PWR1 majority metal-top region (506), throughout which the PWR1 signal is distributed.

FIG. 5B shows a PWR2 bump region cross section (508) of the 3FDM. As shown in FIG. 5B, the 3FDM includes a metal-top layer (510). In one or more embodiments of the invention, the metal-top layer is substantially similar to that discussed above in the description of FIG. 1 and FIG. 2A, each of which show a top view of the metal-top layer and features therein, and in FIGS. 2B, 3B, and 4B, each of which show a cross section of a different region of the 3FDM. In one or more embodiments of the invention, a metal-top-1 layer (512) is beneath the metal-top layer (510), and a metal-top-2 (514) layer is beneath the metal-top-1 layer. In one or more embodiments of the invention, the various metal layers may be separated by any material (e.g., a dielectric material, an insulating material, etc.) in any phase of matter, so long as the material does not create any substantial electrical connection between metal layers.

In one or more embodiments of the invention, as discussed above in the description of FIGS. 2B, 3B, and 4B, the metal-top layer is a PWR1 majority layer, the metal-top-1 layer is a VSS (e.g., ground) majority layer, and the metal-top-2 layer is a PWR2 majority layer.

The center section of FIG. 5B shows a portion of the PWR2 region of the 3FDM. As shown in FIG. 5B, a PWR2 UBM (518) is coupled to the metal-top layer (510) and provides an electrical contact for receiving the PWR2 signal. In one or more embodiments of the invention, beneath the PWR2 UBM (518) are VIAs (520, 524). As described above, a VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM.

In one or more embodiments of the invention, the top-1 VIAs (520) of the PWR2 region are disposed between the metal-top layer and the metal-top-1 layer and provide an electrical connection between the PWR1 majority metal-top layer and an electrically isolated PWR1 metal-top-1 region of the VSS majority metal-top-1 layer, as well as between the PWR2 bump pad and an electrically isolated PWR2 metal-top-1 region of the VSS majority metal-top-1 layer. In one or more embodiments of the invention, the PWR1 majority metal-top region (506) and PWR2 bump island (504) of FIG. 5A are electrically isolated from one another as shown in FIG. 5B by the PWR2 island boundaries (516) (shown in FIG. 5A as the solid white line surrounding the PWR2 UBM region (502)).

In one or more embodiments of the invention, the top-2 VIAs (524) of the PWR2 region are disposed between the metal-top-1 layer and the metal-top-2 layer and provide an electrical connection between: (i) the VSS majority metal-top-1 region and an electrically isolated VSS metal-top-2 region of the PWR2 majority metal-top-2 layer; (ii) the PWR2 majority metal-top-2 region and an electrically isolated PWR2 metal-top-1 region of the VSS majority metal-top-1 layer; and (iii) an electrically isolated PWR1 metal-top region of the VSS majority metal-top-1 layer and an electrically isolated PWR1 metal-top-2 region of the PWR2 majority metal-top-2 layer. Thus, in one or more embodiments of the invention, the VIAs allow each of the PWR1 signal, the VSS signal, and the PWR2 signal to be distributed from the metal-top layer of the 3FDM to each of the other metal layers of the 3FDM for distribution throughout at least a portion of a semiconductor device.

Figure 5C:
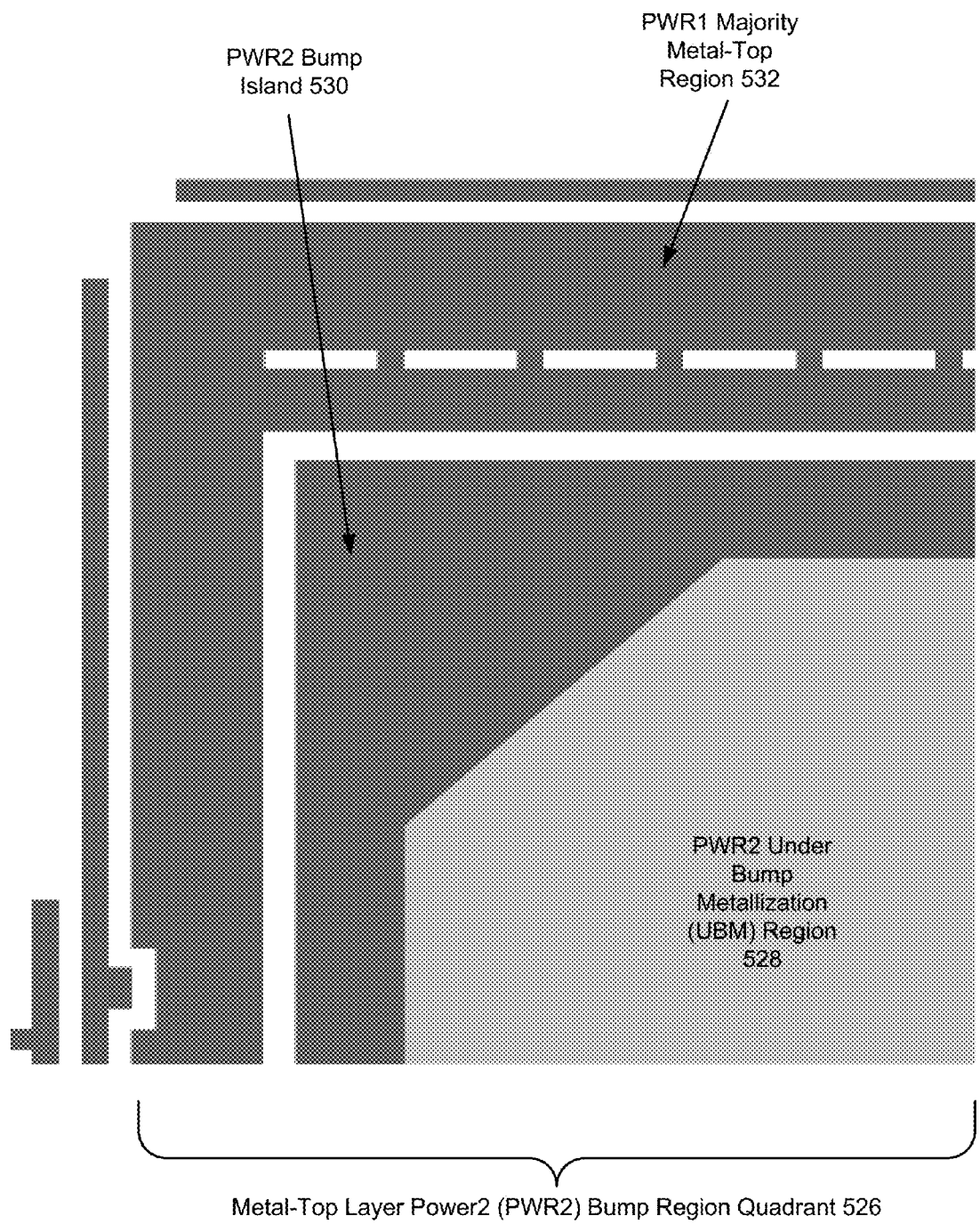
FIG. 5C shows a top view of a Power2 bump region quadrant in a metal-top layer in accordance with one or more embodiments of the invention.

FIG. 5C shows a closer top view of a PWR2 bump region of the 3FDM by way of showing the upper left metal-top layer PWR2 bump region quadrant (526). As shown in FIG. 5C, the solid white line enclosing the PWR2 UBM region (528) continues to indicate that the PWR2 signal is isolated in the PWR2 bump island (530) of the VSS bump region. Additionally, the PWR1 majority metal-top region (532) may be a portion of the remainder of the metal-top layer in which the PWR1 signal is distributed.

Figure 5D:
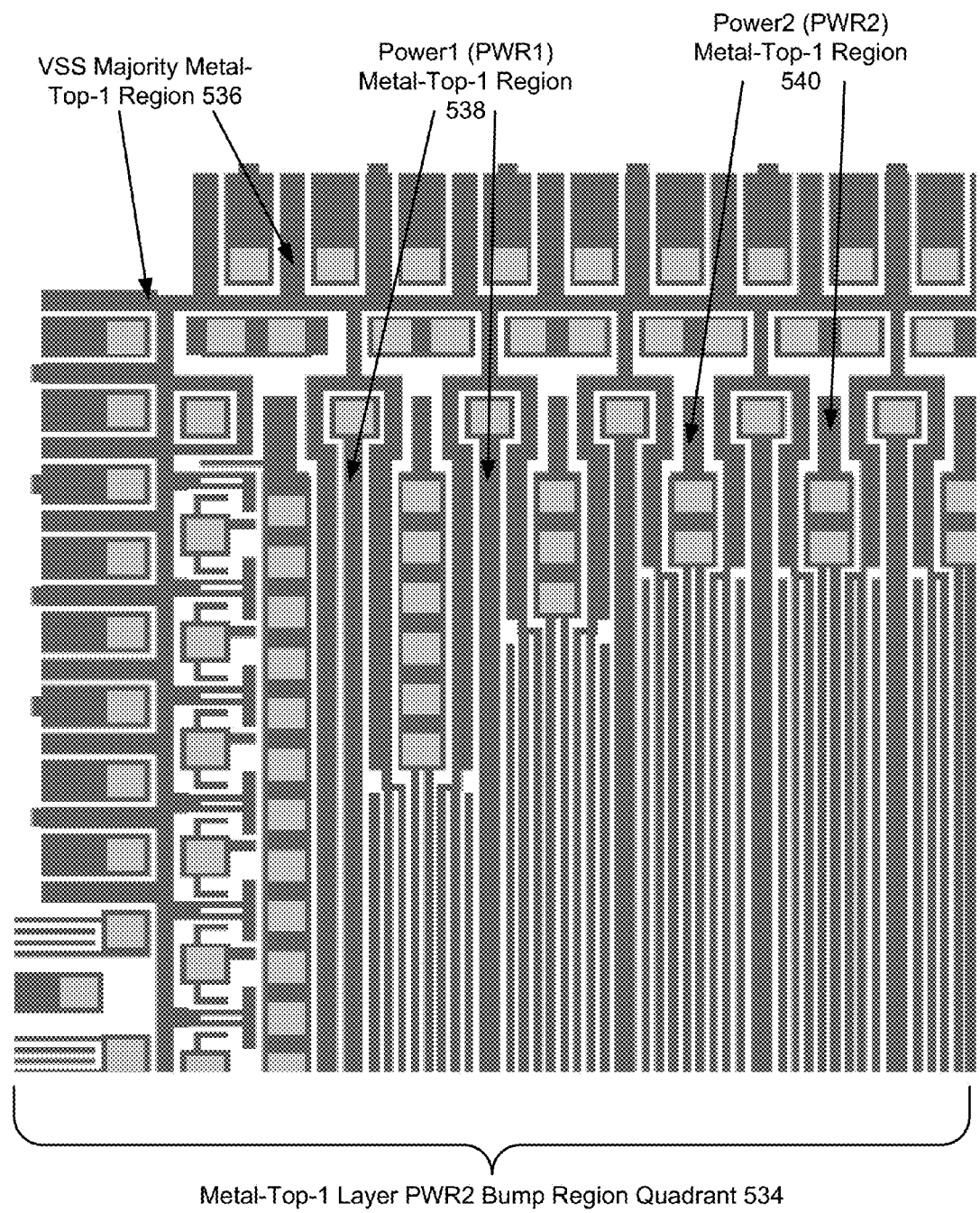
FIG. 5D shows a top view of a Power2 bump region quadrant in a metal-top-1 layer in accordance with one or more embodiments of the invention.

FIG. 5D shows a top view of the PWR2 bump region quadrant (534) implemented in the metal-top-1 layer. In one or more embodiments of the invention, the PWR2 bump region quadrant (534) shown in FIG. 5D is substantially directly beneath the PWR2 bump region quadrant (526) shown in FIG. 5C.

In the embodiment shown in FIG. 5D, the VSS majority metal-top-1 region (536) is any portion of the metal-top-1 layer that is not electrically isolated, and thus receives the VSS signal, using top-1 VIAs, from a VSS bump pad's VSS UBM region (e.g., 426 of FIG. 4C). The above-described distribution of the VSS signal in the metal-top-1 layer may make the metal-top-1 layer a VSS majority layer.

In one or more embodiments of the invention, the PWR1 metal-top-1 regions (538) shown in FIG. 5D are regions of the metal-top-1 layer that are electrically isolated from other regions of the metal-top-1 layer and which are used for distribution of the PWR1 signal, using VIAs, from a PWR1 bump pad (e.g., the PWR1 bump pad shown in FIG. 3A) to the PWR1 metal-top-1 region (538). In one or more embodiments of the invention, such as that shown in FIG. 5D, the PWR1 metal-top-1 region (338) includes functionality to distribute the PWR1 signal in the vertical direction.

In one or more embodiments of the invention, the PWR2 metal-top-1 regions (540) shown in FIG. 5D are regions of the metal-top-1 layer that are electrically isolated from other regions of the metal-top-1 layer and which are used for distribution of the PWR2 signal, using VIAs, from a PWR2 bump pad of the metal top layer to the PWR2 metal-top-1 region. In one or more embodiments of the invention, such as that shown in FIG. 5D, the PWR2 metal-top-1 region includes functionality to distribute the PWR2 signal in the vertical direction.

Figure 5E:
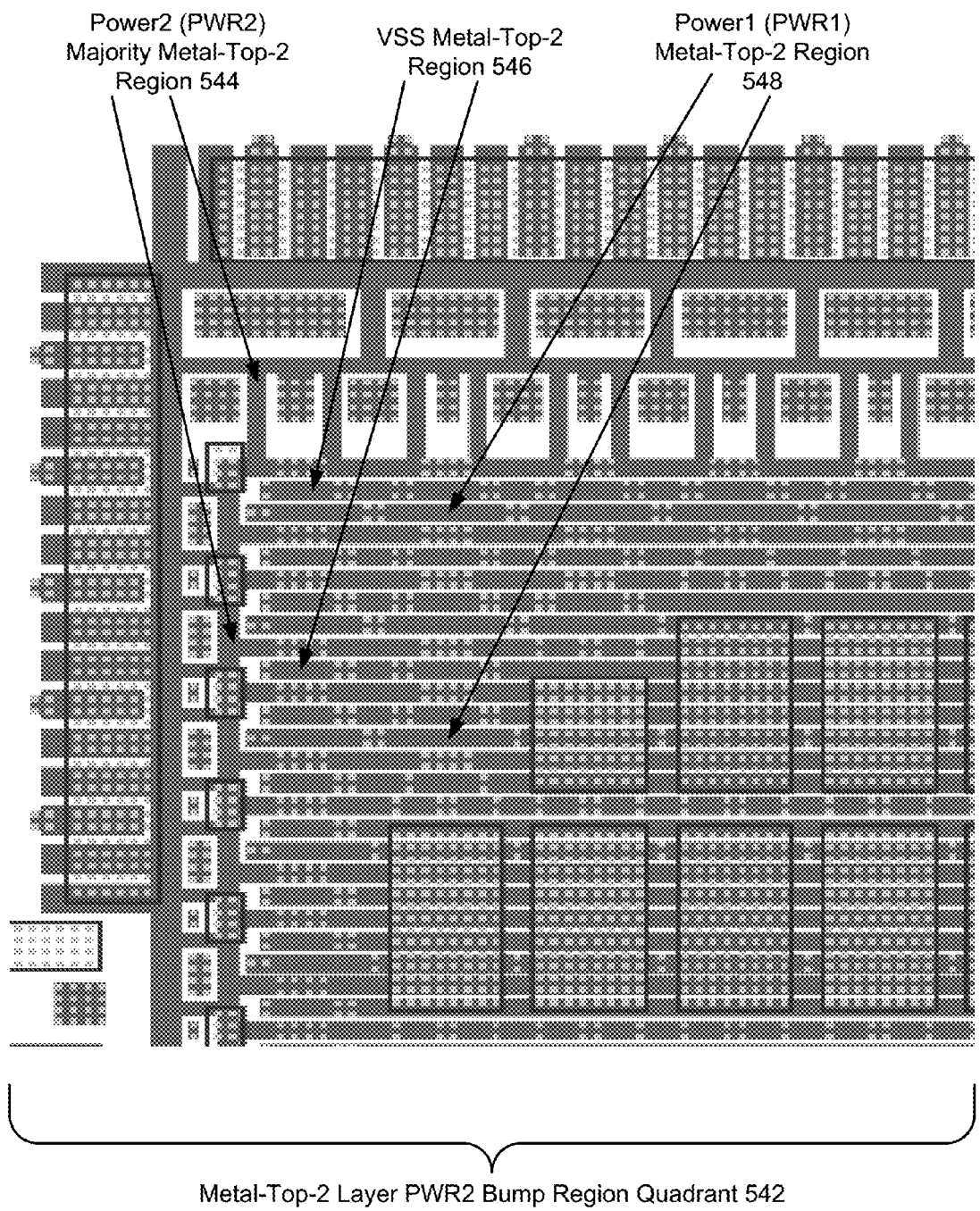
FIG. 5E shows a top view of a Power2 bump region quadrant in a metal-top-2 layer in accordance with one or more embodiments of the invention.

FIG. 5E shows a top view of a PWR2 bump region quadrant (542) implemented in a metal-top-2 layer. In one or more embodiments of the invention, the PWR2 bump region quadrant (542) shown in FIG. 5E is substantially directly beneath the PWR2 bump region quadrant (534) shown in FIG. 5D. In the embodiment shown in FIG. 5E, the PWR2 majority metal-top-2 region (544) is any portion of the metal-top-2 layer that is not electrically isolated, and thus receives the PWR2 signal. The above-described distribution of the PWR2 signal in the metal-top-2 layer may make the metal-top-2 layer a PWR2 majority layer.

In one or more embodiments of the invention, the PWR1 metal-top-2 regions (548) shown in FIG. 5E are regions of the metal-top-2 layer that are electrically isolated from other regions of the metal-top-2 layer and which are used for distribution of the PWR1 signal, using top-2 VIAs, from an electrically isolated PWR1 metal-top-1 region of the VSS majority metal-top-1 layer. The electrically isolated PWR1 metal-top-1 region of the VSS majority metal-top-1 layer, in turn, receives the PWR1 signal, using top-1 VIAs, from a PWR1 bump pad of the metal-top layer. In one or more embodiments of the invention, such as that shown in FIG. 5E, the PWR1 metal-top-2 region includes functionality to distribute the PWR1 signal in the horizontal direction.

In one or more embodiments of the invention, the VSS metal-top-2 regions (546) shown in FIG. 5E are regions of the metal-top-2 layer that are electrically isolated from other regions of the metal-top-2 layer and which are used for distribution of the VSS signal from a VSS metal-top-1 region of the metal-top-1 layer, which, in turn, receives the VSS signal, using VIAs, from a VSS bump pad of the metal-top layer. In one or more embodiments of the invention, such as that shown in FIG. 5E, the VSS metal-top-2 region (546) includes functionality to distribute the VSS signal in the horizontal direction.

FIGS. 6A-6E collectively show an other signal region of the 3FDM in greater detail in accordance with one or more embodiments of the invention. As used herein, the term 'other signal region' may refer to the portion of the metal-top layer of the 3FDM enclosed by zipper channels and including an other signal bump pad (i.e., an other signal bump region), as well as any portion of the metal-top-1 layer and the metal-top-2 layer beneath the other signal bump region.

Figure 6A:
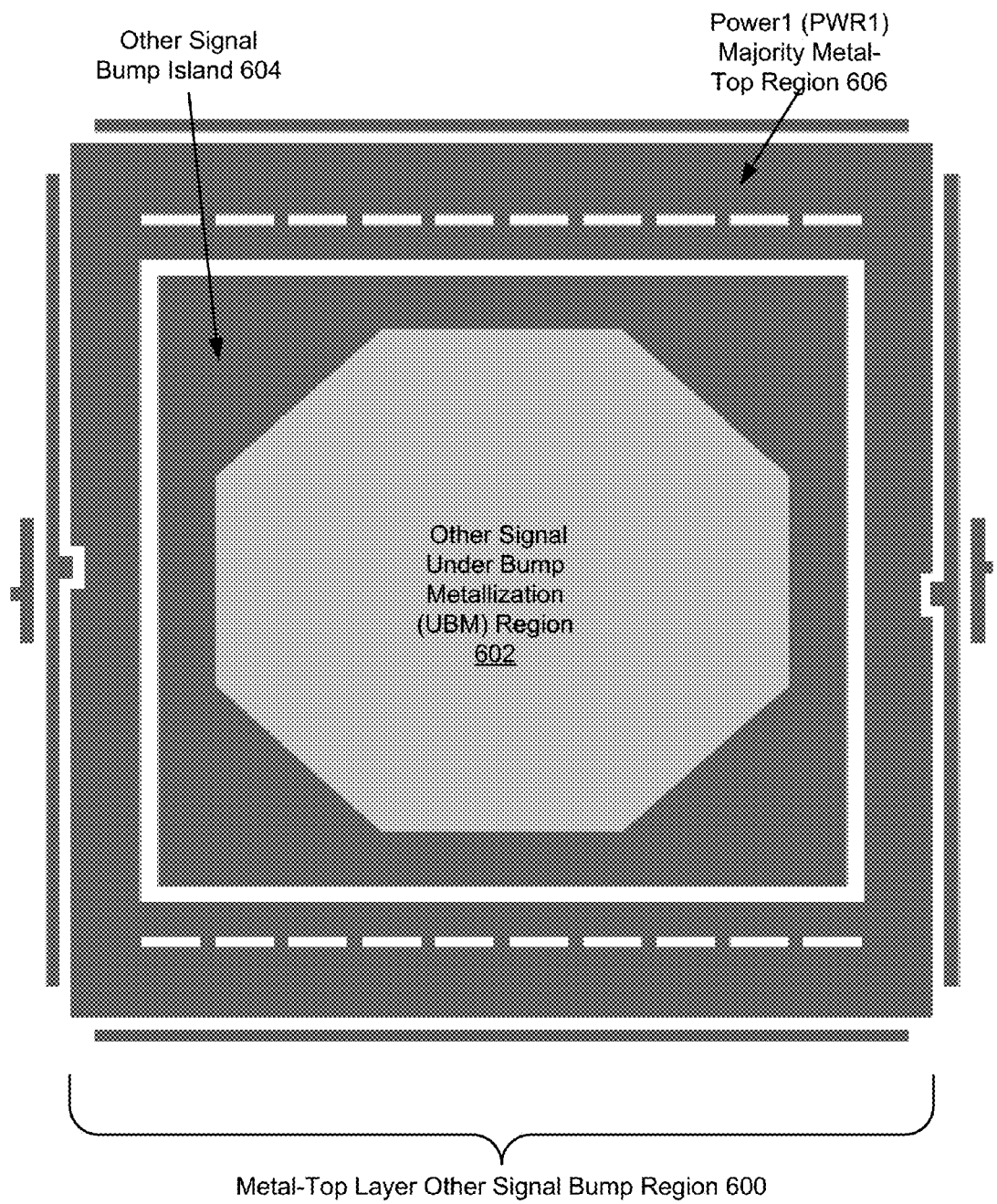
FIG. 6A shows a top view of an other signal bump region in a metal-top layer in accordance with one or more embodiments of the invention.

FIG. 6A shows a top view of the full other signal bump region from the bump pad array (100) of the metal-top layer shown in FIG. 1. As shown in FIG. 6A, the other signal bump region (600) of the metal-top layer includes an other signal bump pad that is substantially similar to the other signal bump pad (108) discussed above in the description of FIG. 1. In the embodiment shown in FIG. 6A, the bump region includes a bump pad that includes an other signal UBM region (602). As described above, a UBM is a region of metallization that provides an electrical contact for receiving an electromagnetic signal within the bump region, such as an other signal received by the other signal bump pad.

In one or more embodiments of the invention, as discussed above, the solid white line surrounding the other signal UBM region (602) is intended to show that the other signal UBM region, though formed from the metal-top layer and the UBM, is isolated from the remainder of the other signal bump region to allow the received other signal to be provided to other layers of the 3FDM. In one or more embodiments of the invention, the isolated region may be referred to as the other signal bump island (604). In one or more embodiments of the invention, outside the other signal bump island (604) is a portion of the PWR1 majority metal-top region (606), throughout which the PWR1 signal is distributed.

Figure 6B:
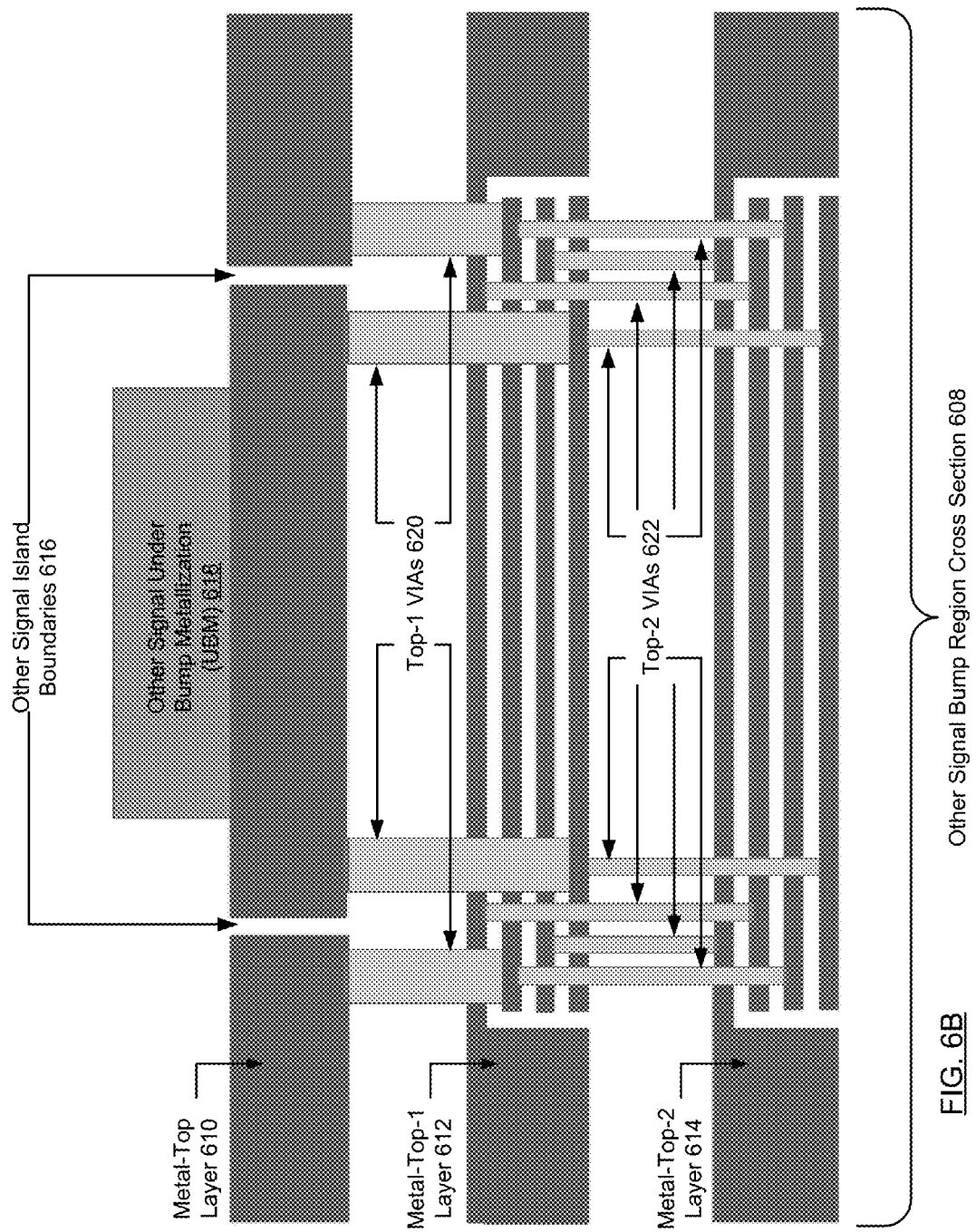
FIG. 6B shows a cross sectional view of an other signal bump region in accordance with one or more embodiments of the invention.

FIG. 6B shows an other signal bump region cross section (608) of the 3FDM. As shown in FIG. 6B, the 3FDM includes a metal-top layer (610). In one or more embodiments of the invention, the metal-top layer is substantially similar to that discussed above in the description of FIG. 1 and FIG. 2A, each of which show a top view of the metal-top layer and features therein, and in FIGS. 2B, 3B, 4B, and 5B, each of which show a cross section of a different region of the 3FDM. In one or more embodiments of the invention, a metal-top-1 layer (612) is beneath the metal-top layer (610), and a metal-top-2 (614) layer is beneath the metal-top-1 layer. In one or more embodiments of the invention, the various metal layers may be separated by any material (e.g., a dielectric material, an insulating material, etc.) in any phase of matter, so long as the material does not create any substantial electrical connection between metal layers.

In one or more embodiments of the invention, as discussed above in the description of FIGS. 2B, 3B, 4B, and 5B, the metal-top layer is a PWR1 majority layer, the metal-top-1 layer is a VSS (e.g., ground) majority layer, and the metal-top-2 layer is a PWR2 majority layer.

The center section of FIG. 6B shows a portion of the other signal region of the 3FDM. As shown in FIG. 6B, an other signal UBM (618) is coupled to the metal-top layer (610) and provides an electrical contact for receiving an other signal. In one or more embodiments of the invention, beneath the other signal UBM (618) are VIAs (620, 622). As described above, a VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM.

In one or more embodiments of the invention, the top-1 VIAs (620) of the other signal region are disposed between the metal-top layer and the metal-top-1 layer and provide an electrical connection between the PWR1 majority metal-top region and an electrically isolated PWR1 metal-top-1 region of the VSS majority metal-top-1 layer, as well as from the other signal bump pad to an electrically isolated other signal metal-top-1 region of the VSS majority metal-top-1 layer. In one or more embodiments of the invention, the PWR1 majority metal-top region (606) and other signal bump island (604) of FIG. 6A are electrically isolated from one another as shown in FIG. 6B by the other signal island boundaries (616) (shown in FIG. 6A as the solid white line surrounding the other signal UBM region (602)).

In one or more embodiments of the invention, the top-2 VIAs (622) of the other signal region are disposed between the metal-top-1 layer and the metal-top-2 layer and provide an electrical connection between, at least: (i) the VSS majority metal-top-1 region and an electrically isolated VSS metal-top-2 region of the PWR2 majority metal-top-2 layer; (ii) the PWR2 majority metal-top-2 region and an electrically isolated PWR2 metal-top-1 region of the metal-top-1 layer; (iii) an electrically isolated PWR1 metal-top-1 region of the VSS majority metal-top-1 layer and an electrically isolated PWR1 region of the PWR2 majority metal-top-2 layer; and (iv) an electrically isolated other signal metal-top-1 region of the VSS majority metal-top-1 layer and an electrically isolated other signal metal-top-2 region of the PWR2 majority metal-top-2 layer. Thus, in one or more embodiments of the invention, the VIAs allow each of the PWR1 signal, the VSS signal, and the PWR2 signal to be distributed from the metal-top layer of the 3FDM to each of the other metal layers of the 3FDM for distribution throughout at least a portion of a semiconductor device.

Figure 6C:
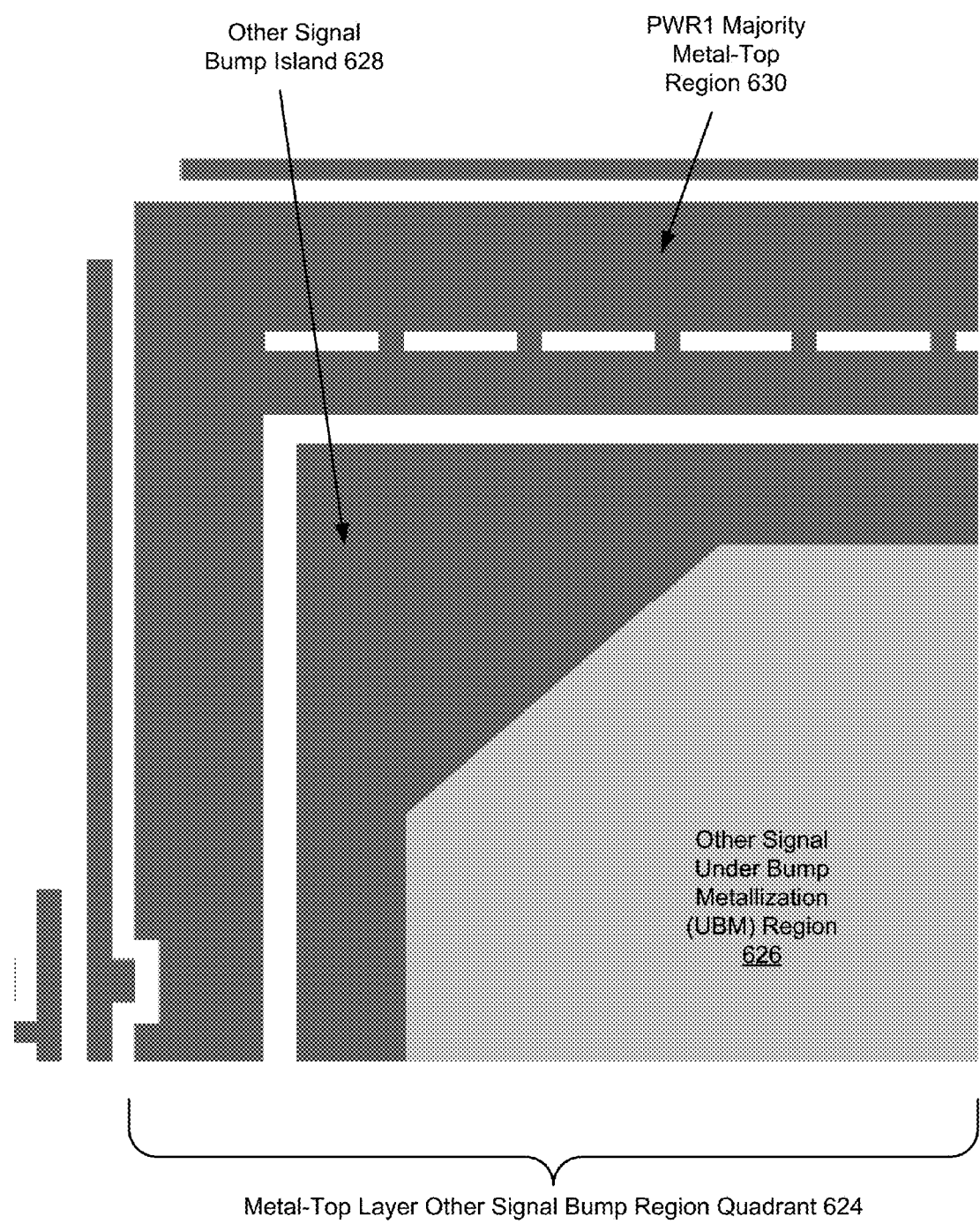
FIG. 6C shows a top view of an other signal bump region quadrant in a metal-top layer in accordance with one or more embodiments of the invention.

FIG. 6C shows a closer top view of an other signal bump region of the 3FDM by way of showing the upper left metal-top layer other signal bump region quadrant (624). As shown in FIG. 6C, the solid white line enclosing the other signal UBM region (626) continues to indicate that the other signal is isolated in the other signal bump island (628) of the other signal bump region. Additionally, the other signal bump region includes a portion of the PWR1 majority metal-top region (630), and an other signal UBM region (626) within the other signal bump island (628).

FIG. 6D shows a view of the other signal bump region quadrant (632) implemented in the metal-top-1 layer. In one or more embodiments of the invention, the other signal bump region quadrant (632) shown in FIG. 6D is substantially directly beneath the other signal bump region quadrant (624) shown in FIG. 6C.

In the embodiment shown in FIG. 6D, the VSS majority metal-top-1 region (634) is any portion of the metal-top-1 layer that is not electrically isolated, and thus receives the VSS signal, using top-1 VIAs, from a VSS bump pad's VSS UBM region (e.g., 426 of FIG. 4C). The above-described distribution of the VSS signal in the metal-top-1 layer may make the metal-top-1 layer a VSS majority layer.

In one or more embodiments of the invention, the PWR1 metal-top-1 regions (636) shown in FIG. 6D are regions of the metal-top-1 layer that are electrically isolated from other regions of the metal-top-1 layer and which are used for distribution of the PWR1 signal from a PWR1 bump pad to one or more regions of the metal-top-1 layer. In one or more embodiments of the invention, such as that shown in FIG. 6D, the PWR1 metal-top-1 region (636) includes functionality to distribute the PWR1 signal in the vertical direction.

In one or more embodiments of the invention, the PWR2 metal-top-1 regions (638) shown in FIG. 6D are regions of the metal-top-1 layer that are electrically isolated from other regions of the metal-top-1 layer and which are used for distribution of the PWR2 signal from a PWR2 bump pad of the metal top layer to one or more regions of the metal-top-1 layer. In one or more embodiments of the invention, such as that shown in FIG. 6D, the PWR2 region includes functionality to distribute the PWR2 signal in the vertical direction.

Similarly, in one or more embodiments of the invention, the other signal metal-top-1 regions (640) shown in FIG. 6D are regions of the metal-top-1 layer that are electrically isolated from other regions of the metal-top-1 layer and which are used for distribution of the other signal from an other signal bump pad of the metal top layer to one or more regions of the metal-top-1 layer. In one or more embodiments of the invention, such as that shown in FIG. 6D, the other signal region of the metal-top-1 layer includes functionality to distribute the other signal in the vertical direction.

Figure 6E:
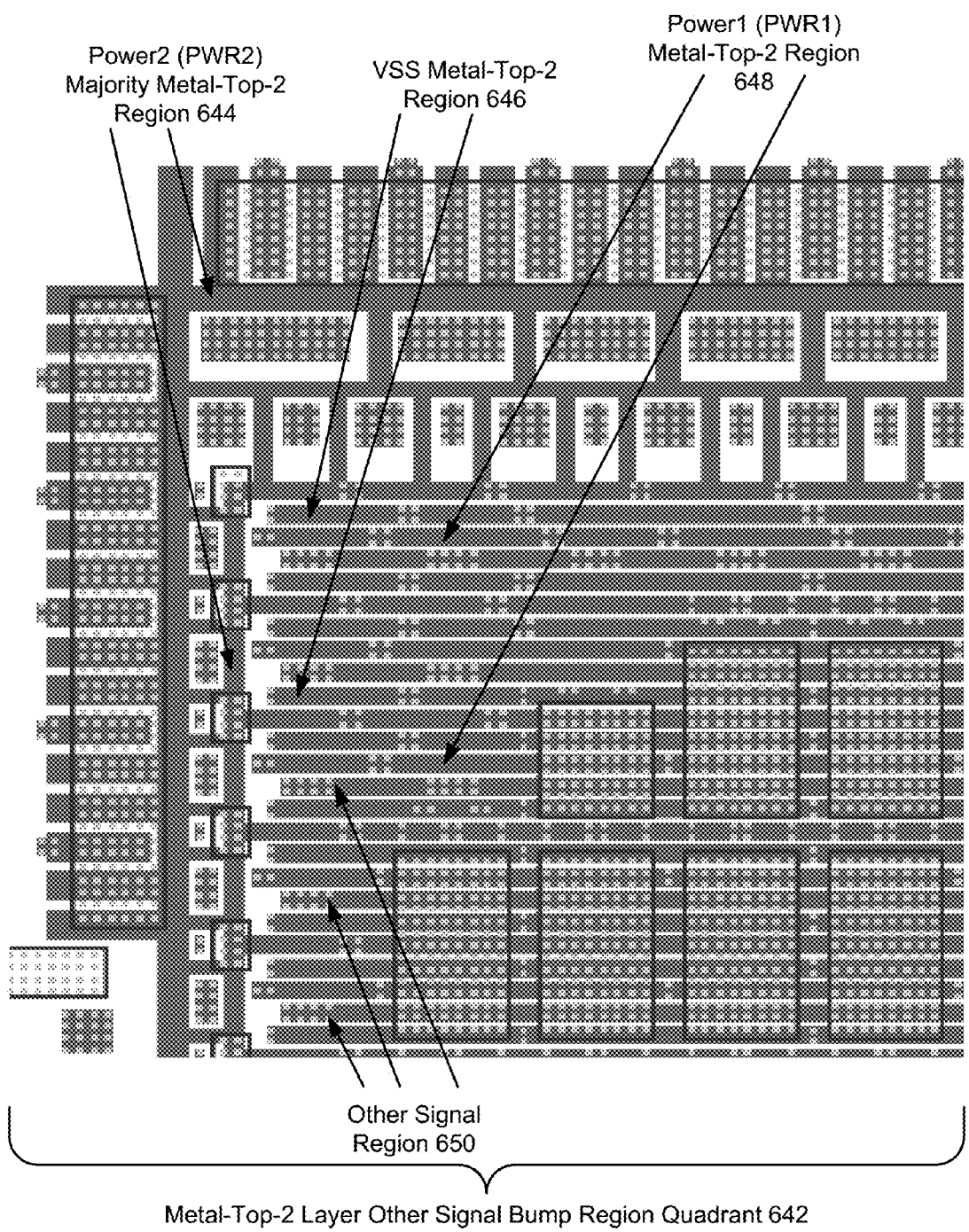
FIG. 6E shows a top view of an other signal bump region quadrant in a metal-top-2 layer in accordance with one or more embodiments of the invention.

FIG. 6E shows a top view of an other signal bump region quadrant (642) implemented in a metal-top-2 layer. In one or more embodiments of the invention, the other signal bump region quadrant (642) shown in FIG. 6E is substantially directly beneath the other signal bump region quadrant (632) shown in FIG. 6D.

In the embodiment shown in FIG. 6E, the PWR2 majority metal-top-2 region (644) is any portion of the metal-top-2 layer that is not electrically isolated, and thus receives the PWR2 signal, using VIAs, from an electrically isolated PWR2 metal-top-1 region, which, in turn, receives the PWR2 signal, using VIAs, from a PWR2 bump pad, such as the PWR2 bump pad (106) shown in FIG. 1. The above-described distribution of the PWR2 signal in the metal-top-2 layer may make the metal-top-2 layer a PWR2 majority layer.

In one or more embodiments of the invention, the PWR1 metal-top-2 regions (648) shown in FIG. 6E are regions of the metal-top-2 layer that are electrically isolated from other regions of the metal-top-2 layer and which are used for distribution of the PWR1 signal, using top-2 VIAs, from an electrically isolated PWR1 metal-top-1 region. The electrically isolated PWR1 metal-top-1 region may, in turn, receive the PWR1 signal, using top-1 VIAs, from a PWR1 bump pad of the metal-top layer. In one or more embodiments of the invention, such as that shown in FIG. 6E, the PWR1 metal-top-2 region includes functionality to distribute the PWR1 signal in the horizontal direction.

In one or more embodiments of the invention, the VSS metal-top-2 regions (646) shown in FIG. 6E are regions of the metal-top-2 layer that are electrically isolated from other regions of the metal-top-2 layer and which are used for distribution of the VSS signal from a VSS metal-top-1 region, which, in turn, receives the VSS signal, using VIAs, from a VSS bump pad of the metal-top layer. In one or more embodiments of the invention, such as that shown in FIG. 6E, the VSS metal-top-2 region (646) includes functionality to distribute the VSS signal in the horizontal direction.

In one or more embodiments of the invention, such as the embodiment shown in FIG. 6E, the other signal metal-top-2 regions (650) are regions of the metal-top-2 layer that are electrically isolated from other regions of the metal-top-2 layer and which are used for distribution of the other signal from an electrically isolated other signal metal-top-1 region, which, in turn, receives the other signal, using top-1 VIAs, from an other signal bump pad of the metal-top layer.

FIGS. 7A-7H collectively show the placement of decoupling capacitors (e.g., metal-insulator-metal capacitors (MIMCaps)) within the 3FDM in accordance with one or more embodiments of the invention.

A capacitor is formed from two conductive elements separated by a dielectric material, and stores charge in an electric field between the conductive elements. In one or more embodiments of the invention, a MIMCap is a capacitor that includes two separate metal components separated by dielectric material (i.e., the 'insulator' in metal-insulator-metal). In one or more embodiments of the invention, MIMCaps are disposed within the 3FDM structure between the metal layers to provide decoupling. Said another way, the MIMCaps may function as decoupling capacitors. In one or more embodiments of the invention, each MIMCap of the 3FDM includes a capacitor top metal (CTM) element and capacitor bottom metal (CBM) element which serve as the two conductive elements of the MIMCap.

Figure 7A:
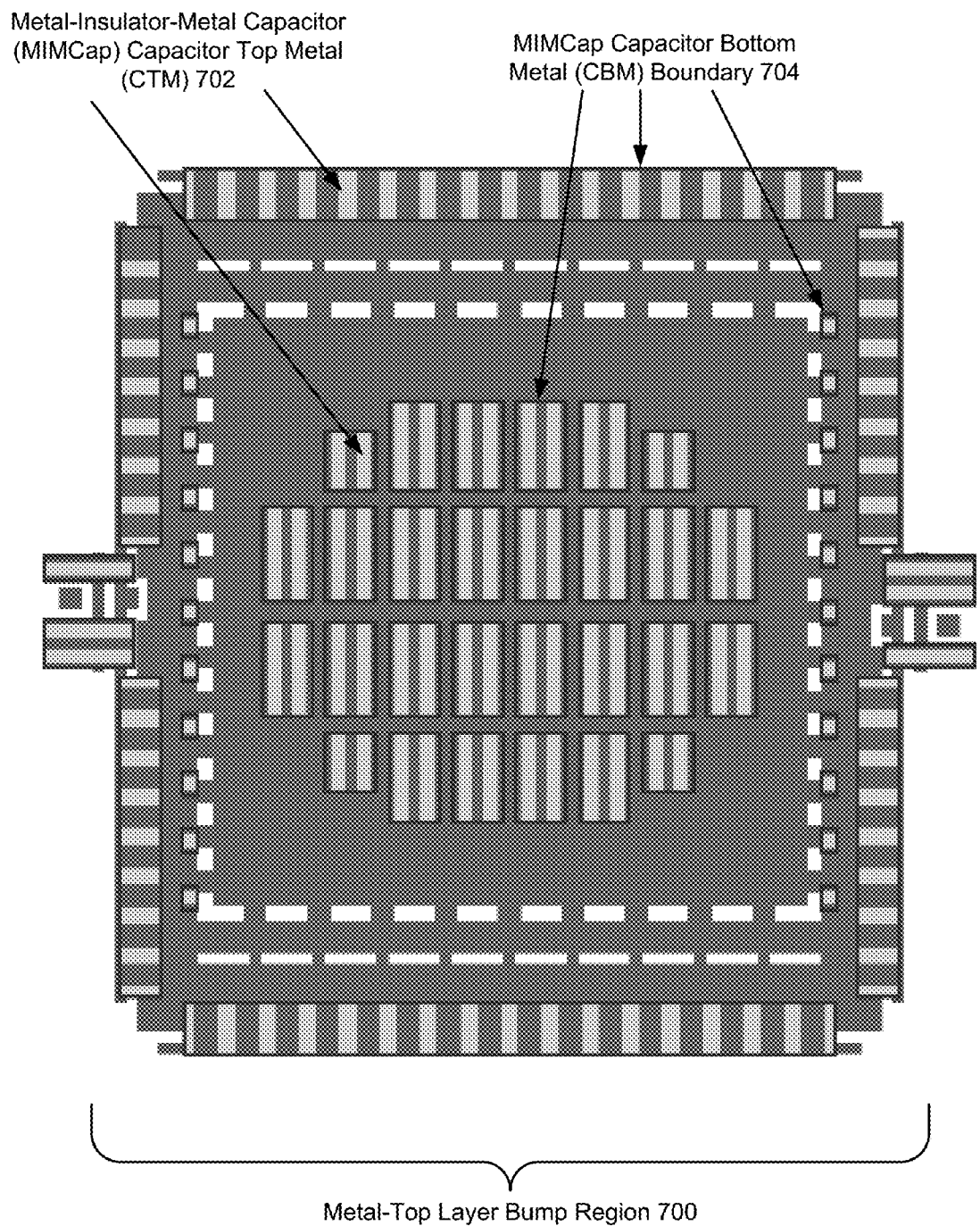
FIG. 7A shows a top view of a metal-insulator-metal capacitor within a bump region in accordance with one or more embodiments of the invention.

Turning to FIG. 7A, FIG. 7A shows a top view of an exemplary bump region (700) of a metal-top later of a 3FDM. In one or more embodiments of the invention, any of the above-described bump regions (i.e., PWR1, PWR2, VSS, and other signal) may have an arrangement of MIMCaps formed between two metal layers of the bump region. Accordingly, FIG. 7A is not intended to show the MIMCaps, but is instead intended to show the placement of the MIMCaps that are beneath at least the metal-top layer. The representative MIMCap CTMs (702) shown in FIG. 7A are located substantially directly beneath the bump pad and UBM of the bump region, substantially beneath the edges of the bump island of the bump region, and substantially beneath the zipper channel region enclosing the bump region. In one or more embodiments of the invention, the MIMCap CBM boundaries (704) of FIG. 7A show the boundaries of MIMCap CBMs that are located substantially directly beneath the MIMCap CTMs.

Figure 7B:
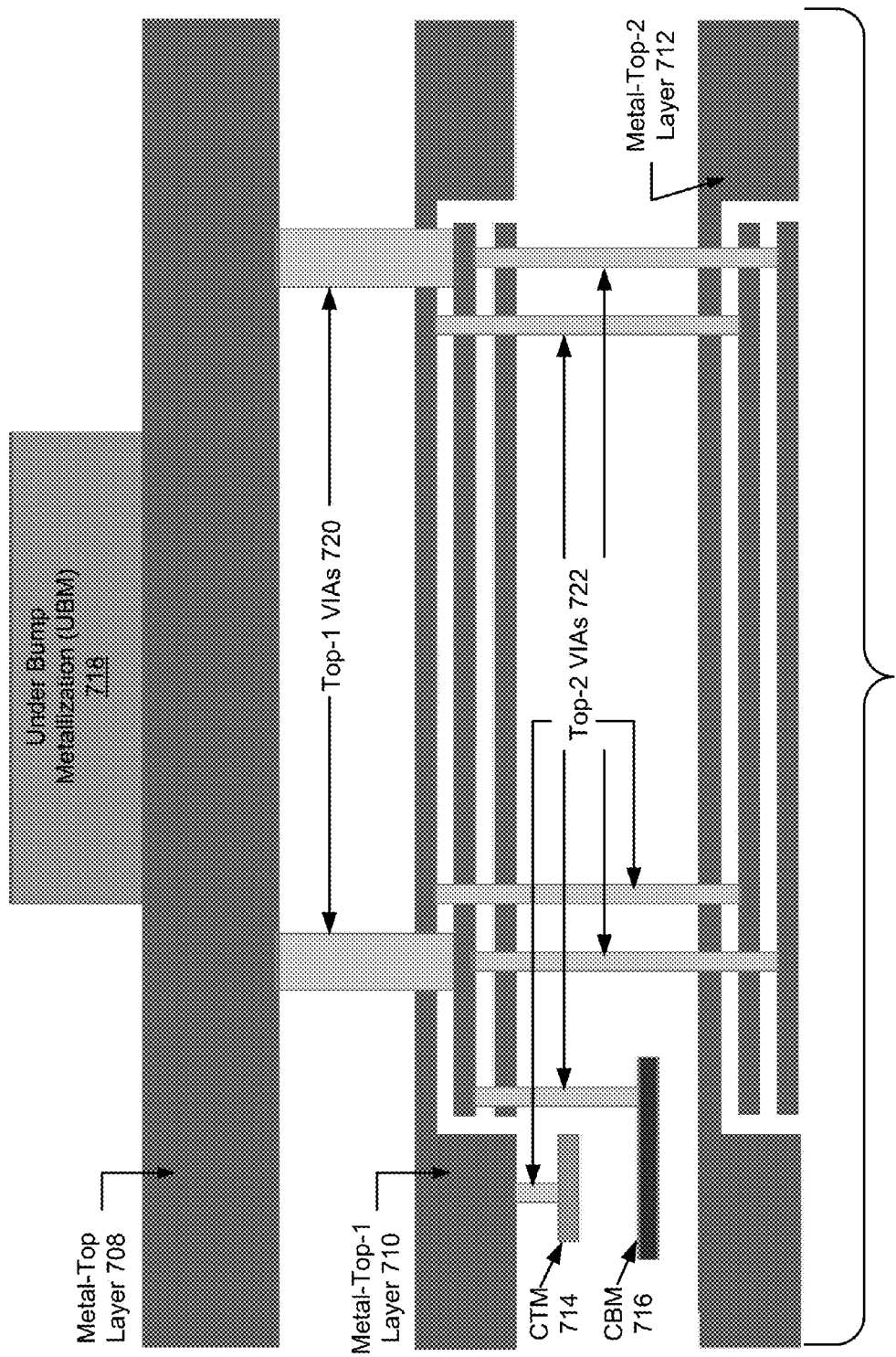
FIG. 7B shows a cross sectional view of metal-insulator-metal capacitor placement within a full dense mesh structure in accordance with one or more embodiments of the invention.

FIG. 7B shows a cross-sectional view of MIMCap placement within a representative bump region cross section (706) of the 3FDM. As shown in FIG. 7B, the 3FDM includes a metal-top layer (708). In one or more embodiments of the invention, the metal-top layer is substantially similar to that discussed above in the description of FIG. 1 and FIG. 2A, each of which show a top view of the metal-top layer and features therein, and in FIGS. 2B, 3B, 4B, 5B, and 6B, each of which show a cross section of a different region of the 3FDM. In one or more embodiments of the invention, beneath the metal-top layer (708) is a metal-top-1 layer (710), and beneath the metal-top-1 layer is a metal-top-2 layer (712). In one or more embodiments of the invention, the various metal layers may be separated by any material (e.g., a dielectric material, an insulating material, etc.) in any phase of matter, so long as the material does not create any substantial electrical connection between metal layers.

In one or more embodiments of the invention, as discussed above in the description of FIGS. 2B, 3B, 4B, 5B, and 6B, the metal-top layer is a PWR1 majority layer, the metal-top-1 layer is a VSS (e.g., ground) majority layer, and the metal-top-2 layer is a PWR2 majority layer.

The center section of FIG. 7B shows a portion of the representative bump region of the 3FDM. As shown in FIG. 7B, a UBM (718) is coupled to the metal-top layer (708) and provides an electrical contact for receiving a signal (e.g., PWR1, VSS, PWR2, any other signal). In one or more embodiments of the invention, beneath the UBM (718) are VIAs (720, 722). As described above, a VIA is a structure within the 3FDM that may be configured to provide an electrical connection between two metal layers of the 3FDM, between a metal layer and a zipper structure of the 3FDM, or between a metal layer and a portion of a decoupling capacitor of the 3FDM. In the embodiment of the invention shown in FIG. 7B, a portion of the VIAs are configured to provide an electrical connection between a CTM element of a MIMCap and a region of the metal-top-1 layer, as well as between a CBM element of a MIMCap and a region of the metal-top-1 layer.

In one or more embodiments of the invention, the top-1 VIAs (720) are disposed between the metal-top layer and the metal-top-1 layer and provide an electrical connection between the PWR1 majority metal-top layer and an electrically isolated PWR1 metal-top-1 region of the VSS majority metal-top-1 layer, as well as from the other signal bump pad to an electrically isolated other signal region of the VSS majority metal-top-1 layer.

In one or more embodiments of the invention, the top-2 VIAs (722) are disposed between the metal-top-1 layer and the metal-top-2 layer and provide an electrical connection between one or more of the following: (i) the VSS majority metal-top-1 layer and an electrically isolated VSS metal-top-2 region of the PWR2 majority metal-top-2 layer; (ii) the PWR2 majority metal-top-2 layer and an electrically isolated PWR2 metal-top-1 region of the metal-top-1 layer; (iii) an electrically isolated PWR1 metal-top-1 region of the VSS majority metal-top-1 layer and an electrically isolated PWR1 region of the PWR2 majority metal-top-2 layer; (iv) an electrically isolated other signal metal-top-1 region of the VSS majority metal-top-1 layer and an electrically isolated other signal metal-top-2 region of the PWR2 majority metal-top-2 layer; (v) a VSS majority metal-top-1 region and a CTM of a MIMCap; and (vi) the CBM of a MIMCap and either an electrically isolated PWR1 region or electrically isolated PWR2 region of the metal-top-1 layer. Thus, in one or more embodiments of the invention, the VIAs allow each of the PWR1 signal, the VSS signal, and the PWR2 signal to be distributed from the metal-top layer of the 3FDM to each of the other metal layers of the 3FDM for distribution throughout at least a portion of a semiconductor device, as well as provide electrical connection between the CTMs and CBMs of MIMCaps and regions of the metal-top-1 layer in order to provide decoupling.

In one or more embodiments of the invention, the MIMCaps are disposed between the metal-top-1 and metal-top-2 layers, shown in FIG. 7B as CTM (714) and CBM (716), which may be separated by a dielectric material (not shown) to form a MIMCap. Although FIG. 7B shows only one MIMCap for the sake of clarity, in one or more embodiments of the invention, any number of MIMCaps may be disposed between the metal-top-1 layer and the metal-top-2 layer of the 3FDM.

Figure 7C:
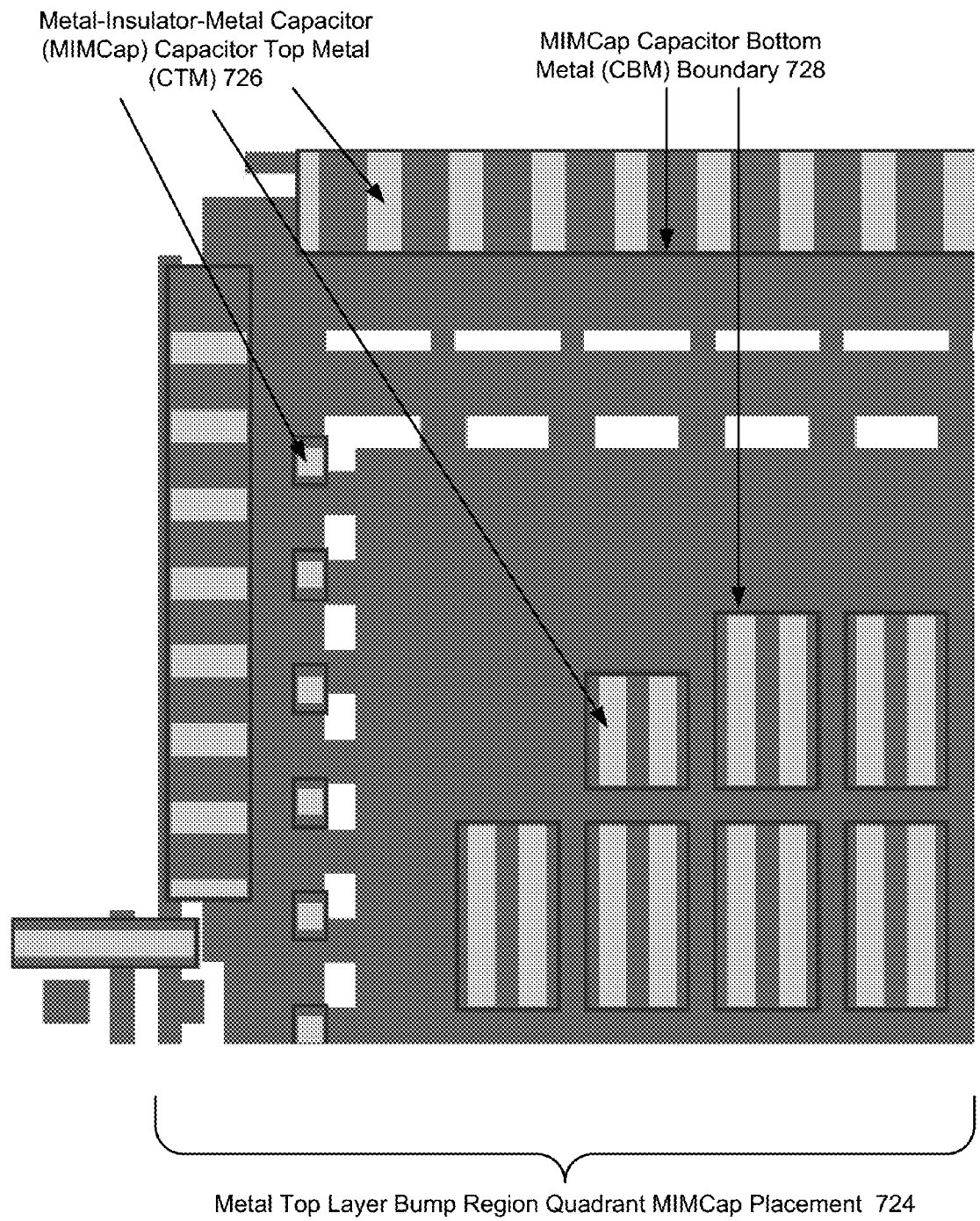
FIG. 7C shows a top view of a metal-insulator-metal capacitor within a bump region quadrant in accordance with one or more embodiments of the invention.

FIG. 7C shows a closer top view of the representative bump region of the 3FDM by way of showing the upper left metal-top layer bump region quadrant MIMCap placement (724). Similar to the MIMCap placement shown in FIG. 7A, the MIMCap CBM boundaries (728) show that the MIMCap CBMs are substantially directly beneath the MIMCap CTMs (726), and that both the MIMCap CTMs and MIMCap CBMs are located beneath the metal-top layer. In one or more embodiments of the invention, MIMCaps are placed beneath the UBM of the bump region, beneath the edge of the bump island, and beneath the zipper channels enclosing the bump region.

Figure 7D:
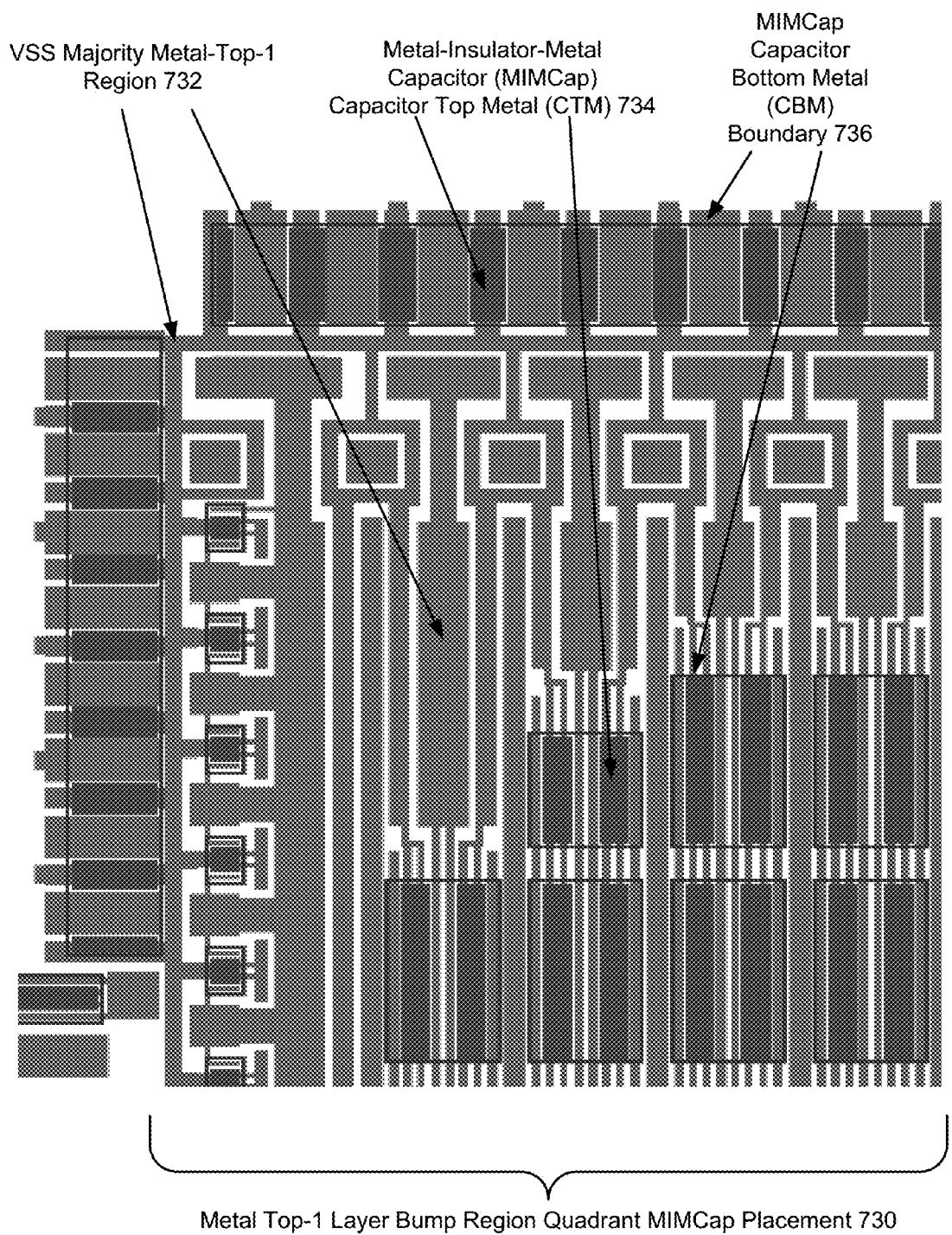
FIG. 7D shows a top view of a metal-insulator-metal capacitor within a bump region quadrant in accordance with one or more embodiments of the invention.

FIG. 7D shows a closer top view of the representative bump region of the 3FDM by way of showing the upper left metal-top-1 layer bump region quadrant MIMCap placement (730). Similar to the MIMCap placement shown in FIGS. 7A and 7C, the MIMCap CBM boundaries (736) show that the MIMCap CBMs are substantially directly beneath the MIMCap CTMs (734). In one or more embodiments of the invention, both the MIMCap CTMs and MIMCap CBMs are located beneath the metal-top-1 layer and are connected to the metal-top-1 layer using VIAs (not shown). The embodiment shown in FIG. 7D also shows the VSS majority metal-top-1 region (732) of the VSS majority metal-top-1 layer.

Figure 7E:
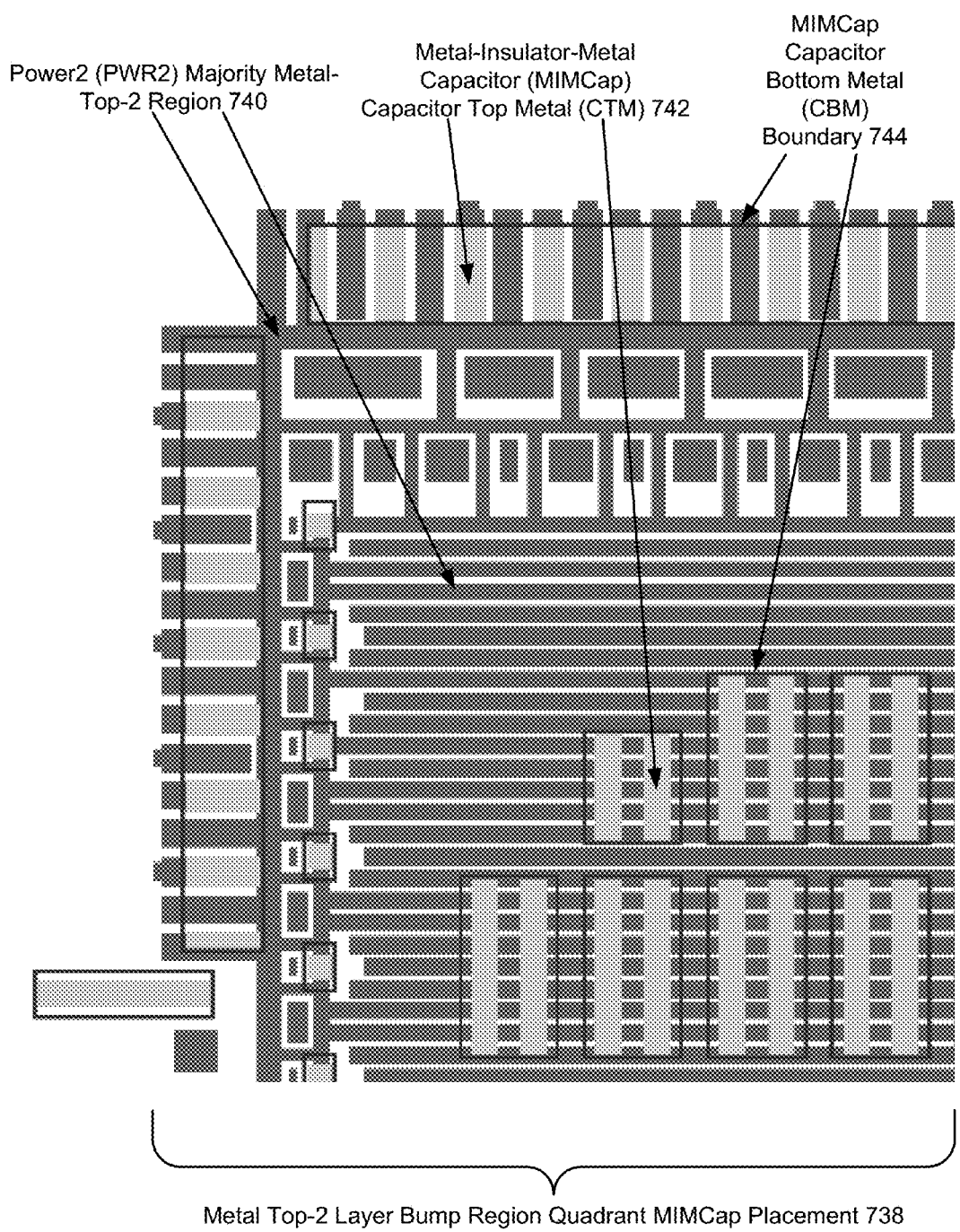
FIG. 7E shows a top view of a metal-insulator-metal capacitor within a bump region quadrant in accordance with one or more embodiments of the invention.

FIG. 7E shows a closer top view of the representative bump region of the 3FDM by way of showing the upper left metal-top-2 layer bump region quadrant and MIMCap placement (738). Similar to the MIMCap placement shown in FIGS. 7A, 7C, and 7D, the MIMCap CBM boundaries (744) show that the MIMCap CBMs are substantially directly beneath the MIMCap CTMs (742), but that, unlike the metal-top and metal-top-1 layers, the metal-top-2 layer is beneath the CTMs and CBMs. The embodiment shown in FIG. 7E also shows the PWR2 majority metal-top-2 region (740) of the PWR2 majority metal-top-2 layer.

Figure 7F:
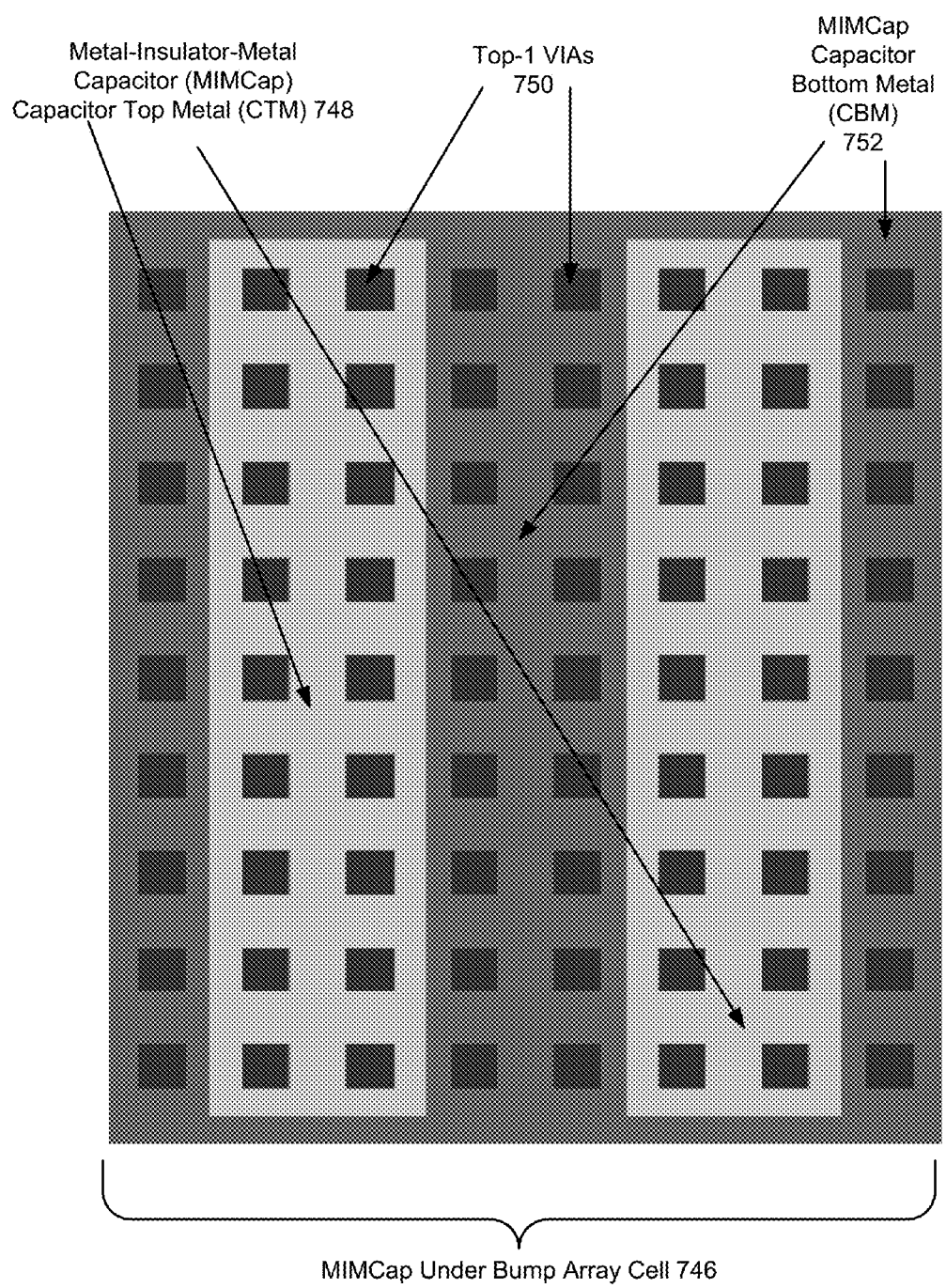
FIG. 7F shows a top view of a metal-insulator-metal capacitor cell instance in accordance with one or more embodiments of the invention.

FIG. 7F shows a MIMCap under bump array cell (746) in accordance with one or more embodiments of the invention. For the sake of clarity, the MIMCap cell is shown without any of the metal layers. In the embodiment shown in FIG. 7F, the lightest areas are MIMCap CTMs (748). In one or more embodiments of the invention, beneath the MIMCap CTMs (748) is the MIMCap CBM (752) for the MIMCap cell of FIG. 7F. In the embodiment shown in FIG. 7F, the dark squares dispersed within both the MIMCap CTMs and the MIMCap CBM are top-1 VIAs (750). In one or more embodiments of the invention, the top-1 VIAs provide an electrical connection between the MIMCap CTMs (748) and the metal-top-1 layer, as well as between the MIMCap CBM (752) and the metal-top-1 layer.

Figure 7G:
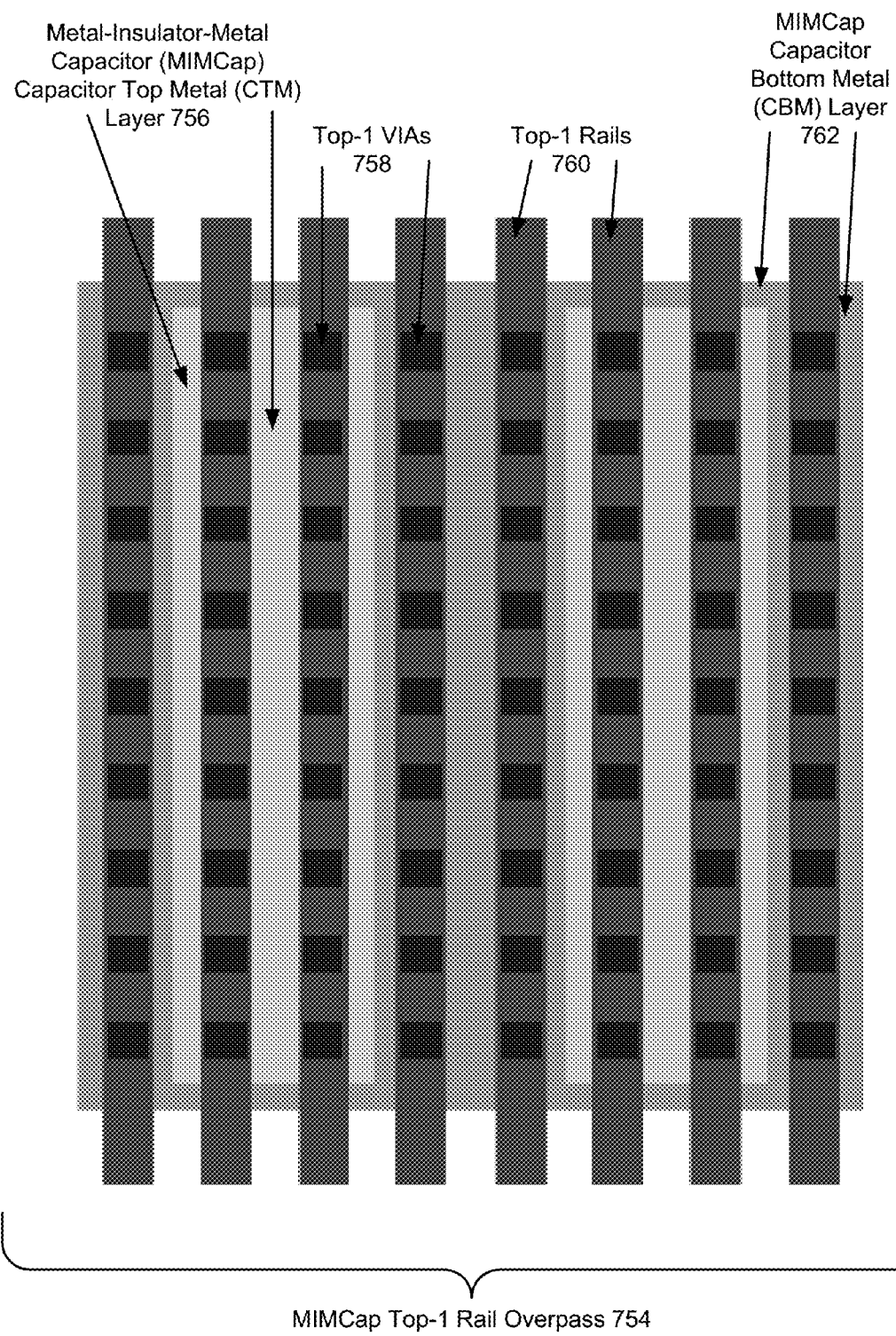
FIG. 7G shows a top view of a metal-insulator-metal capacitor metal-top-1 rail overpass in accordance with one or more embodiments of the invention.

FIG. 7G shows a MIMCap top-1 rail overpass (754) for a single MIMCap cell in accordance with one or more embodiments of the invention. In the embodiment shown in FIG. 7G, the top-1 rails (760) are vertical rails of the metal-top-1 layer that receive a signal using one of the above-described bump pads (e.g., VSS, PWR1, PWR2). In one or more embodiments of the invention, the top-1 rails (760) each include one or more top-1 VIAs (758), some of which connect a portion of the metal-top-1 layer to the MIMCap CTMs (756), and others which connect a portion of the metal top-1 layer to the MIMCap CBM (762). The embodiment shown in FIG. 7G is intended to show that the MIMCap is beneath the rails of the metal-top-1 layer.

Figure 7H:
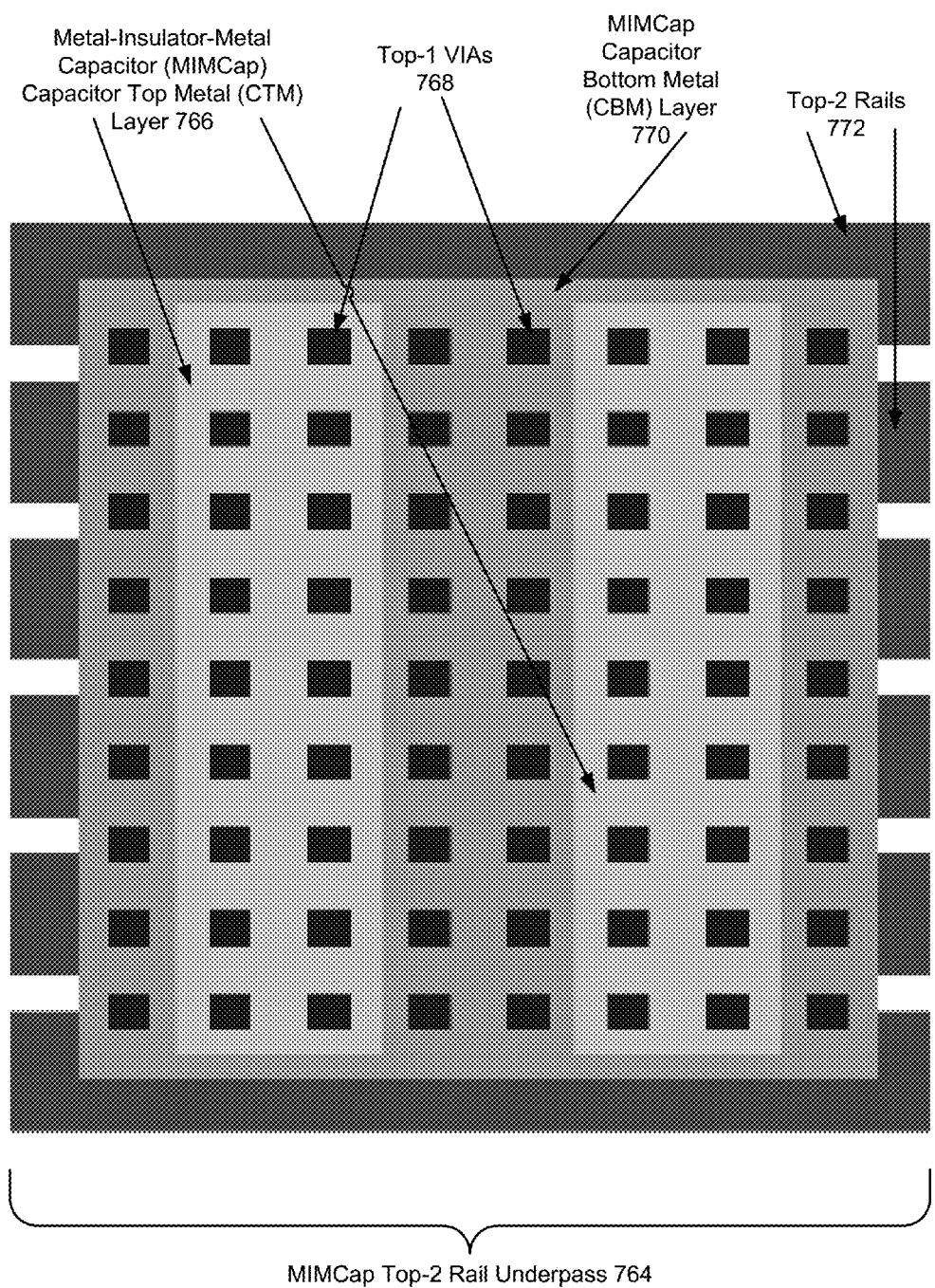
FIG. 7H shows a top view of a metal-insulator-metal capacitor metal-top-2 rail underpass in accordance with one or more embodiments of the invention.

FIG. 7H shows a MIMCap top-2 rail underpass (764) for a single MIMCap cell in accordance with one or more embodiments of the invention. In the embodiment shown in FIG. 7H, the top-2 rails (772) are horizontal rails of the metal-top-2 layer that receive a signal using VIAs from a portion of the metal-top-1 layer. In one or more embodiments of the invention, the top-1 VIAs (768), some of which connect a portion of the metal-top-1 layer to the MIMCap CTMs (766), and others which connect a portion of the metal top-1 layer to the MIMCap CBM (770). The embodiment shown in FIG. 7G is intended to show that the rails of the metal-top-2 layer are beneath the MIMCap.

While FIGS. 2A-7H show various configurations of components, other configurations may be used without departing from the scope of the invention. For example, various components may be combined to create a single component. As another example, the functionality performed by a single component may be performed by two or more components. As another example, VIA placement may be different than shown. As another example, MIMCaps may be disposed between other metal layers of the semiconductor device, and/or connected, by VIAs, to other layers of the semiconductor device. Additionally, metal layers may be any thickness and/or any distance apart, there may be additional metal layers in the semiconductor device, and a given metal layer may include additional features not shown in FIG. 2A-7H. Accordingly, embodiments of the invention should not be considered limited to the specific arrangements of components and elements shown in FIGS. 1-7H.

Figure 8:
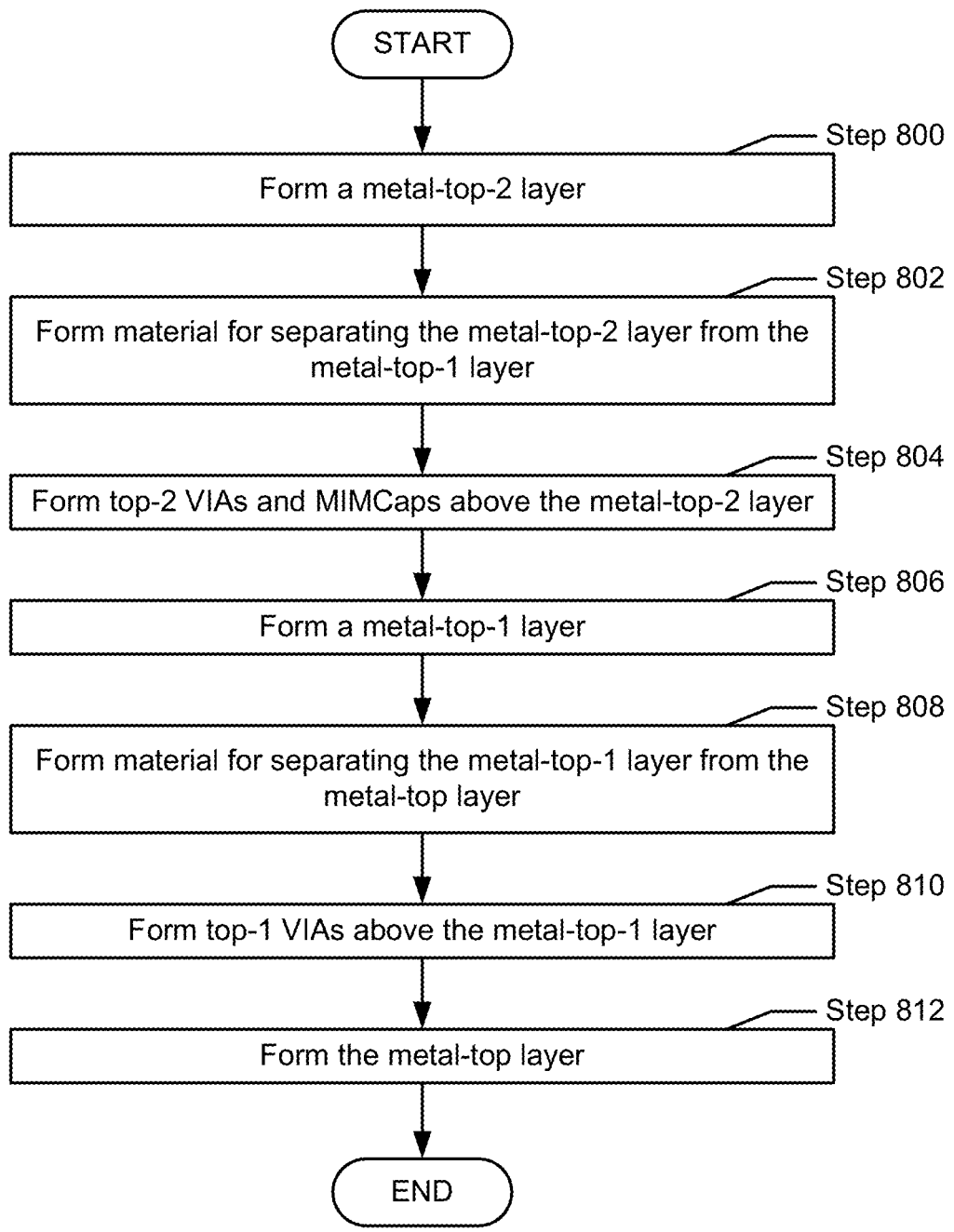
FIG. 8 shows a flowchart in accordance with one or more embodiments of the invention.

Turning to FIG. 8, FIG. 8 shows a method for manufacturing, at least in part, a 3FDM in accordance with one or more embodiments of the invention. In one or more embodiments of the invention, the 3FDM is formed as a portion of a semiconductor device fabrication process that may include, but is not limited to, a wafer, deposition, patterning, etching, and/or doping.

In Step 800, the metal-top-2 layer is formed. In one or more embodiments of the invention, the metal-top-2 layer is formed after a semiconducting material has undergone a fabrication process to include any number of integrated circuits implemented in the semiconducting material. In one or more embodiments of the invention, the metal layers include functionality to provide connections between integrated circuits, and/or to receive signals and distribute them to the integrated circuits of the semiconducting device. In one or more embodiments of the invention, the metal-top-2 layer is deposited onto an insulating layer separating the integrated circuits and other features of the semiconductor device from the metal-top layer. In one or more embodiments of the invention, there are additional metal layers beneath the metal-top-2 layer. In one or more embodiments of the invention, the metal-top-2 layer is formed from a metal, such as copper or aluminum. In one or more embodiments of the invention, formation of the metal-top-2 layer includes formation of any element of the metal-top-2 layer, such as, for example: electrically isolated regions (e.g., power rails) for PWR1, VSS, and other signals and a PWR2 region for the PWR2 majority metal-top-2 layer.

In Step 802, material for separating the metal-top-2 layer from the metal-top-1 layer is formed. In one or more embodiments of the invention, the material is an insulating or dielectric material.

In Step 804, the top-2 VIAs and MIMCaps are formed above the metal-top-2 layer. In one or more embodiments of the invention, top-2 VIAs and MIMCaps are formed using one or more semiconductor device fabrication techniques. Examples of such techniques include, but are not limited to, patterning, etching, and deposition. As an example, the material formed above the metal-top-2 layer may be patterned to include the locations of the top-1 VIAs and the MIMCaps. Then the material may be etched to remove the areas necessary to allow placement of the VIAs and MIMCaps. Next, an electrically conductive material for the VIAs and the metal for the CTMs and CBMs of the MIMCaps may be deposited using any deposition technique (e.g., chemical vapor deposition, physical vapor deposition, molecular beam epitaxy, etc.).

In Step 806, the metal-top-1 layer is formed. In one or more embodiments of the invention, the metal-top-1 layer is formed using any form of deposition. In one or more embodiments of the invention, formation of the metal-top-1 layer includes formation of any element of the metal-top-1 layer, such as, for example: electrically isolated regions (e.g., power rails) for PWR1, PWR2, and other signals and a VSS region for the VSS majority metal-top-1 layer.

In Step 808, material for separating the metal-top-1 layer from the metal-top layer is formed. In one or more embodiments of the invention, the material is an insulating or dielectric material.

In Step 810, the top-1 VIAs are formed above the metal-top-2 layer. The formation of the top-1 VIAs may be substantially similar to the formation of the top-2 VIAs, which is discussed above in the description of Step 804.

In Step 812, the metal-top layer is formed. In one or more embodiments of the invention, the metal-top layer is formed using any form of deposition. In one or more embodiments of the invention, formation of the metal-top1 layer includes formation of any element of the metal-top-2 layer, such as, for example: zipper channels, isolated zipper channel wires, VSS bump regions, PWR2 bump regions, PWR1 bump regions, other signal bump regions, the bump pad array, and UBM regions for the various bump regions.

While the invention has been described with respect to a limited number of embodiments, those skilled in the art, having benefit of this Detailed Description, will appreciate that other embodiments can be devised which do not depart from the scope of the invention as disclosed herein. Accordingly, the scope of the invention should be limited only by the attached claims.

What is claimed is:

1. A multi-layer full dense mesh (MFDM), comprising:
a metal-top layer, comprising:
a bump pad array, comprising:
a power1 (PWR1) bump pad within a PWR1 bump region;
a VSS bump pad within a VSS bump region; and
a power2 (PWR2) bump pad within a PWR2 bump region; and
a PWR1 majority metal-top region;
a metal-top-1 layer beneath the metal-top layer and comprising:
a VSS majority metal-top-1 region;
a PWR1 metal-top-1 region; and
a PWR2 metal-top-1 region;
a metal-top-2 layer beneath the metal-top-1 layer and comprising:
a PWR2 majority metal-top-2 region;
a VSS metal-top-2 region; and
a PWR1 metal-top-2 region;
a plurality of top-1 vertical interlayer connections (VIAs) disposed between the metal-top layer and the metal-top-1 layer; and
a plurality of top-2 VIAs disposed between the metal-top-1 layer and the metal-top-2 layer.

2. The MFDM of claim 1, wherein the plurality of top-1 VIAs comprises:
a first top-1 VIA coupling the PWR1 majority metal-top region to the PWR1 metal-top-1 region;
a second top-1 VIA coupling the VSS bump pad to the VSS majority metal-top-1 region; and
a third top-1 VIA coupling the PWR2 bump pad to the PWR2 metal-top-1 region.

3. The MFDM of claim 2, wherein the plurality of top-2 VIAs comprises:
a first top-2 VIA coupling the PWR2 metal-top-1 region to the PWR2 majority metal-top-2 region;
a second top-2 VIA coupling the VSS majority metal-top-1 region to the VSS metal-top-2 region; and
a third top-2 VIA coupling the PWR1 metal-top-1 region to the PWR1 metal-top-2 region.

4. The MFDM of claim 1, wherein:
the PWR1 bump pad comprises a PWR1 under bump metallization (UBM) region for receiving a PWR1 signal,
the VSS bump pad comprises a VSS UBM region for receiving a VSS signal, and
the PWR2 bump pad comprises a PWR2 UBM region for receiving a PWR2 signal.

5. The MFDM of claim 4, wherein the PWR1 signal and the PWR2 signal are distinct power signals.

6. The MFDM of claim 1, wherein
the PWR1 bump region further comprises a first portion of the PWR1 majority metal-top region,
the VSS bump region further comprises a second portion of the PWR1 majority metal-top region and an electrically isolated VSS bump island comprising the VSS bump pad, and the PWR2 bump region further comprises a third portion of the PWR1 majority metal-top region and an electrically isolated PWR2 bump island comprising the VSS bump pad.

7. The MFDM of claim 1, wherein the metal-top layer further comprises a plurality of zipper channels disposed between and separating the PWR1 bump region, the VSS bump region, and the PWR2 bump region, and wherein a plurality of isolated zipper channel wires are disposed within the plurality of zipper channels.

8. The MFDM of claim 7, wherein the metal-top-1 layer further comprises a plurality of metal-top-1 zipper structures disposed beneath the plurality of zipper channels and configured to couple portions of the PWR1 majority metal-top region.

9. The MFDM of claim 8, wherein the metal-top-1 layer further comprises a plurality of metal-top-2 zipper structures disposed beneath the plurality of metal-top-1 zipper structures, and wherein:
   a first portion of the plurality of metal-top-2 zipper structures is configured to couple portions of the VSS majority metal-top-1 region of the metal-top-1 layer, and
   a second portion of the plurality metal-top-2 zipper structures is configured to couple portions of the PWR1 metal-top-1 region of the metal-top-1 layer.

10. The MFDM of claim 7, wherein the bump pad array further comprises an other signal bump pad within an other signal bump region, the other signal bump region comprising a fourth portion of the PWR1 majority metal-top region and an other signal bump island comprising the other signal bump pad, and wherein the other signal bump pad comprises an other signal under bump metallization (UBM) region for receiving an other signal.

11. The MFDM of claim 10, wherein the other signal bump region is separated from the PWR1 bump region, the VSS bump region, and the PWR2 bump region by a portion of the plurality of zipper channels.

12. The MFDM of claim 1, further comprising a decoupling capacitor disposed between the metal-top-1 layer and the metal-top-2 layer.

13. The MFDM of claim 12, wherein the decoupling capacitor is a metal-insulator-metal capacitor (MIMCap) comprising a capacitor top metal (CTM) and a capacitor bottom metal (CBM) beneath the CTM.

14. The MFDM of claim 13, wherein the CTM and the CBM are each coupled to the metal-top-1 layer, and wherein the CTM and the CBM are separated by a dielectric material.

15. A method of manufacturing a multi-layer full dense mesh (MFDM), comprising:
   depositing, during fabrication of a semiconductor device, a metal-top-2L layer of the MFDM;
   forming, from the metal-top-2 layer, a power2 (PWR2) majority metal-top-2 region, a power1 (PWR1) metal-top-2 region, and a VSS metal-top-2 region;
   depositing on the metal-top-2 layer, after depositing the metal-top-2 layer, a first dielectric material layer for separating the metal-top-2 layer from a metal-top-1 layer;
   forming, within the first dielectric material layer, a plurality of top-2 vertical interlayer connections (VIAs);
   depositing on the first dielectric material layer, after forming the plurality of top-2 VIAs, the metal-top-1 layer;
   forming, from the metal-top-1 layer, a VSS majority metal-top-1 region, a PWR1 metal-top- 2 region, and a PWR2 metal-top-2 region;
   depositing on the metal-top-1 layer, after depositing the metal-top-1 layer, a second dielectric material layer for separating the metal-top-1 layer from a metal-top layer;
   forming, within the second dielectric material layer, a plurality of top-1 VIAs;
   depositing on the second dielectric material later, after forming the plurality of top-1 VIAs, the metal-top layer; and
   forming, from the metal-top layer, a bump pad array.

16. The method of claim 15, wherein forming the bump pad array comprises:
   forming a PWRI bump region comprising a PWR1 bump pad;
   forming a VSS bump region comprising a VSS bump pad within an electrically isolated VSS bump island; and
   forming a PWR2 bump region comprising a PWR2 bump pad within an electrically isolated PWR2 bump island.

17. The method of claim 16, wherein:
   the PWRI bump pad comprises a PWR1 under bump metallization (UBM) region for receiving a PWR1
   he VSS bump pad comprises a VSS UBM region for receiving a VSS signal, and
   the PWR2 bump pad comprises a PWR2 UBM region for receiving a PWR2 signal.

18. The method of claim 15, further comprising forming, from the metal-top layer, a plurality of zipper channels and a plurality of isolated zipper channel wires disposed within the plurality of zipper channels.

19. The method of claim 15, further comprising:
   forming, from the metal-top-2 layer, an other signal metal-top-2 region;
   forming, from the metal-top-1 layer, an other signal metal-top-1 region; and
   forming, from the metal-top layer, an other signal bump region comprising an other signal bump pad comprising an other signal under bump metallization (UBM) region for receiving an other signal,
   wherein the other signal bump pad is coupled to the other signal metal-top-1 region using a top-1 VIA of the plurality of top-1 VIAs, and the other signal metal-top-1 region is coupled to the other signal metal-top-2 region using a top-2 VIA of the plurality of top-2 VIAs.

20. The method of claim 15, further comprising:
   forming, within the first dielectric material layer, a decoupling capacitor, wherein forming the decoupling capacitor comprises: depositing a capacitor bottom metal (CBM); depositing a capacitor top metal (CTM) above the CBM, and coupling the CBM and the CTM to the metal-top-1 layer using a portion of the plurality of top-2 VIAs.

* * * * *

UNITED STATES PATENT AND TRADEMARK OFFICE
CERTIFICATE OF CORRECTION

PATENT NO. : 9,773,727 B2  
APPLICATION NO. : 15/181795  
DATED : September 26, 2017  
INVENTOR(S) : Duncan C. Collier et al.

Page 1 of 1

It is certified that error appears in the above-identified patent and that said Letters Patent is hereby corrected as shown below:

In the Specification

Column 2, Line 1, the word "later" should read -- layer --.

Column 12, Line 20, occurring at the beginning on the line, "metal top-2" should read -- metal-top-2 --.

Column 24, Line 32, "metal top-1" should read --metal-top-1 --.

Column 25, Line 64, "metal-top1" should read --metal-top-1 --.

In the Claims

Claim 1, Column 26, Line 14, "powerl" should read -- power1 --.

Claim 15, Column 27, Line 52, "metal-top-2L" should read -- metal-top-2 --.

Claim 15, Column 27, Line 54, "powerl" should read -- power1 --.

Claim 15, Column 28, Line 7, "metal-top- 2" should read -- metal-top-2 --.

Claim 15, Column 28, Line 14, the word "later" should read -- layer --.

Claim 16, Column 28, Line 20, "PWRI" should read -- PWR1 --.

Claim 17, Column 28, Line 27, "PWRI" should read -- PWR1 --.

Claim 17, Column 28, beginning on Line 28 and ending on Line 29, "...receiving a PWR1 he VSS bump..." should read -- ...receiving a PWR1 signal, the VSS bump... --.

Signed and Sealed this  
Second Day of July, 2019

Andrei Iancu  
*Director of the United States Patent and Trademark Office*